US012550328B2

(12) United States Patent
Hosoda et al.

(10) Patent No.: US 12,550,328 B2
(45) Date of Patent: Feb. 10, 2026

(54) THREE-DIMENSIONAL MEMORY DEVICE INCLUDING A MID-STACK SOURCE LAYER AND METHODS FOR FORMING THE SAME

(71) Applicant: SANDISK TECHNOLOGIES LLC, Addison, TX (US)

(72) Inventors: Naohiro Hosoda, Yokkaichi (JP); Kazuki Isozumi, Yokkaichi (JP); Masanori Tsutsumi, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 422 days.

(21) Appl. No.: 18/353,621

(22) Filed: Jul. 17, 2023

(65) Prior Publication Data

US 2024/0179908 A1 May 30, 2024

Related U.S. Application Data

(60) Provisional application No. 63/385,311, filed on Nov. 29, 2022.

(51) Int. Cl.
*H10B 43/27* (2023.01)
*H01L 23/00* (2006.01)
(Continued)

(52) U.S. Cl.
CPC .............. *H10B 43/27* (2023.02); *H01L 24/08* (2013.01); *H01L 24/80* (2013.01);
(Continued)

(58) Field of Classification Search
CPC ........ H10B 43/27; H10B 41/27; H10B 41/35; H10B 43/35; H10B 80/00; H10B 43/10;
(Continued)

(56) References Cited

U.S. PATENT DOCUMENTS 9,530,790 B1 12/2016 Lu et al.
9,935,050 B2 4/2018 Dunga et al.
(Continued)

FOREIGN PATENT DOCUMENTS

KR 20200038321 A 4/2020
KR 20210155610 A 12/2021

OTHER PUBLICATIONS

Endoh et al., "Novel Ultra High-Density Memory with a Stacked-Surrounding Gate Transistor (S-SGT) Structured Cell," IEDM Proc. (2001) 33-36.
(Continued)

*Primary Examiner* — Thanh Y. Tran
(74) *Attorney, Agent, or Firm* — THE MARBURY LAW GROUP PLLC

(57) ABSTRACT

A memory device includes a first-tier alternating stack of first insulating layers and first electrically conductive layers, a source layer overlying the first-tier alternating stack, a second-tier alternating stack of second insulating layers and second electrically conductive layers overlying the source layer, a memory opening vertically extending through the first-tier alternating stack, the source layer, and the second-tier alternating stack, and a memory opening fill structure located in the memory opening. The memory opening fill structure includes a vertical semiconductor channel that extends through the first-tier alternating stack, the source layer, and the second-tier alternating stack. The vertical semiconductor channel has sidewall in contact with the source layer.

20 Claims, 84 Drawing Sheets

(51) Int. Cl.
  *H01L 25/00* (2006.01)
  *H01L 25/065* (2023.01)
  *H01L 25/18* (2023.01)
  *H10B 41/27* (2023.01)
  *H10B 41/35* (2023.01)
  *H10B 43/35* (2023.01)
  *H10B 80/00* (2023.01)

(52) U.S. Cl.
  CPC ......... *H01L 25/0657* (2013.01); *H01L 25/18* (2013.01); *H01L 25/50* (2013.01); *H10B 41/27* (2023.02); *H10B 41/35* (2023.02); *H10B 43/35* (2023.02); *H10B 80/00* (2023.02); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/14511* (2013.01)

(58) Field of Classification Search
  CPC ......... H10B 43/40; H10B 43/50; H01L 24/08; H01L 24/80; H01L 25/0657; H01L 25/18; H01L 25/50; H01L 2224/08145; H01L 2224/80006; H01L 2224/80895; H01L 2224/80896; H01L 2924/1431; H01L 2924/14511
  See application file for complete search history.

(56) References Cited

U.S. PATENT DOCUMENTS

| | | |
|---|---|---|
| 10,734,400 B1 | 8/2020 | Fukuo et al. |
| 11,450,679 B2 | 9/2022 | Tanaka et al. |
| 11,495,612 B2 | 11/2022 | Tanaka et al. |
| 2017/0294377 A1 | 10/2017 | Dunga et al. |
| 2019/0198515 A1 | 6/2019 | Hosoda et al. |
| 2019/0252396 A1 | 8/2019 | Mushiga et al. |
| 2019/0355743 A1 | 11/2019 | Song |
| 2020/0005869 A1 | 1/2020 | Morooka et al. |
| 2021/0366808 A1 | 11/2021 | Cui et al. |
| 2021/0366920 A1 | 11/2021 | Tokita et al. |
| 2021/0366924 A1 | 11/2021 | Tokita et al. |
| 2021/0391289 A1 | 12/2021 | Kim et al. |
| 2022/0005818 A1 | 1/2022 | Tanaka et al. |
| 2022/0005824 A1 | 1/2022 | Tanaka et al. |
| 2022/0077129 A1 | 3/2022 | Sung et al. |
| 2022/0165740 A1* | 5/2022 | Kim ................ H10B 41/10 |
| 2022/0285371 A1* | 9/2022 | Kashima ............ H10B 43/40 |
| 2023/0038557 A1 | 2/2023 | Ogawa et al. |
| 2023/0041950 A1 | 2/2023 | Chibvongodze et al. |
| 2023/0045001 A1 | 2/2023 | Ogawa et al. |
| 2023/0320086 A1* | 10/2023 | Lee ................ H10B 41/27 257/314 |

OTHER PUBLICATIONS

U.S. Appl. No. 17/556,298, filed Dec. 20, 2021, SanDisk Technologies LLC.
U.S. Appl. No. 17/684,922, filed Mar. 2, 2022, SanDisk Technologies LLC.
U.S. Appl. No. 17/807,804, filed Jun. 20, 2022, SanDisk Technologies LLC.
U.S. Appl. No. 63/386,062, filed Dec. 5, 2022, SanDisk Technologies LLC.
ISR—Notification of Transmittal of the International Search Report and Written Opinion of the International Searching Authority for International Patent Application No. PCT/US2023/077034, mailed Feb. 15, 2024, 9 pages.
IPRP-WO—Notification Concerning Transmittal of International Preliminary Report on Patentability and Written Opinion of the International Searching Authority for International Patent Application No. PCT/US2023/077034, Mailed Jun. 12, 2025, 7 pages.

* cited by examiner

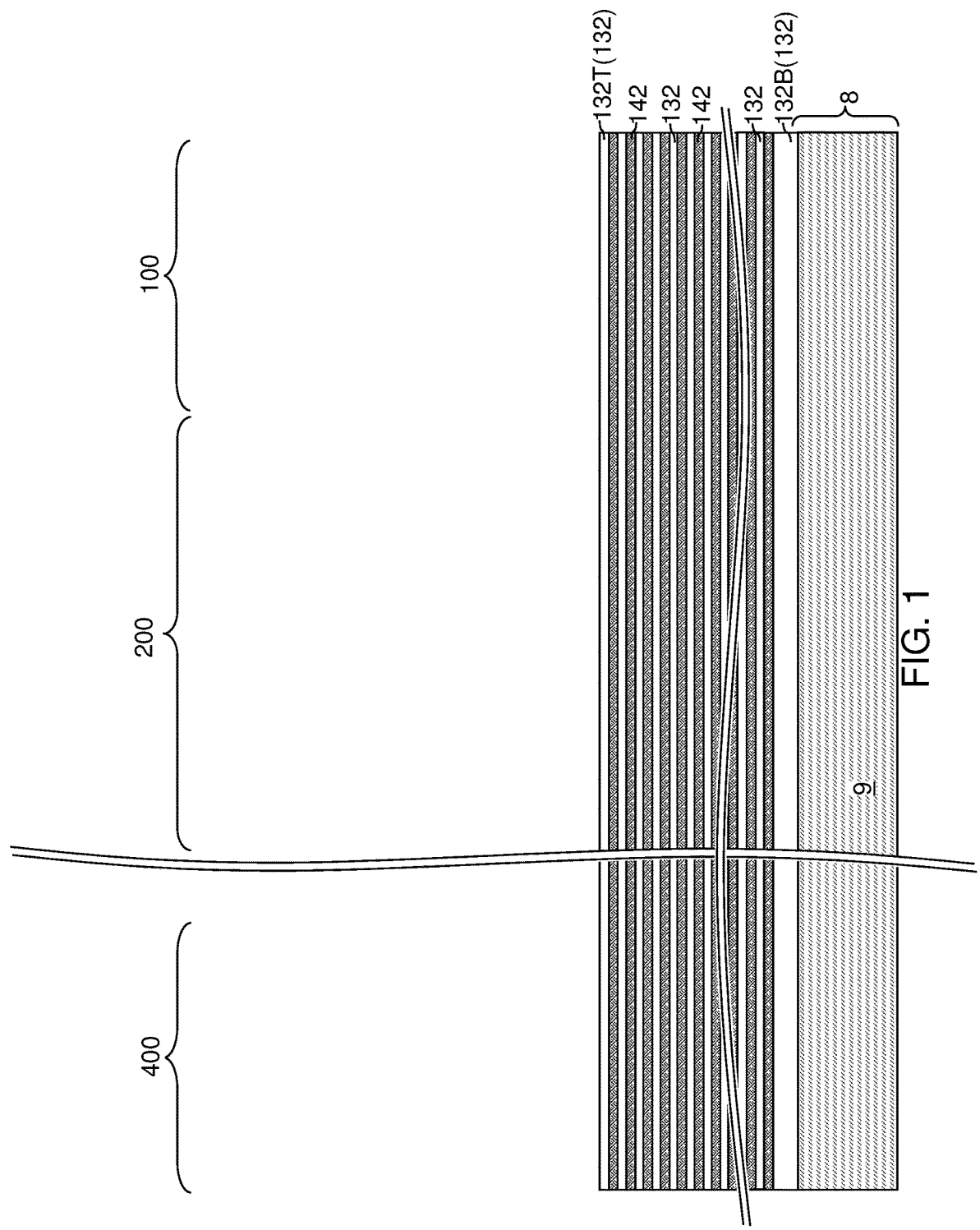

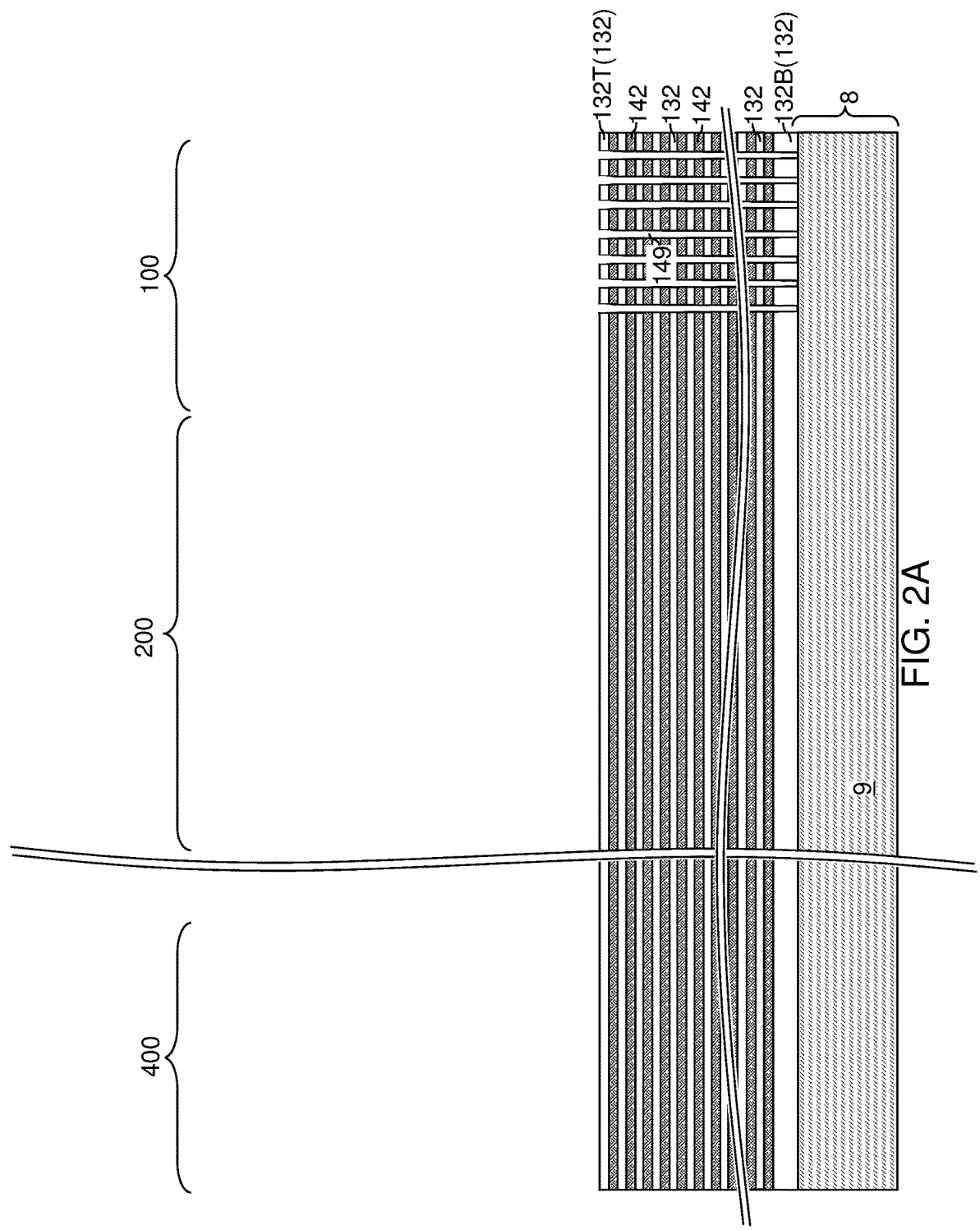

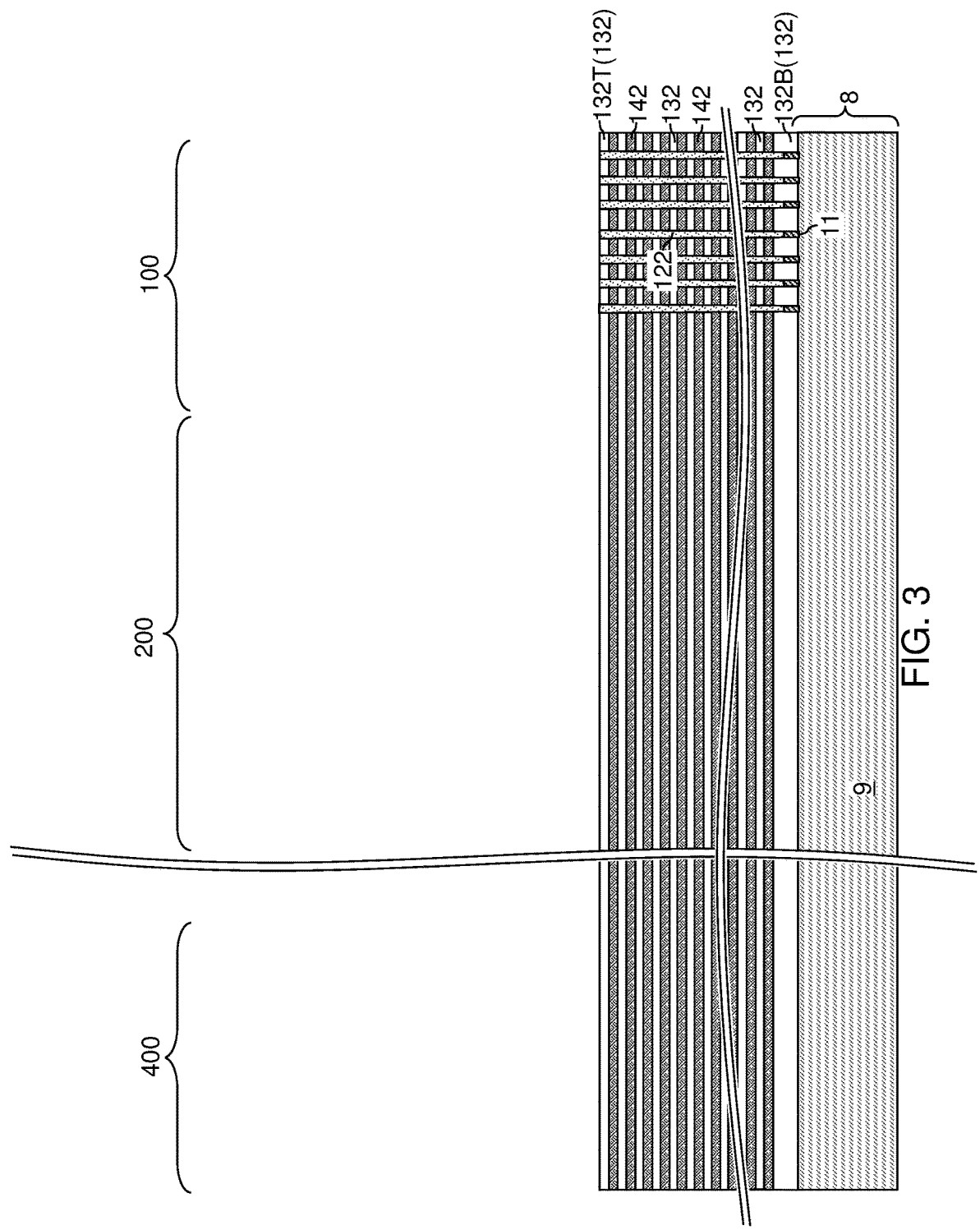

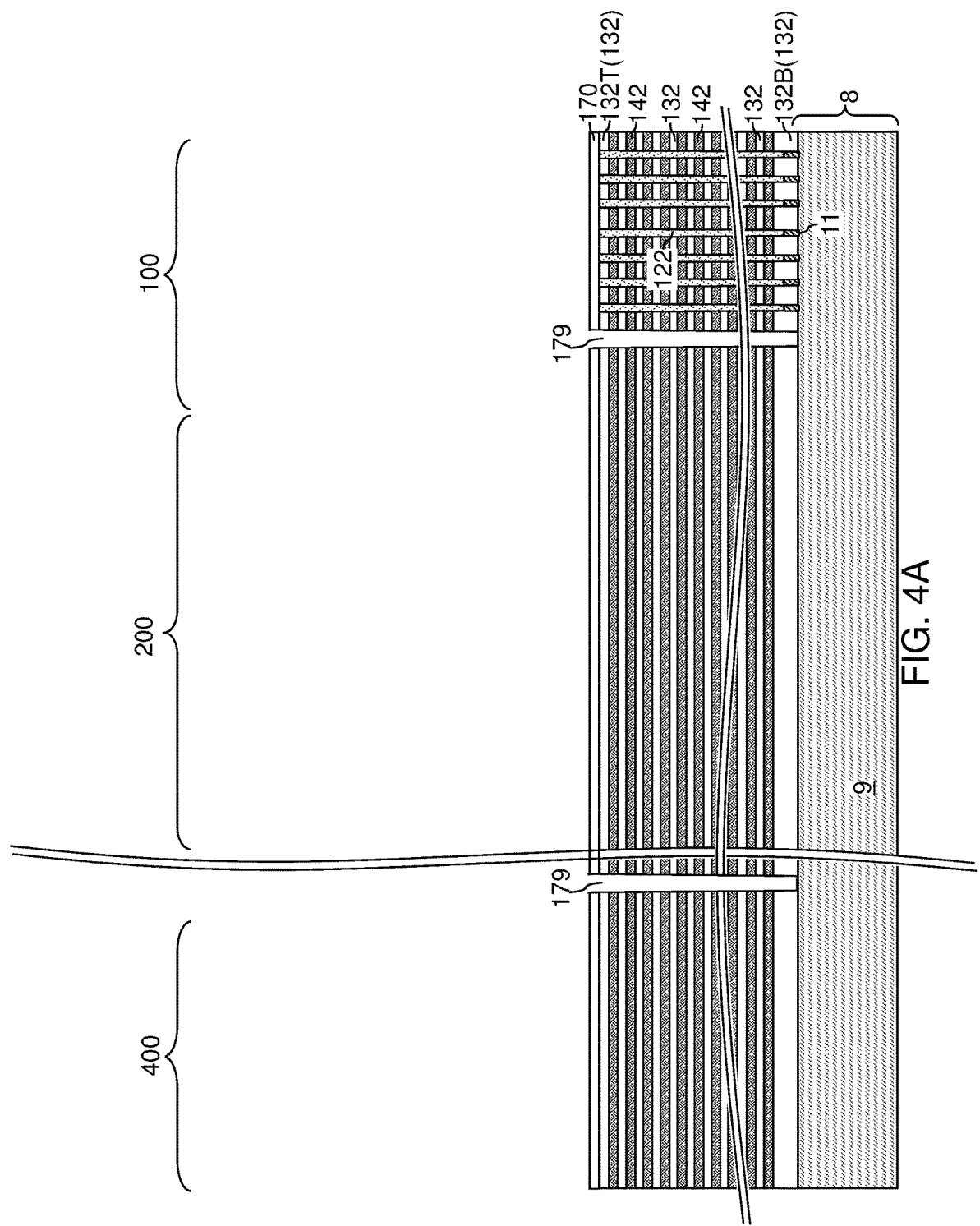

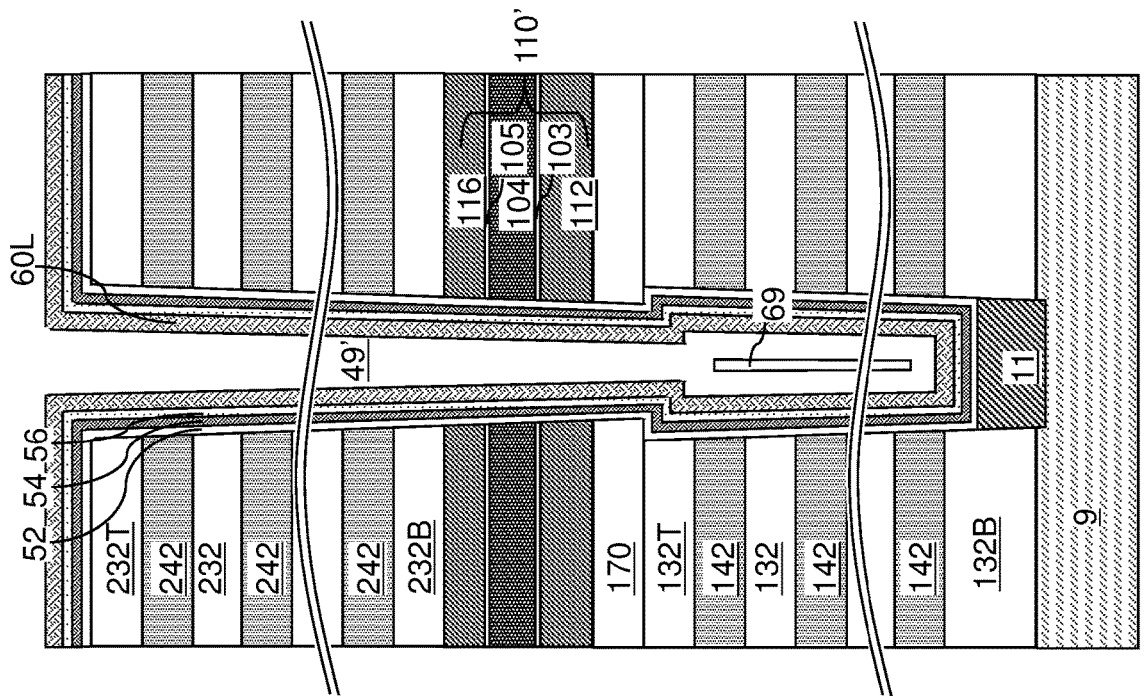
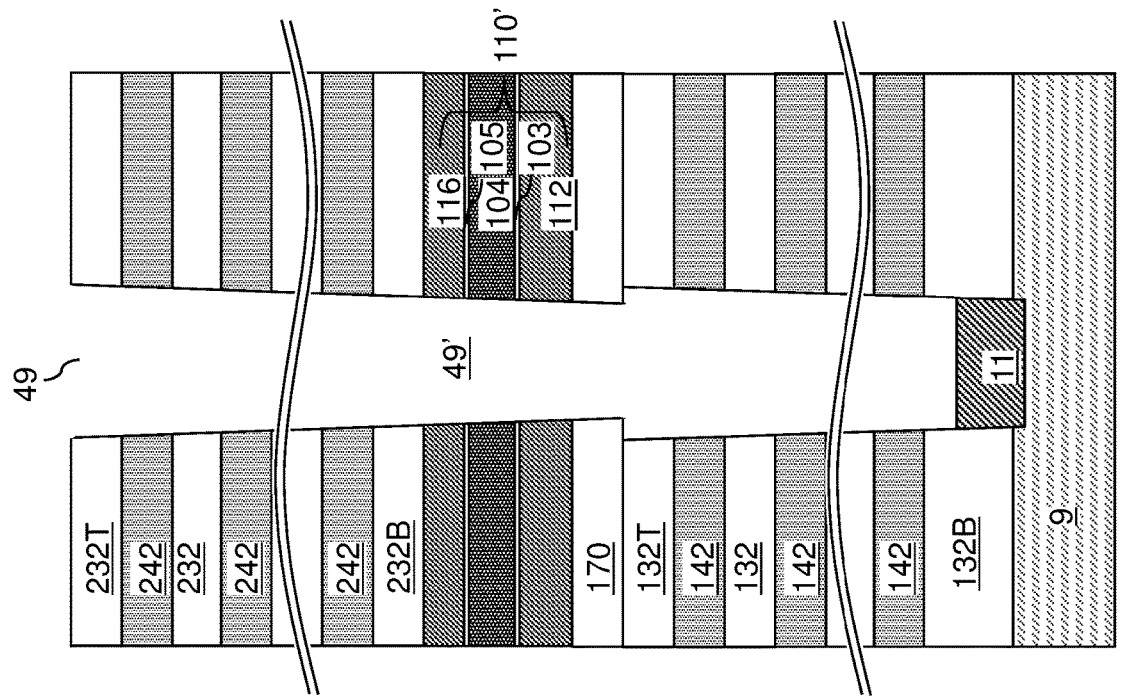
FIG. 9A
FIG. 9B

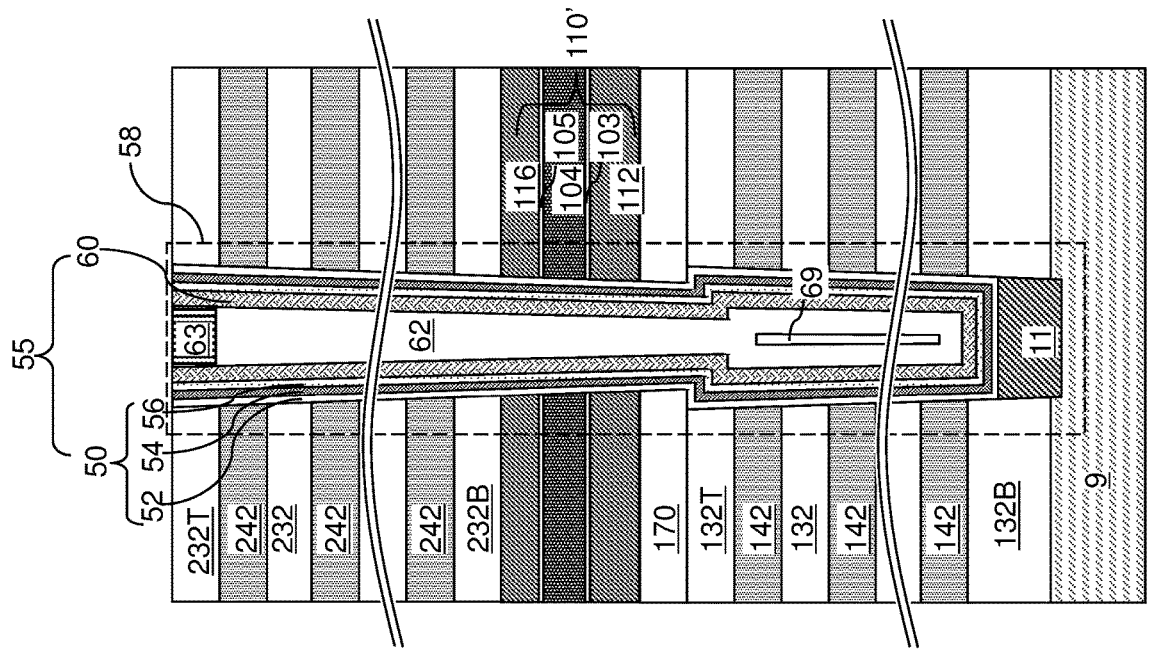
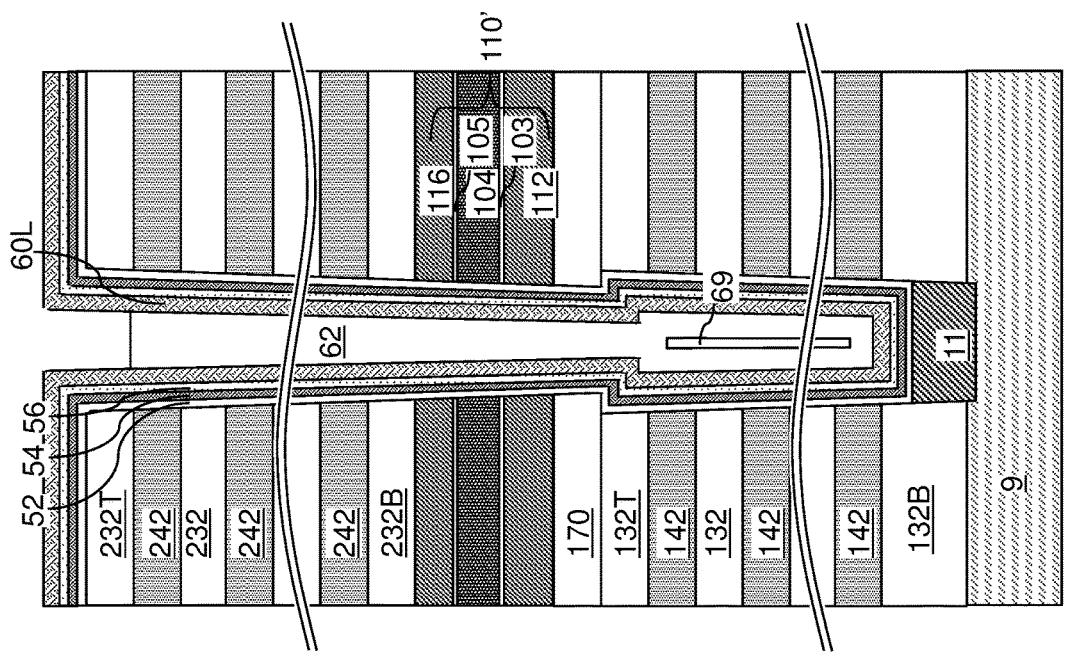

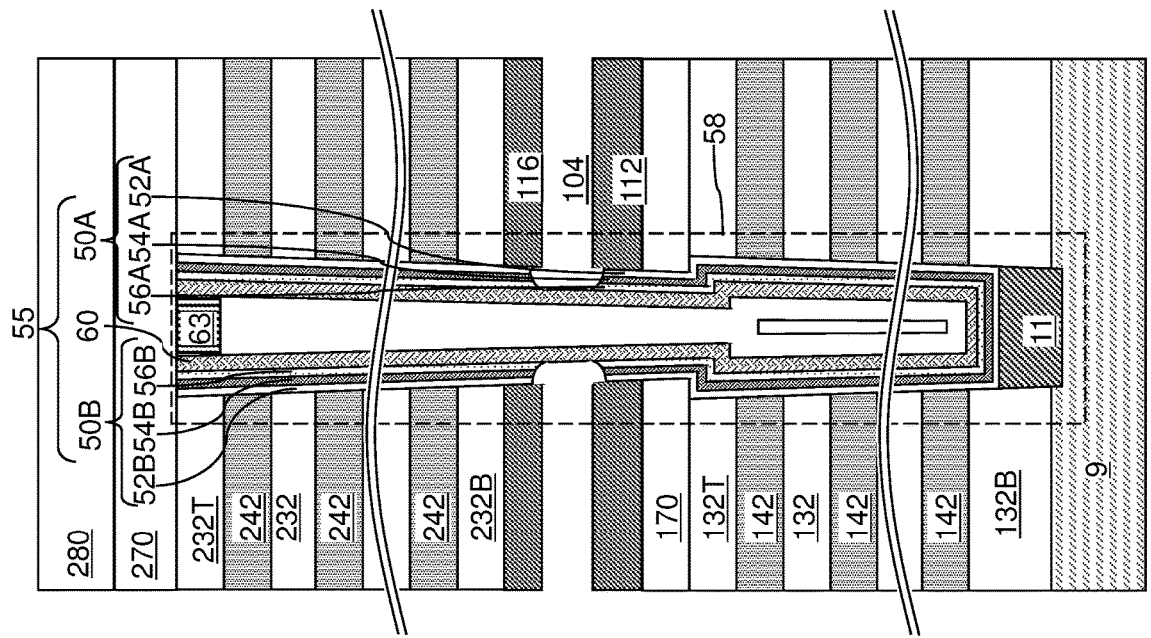
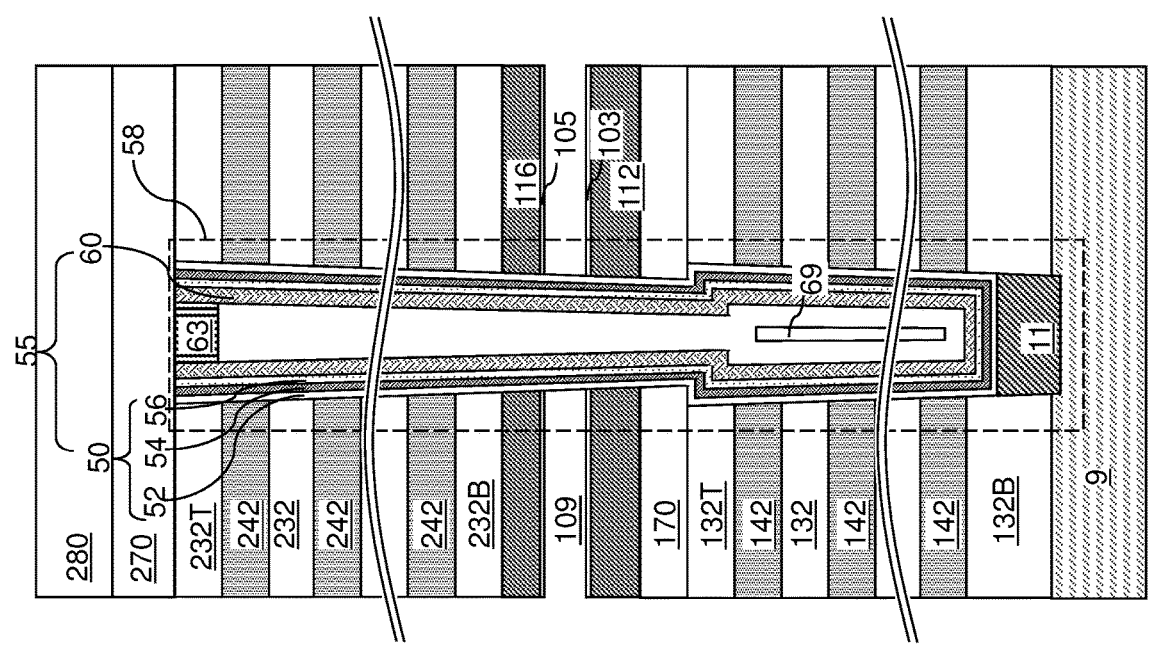
FIG. 16A
FIG. 16B

THREE-DIMENSIONAL MEMORY DEVICE INCLUDING A MID-STACK SOURCE LAYER AND METHODS FOR FORMING THE SAME

FIELD

The present disclosure relates generally to the field of semiconductor devices, and particularly to a multi-tier three-dimensional memory device including a mid-stack source layer and methods for forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a memory device includes a first-tier alternating stack of first insulating layers and first electrically conductive layers, a source layer overlying the first-tier alternating stack, a second-tier alternating stack of second insulating layers and second electrically conductive layers overlying the source layer, a memory opening vertically extending through the first-tier alternating stack, the source layer, and the second-tier alternating stack, and a memory opening fill structure located in the memory opening. The memory opening fill structure includes a vertical semiconductor channel that extends through the first-tier alternating stack, the source layer, and the second-tier alternating stack. The vertical semiconductor channel has sidewall in contact with the source layer.

According to another aspect of the present disclosure, a method of forming a memory device comprises: forming a first-tier alternating stack of first insulating layers and first spacer material layers over a substrate, wherein the first spacer material layers are formed as, or are subsequently replaced with, first electrically conductive layers; forming a sacrificial source-level material layer over the first-tier alternating stack; forming a second-tier alternating stack of second insulating layers and second spacer material layers over the sacrificial source-level material layer, wherein the second spacer material layers are formed as, or are subsequently replaced with, second electrically conductive layers; forming a memory opening through the second-tier alternating stack, the sacrificial source-level material layer, and the first-tier alternating stack; forming a memory opening fill structure in the memory opening, wherein the memory opening fill structure comprises a vertical semiconductor channel vertically extending through the first-tier alternating stack, the sacrificial source-level material layer, and the second-tier alternating stack, and further comprises a vertical stack of memory elements located at levels of the first spacer material layers and the second spacer material layers; forming a source cavity by removing the sacrificial source-level material layer; and forming a source contact layer directly on a cylindrical surface segment of an outer sidewall of the vertical semiconductor channel within the source cavity.

BRIEF DESCRIPTION OF THE DRAWINGS

FIG. 1 is a vertical cross-sectional view of a first exemplary structure for forming a semiconductor die after formation of a first alternating stack of first insulating layers and first sacrificial material layers over a carrier substrate according to a first embodiment of the present disclosure.

FIG. 2A is a vertical cross-sectional view of the first exemplary structure after formation of first-tier memory openings according to the first embodiment of the present disclosure.

FIG. 3 is a vertical cross-sectional view of the first exemplary structure after formation of sacrificial via structures and sacrificial first-tier memory opening fill structures according to the first embodiment of the present disclosure.

FIG. 4A is a vertical cross-sectional view of the first exemplary structure after formation of a first insulating cap layer and first-tier backside trenches according to the first embodiment of the present disclosure.

FIGS. 9A-9D are sequential vertical cross-sectional views of a memory array region during formation of a memory opening fill structure according to the first embodiment of the present disclosure.

FIGS. 16A-16C are sequential vertical cross-sectional views of a region of the first exemplary structure during replacement of the sacrificial source-level material layer with a source contact layer according to the first embodiment of the present disclosure.

FIGS. 21A and 22B are sequential vertical cross-sectional view of the contact region of the first exemplary structure during formation of the electrically conductive layers according to the first embodiment of the present disclosure.

DETAILED DESCRIPTION

Figure 2B:
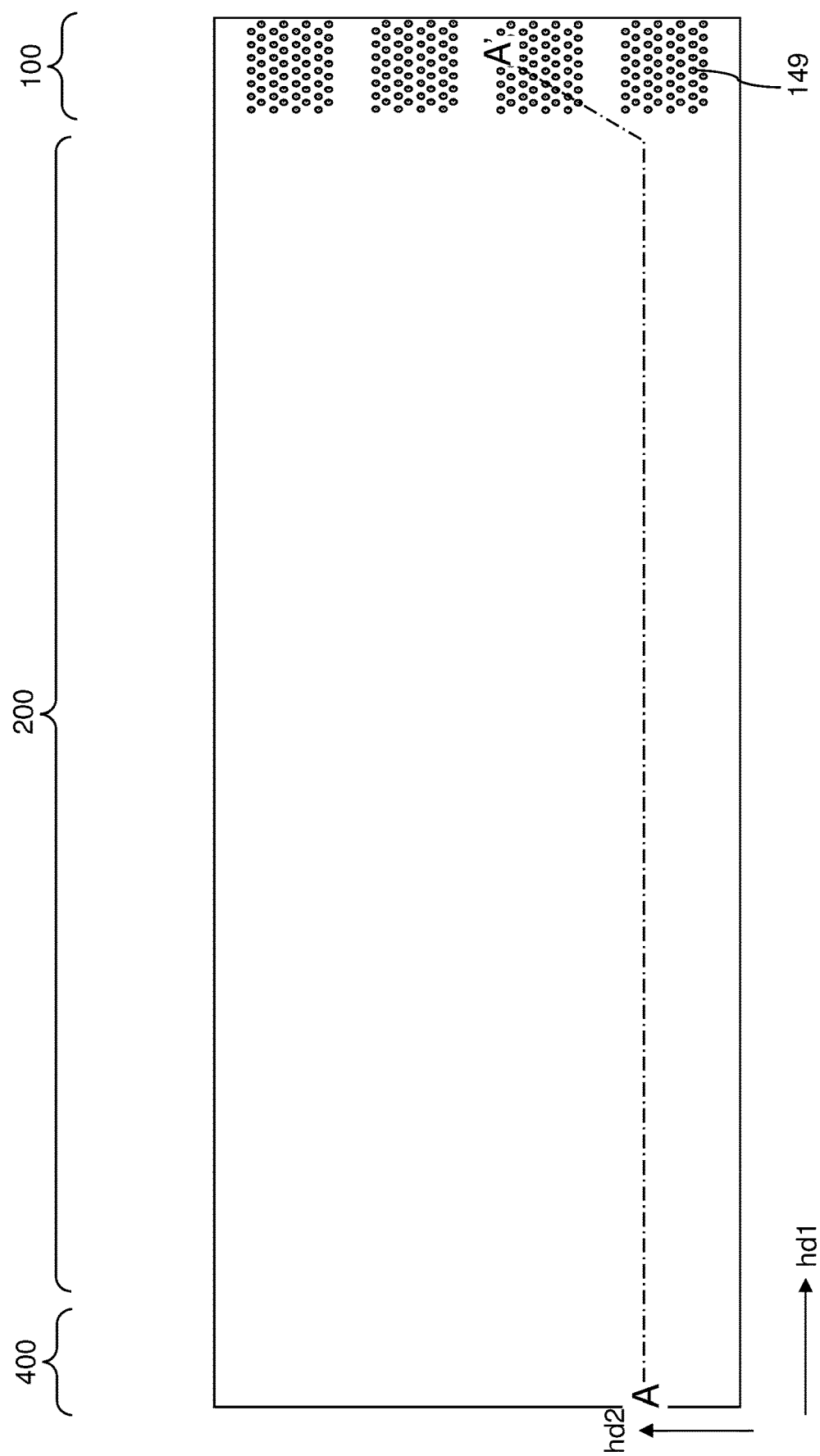
FIG. 2B is a top-down view of the first exemplary structure of FIG. 2A. The vertical plane A-A' is the plane of the vertical cross-sectional view of FIG. 2A.

As discussed above, the embodiments of the present disclosure are directed to a multi-tier three-dimensional memory device including a mid-stack source layer and methods for forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an alternating stack of first insulating layers 132 and first spacer material layers is formed over a substrate 8. The substrate 8 may be a carrier substrate that is subsequently removed. The substrate 8 may comprise a semiconductor material, an insulating material, a conductive material, or a combination thereof. The substrate 8 comprises a material that can provide structural support to material portions that are subsequently formed thereupon. The substrate 8 comprises a substrate material layer 9 at least at an upper portion thereof. In one embodiment, the substrate material layer 9 may be a semiconductor material layer, such as a silicon layer.

The alternating stack is herein referred to as a first vertically alternating sequence. The level of the first vertically alternating sequence is herein referred to as a first-tier level, and the level of the alternating stack to be subsequently formed immediately above the first-tier level is herein referred to as a second-tier level, etc. The first vertically alternating sequence is also referred to as a first-tier alternating stack. In one embodiment, the first spacer material layers can be first sacrificial material layers 142 that are subsequently replaced with first electrically conductive layers. In another embodiment, the first spacer material layers can be first electrically conductive layers that are not subsequently replaced with other layers. While an embodiment is described in which first sacrificial material layers are replaced with first electrically conductive layers, embodiments in which the first spacer material layers are formed as first electrically conductive layers (thereby obviating the need to perform replacement processes) are expressly contemplated herein.

In one embodiment, each first insulating layer 132 can include an insulating material, and each first sacrificial material layer 142 can include a first sacrificial material. As used herein, a "sacrificial material" refers to a material that is removed during a subsequent processing step. As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the material of the first insulating layers 132 can be silicon oxide. The bottommost one of the first insulating layers 132 is herein referred to as a bottommost first insulating layer 132B, and the topmost one of the first insulating layers 132 is herein referred to as a topmost first insulating layer 132T.

The first sacrificial material of the first sacrificial material layers 142 is a material that can be removed selective to the material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The first sacrificial material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and the first sacrificial material layers can include silicon nitride sacrificial material layers. For example, if silicon oxide is employed for the first insulating layers 132, tetraethylorthosilicate (TEOS) can be employed as the precursor material for the CVD process. The material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first vertically alternating sequence (132, 142) can have a uniform thickness that is substantially invariant within each respective first sacrificial material layer 142.

The first exemplary structure may comprise a memory array region 100, a contact region 200 that is adjacent to the memory array region 100, and a connection region 400 in which connection via structures are subsequently formed.

Referring to FIGS. 2A and 2B, first-tier memory openings 149 can be formed through the first vertically alternating sequence (132, 142), i.e., through the first-tier alternating stack (132, 142), down to a top surface of the substrate 8. For example, a photoresist layer (not shown) can be applied over the first-tier alternating stack (132, 142), and can be lithographically patterned to form discrete openings therethrough. The pattern of openings in the photoresist layer can be transferred through the first-tier alternating stack (132, 142) by a first anisotropic etch process to form first-tier memory openings 149. The photoresist layer can be subsequently removed, for example, by ashing.

The first-tier memory openings 149 are formed in the memory array region 100 through each layer within the first-tier alternating stack (132, 142). The bottom surfaces of the first-tier memory openings 149 may be recessed surfaces of the substrate 8, or may be coplanar with a top surface of the substrate 8. In one embodiment, the first-tier memory openings 149 can be formed as clusters that are laterally spaced among one another along the second horizontal direction hd2. Each cluster of first-tier memory openings 149 can include a respective two-dimensional array of first-tier memory openings 149 having a first pitch along one horizontal direction and a second pitch along another horizontal direction. In one embodiment, the direction of the first memory structure pitch can be the first horizontal direction hd1 (e.g., word line direction) and the direction of the second memory structure pitch can be the second horizontal direction (e.g., bit line direction) hd2, or vice versa.

Referring to FIG. 3, sacrificial via structures 11 may be formed at a bottom portion of each first-tier memory opening 149. The sacrificial via material 11 comprises a material that may be removed selective to the material of the bottommost first insulating layer 132B. In one embodiment, the sacrificial via structures 11 may comprise a semiconductor material that is grown on physically exposed surfaces of the substrate 8 by a selective deposition process. For example, bottom surfaces of the first-tier memory openings 149 may be semiconductor surfaces of a semiconductor material layer within the substrate 8, and a selective semiconductor deposition process may be performed to grow a semiconductor material (such as silicon or a silicon-germanium alloy) from the physically exposed semiconductor surfaces of the substrate 8 to form the sacrificial via structures 11. In one embodiment, the top surfaces of the sacrificial via structures 11 may be formed below the horizontal plane including the top surface of the bottommost first insulating layer 132B.

A first sacrificial fill material can be deposited in the first-tier memory openings 149 to form sacrificial first-tier memory opening fill structures 122. The sacrificial first-tier memory opening fill structures 122 include a material that can be subsequently removed selective to the materials of the first insulating layers 132 and the first sacrificial material layers 142.

In one embodiment, the first sacrificial fill material of the sacrificial first-tier memory opening fill structures 122 can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer or a silicon nitride layer having a thickness in a range from 1 nm to 3 nm) may be employed prior to depositing the first sacrificial first-tier fill material. Alternatively, the first sacrificial fill material may comprise a carbon-based material (such as amorphous carbon or diamond-like carbon), organosilicate glass, a polymer material, or combinations thereof. The first sacrificial fill material may be formed by a non-conformal deposition or a conformal deposition method.

Portions of the deposited first sacrificial fill material can be removed from above the topmost layer of the first vertically alternating sequence (132, 142) employing a planarization process. The planarization process can include a recess etch, chemical mechanical planarization (CMP), or a combination thereof. Remaining portions of the sacrificial first-tier memory opening fill structures 122. Top surfaces of the sacrificial first-tier memory opening fill structures 122 may be coplanar with the top surface of the topmost first insulating layer 132T.

Figure 4B:
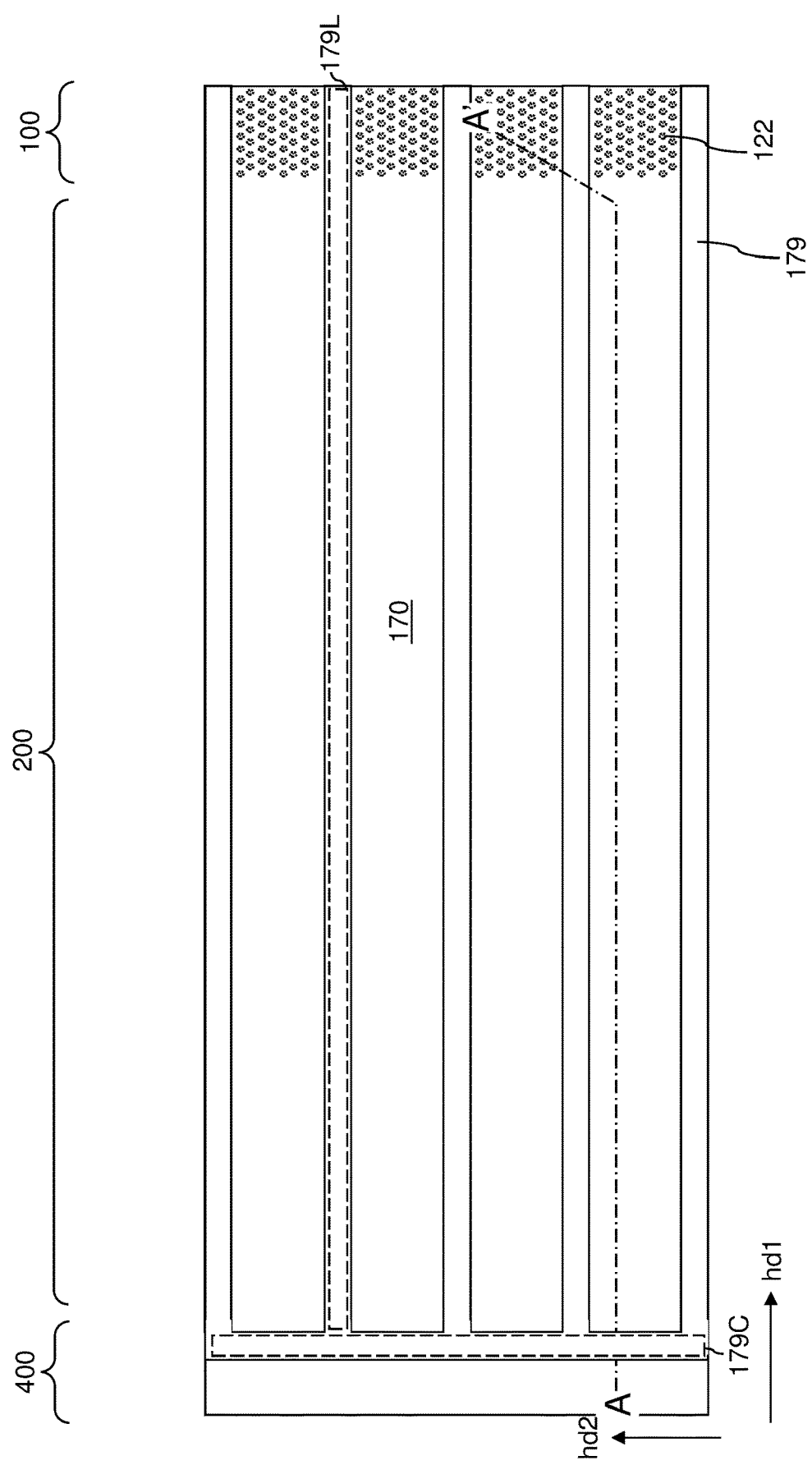
FIG. 4B is a top-down view of the first exemplary structure of FIG. 4A. The vertical plane A-A' is the plane of the vertical cross-sectional view of FIG. 4A.

Referring to FIGS. 4A and 4B, an insulating material, such as silicon oxide, can be deposited over the first-tier alternating stack (132, 142) to form a first insulating cap layer 170. The thickness of the first insulating cap layer 170 may be in a range from 10 nm to 100 nm, although lesser and greater thicknesses may also be employed.

A photoresist layer (not shown) may be applied over the first insulating cap layer 170, and may be lithographically patterned to form first linear openings laterally extending along the first horizontal direction hd1 and laterally spaced apart along the second horizontal direction hd2, and second linear openings laterally extending along the second horizontal direction hd2 and connected to end portions of each of the first linear openings.

An anisotropic etch process can be performed to transfer the pattern of the linear openings in the photoresist layer through the first insulating cap layer 170 and the first-tier alternating stack (132, 142). First-tier backside trenches 179 be formed through the first insulating cap layer 170 and the first-tier alternating stack (132, 142).

In one embodiment, the first-tier backside trenches 179 may comprise first-tier linear backside trenches 179L that laterally extend along the first horizontal direction hd1 and first-tier connection backside trenches 179C that laterally extend along the second horizontal direction hd2 and connected to end portions of the first-tier linear backside trenches 179L. While FIGS. 4A and 4B illustrate only one first-tier connection backside trench 179C, a pair of first-tier connection backside trenches 179C can be connected to a set of first-tier linear backside trenches 179L such that each end of the first-tier linear backside trenches 179L is connected to a respective first-tier connection backside trench 179C. Each first-tier alternating stack (132, 142) can be divided into a plurality of first-tier alternating stacks (132, 142) by the first-tier backside trenches 179.

In one embodiment, the first-tier linear backside trenches 179L may be formed between clusters of sacrificial first-tier memory opening fill structures 122. In other words, neighboring clusters of sacrificial first-tier memory opening fill structures 122 may be laterally spaced apart along the second horizontal direction hd2 by the first-tier linear backside trenches 179L.

Figure 5:
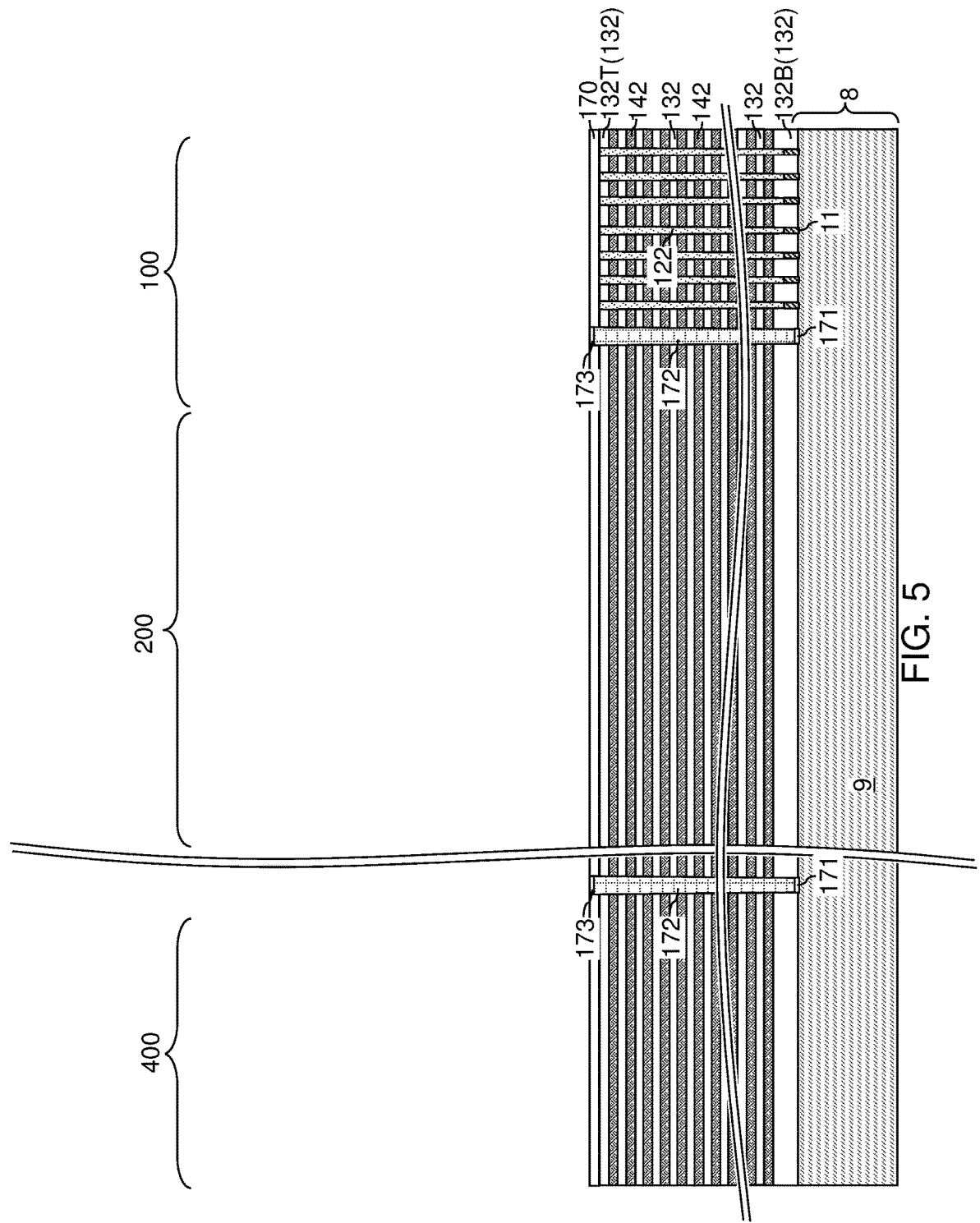
FIG. 5 is a vertical cross-sectional view of the first exemplary structure after formation of a first-tier backside trench fill structure according to the first embodiment of the present disclosure.

Referring to FIG. 5, each first-tier backside trench 179 can be filled with a respective first-tier backside trench fill structure (171, 172, 173). Each first-tier backside trench fill structure (171, 172, 173) may comprise a bottom etch stop barrier layer 171, a first-tier sacrificial trench fill material portion 172, and a top etch stop barrier layer 173. In one embodiment, the bottom etch stop barrier layer 171 may be formed by oxidation of a surface portion of the substrate 8 that is physically exposed to a respective first-tier backside trench 179. In this case, the bottom etch stop barrier layer 171 may comprise a semiconductor oxide layer, such as a silicon oxide layer. The first-tier sacrificial trench fill material portion 172 may comprise a semiconductor material, such as amorphous silicon, polysilicon, or a silicon-germanium alloy. The first-tier sacrificial trench fill material portion 172 may be formed by depositing a sacrificial trench fill material in a first-tier backside trench 179, and by removing portions of the sacrificial trench fill material from above the horizontal plane including the top surface of the first insulating cap layer 170. The top etch stop barrier layer 173 may be formed by oxidizing a top surface portion of the first-tier sacrificial trench fill material portion 172. In this case, the top etch stop barrier layer 173 may comprise a semiconductor oxide material layer, such as a silicon oxide layer.

Figure 6:
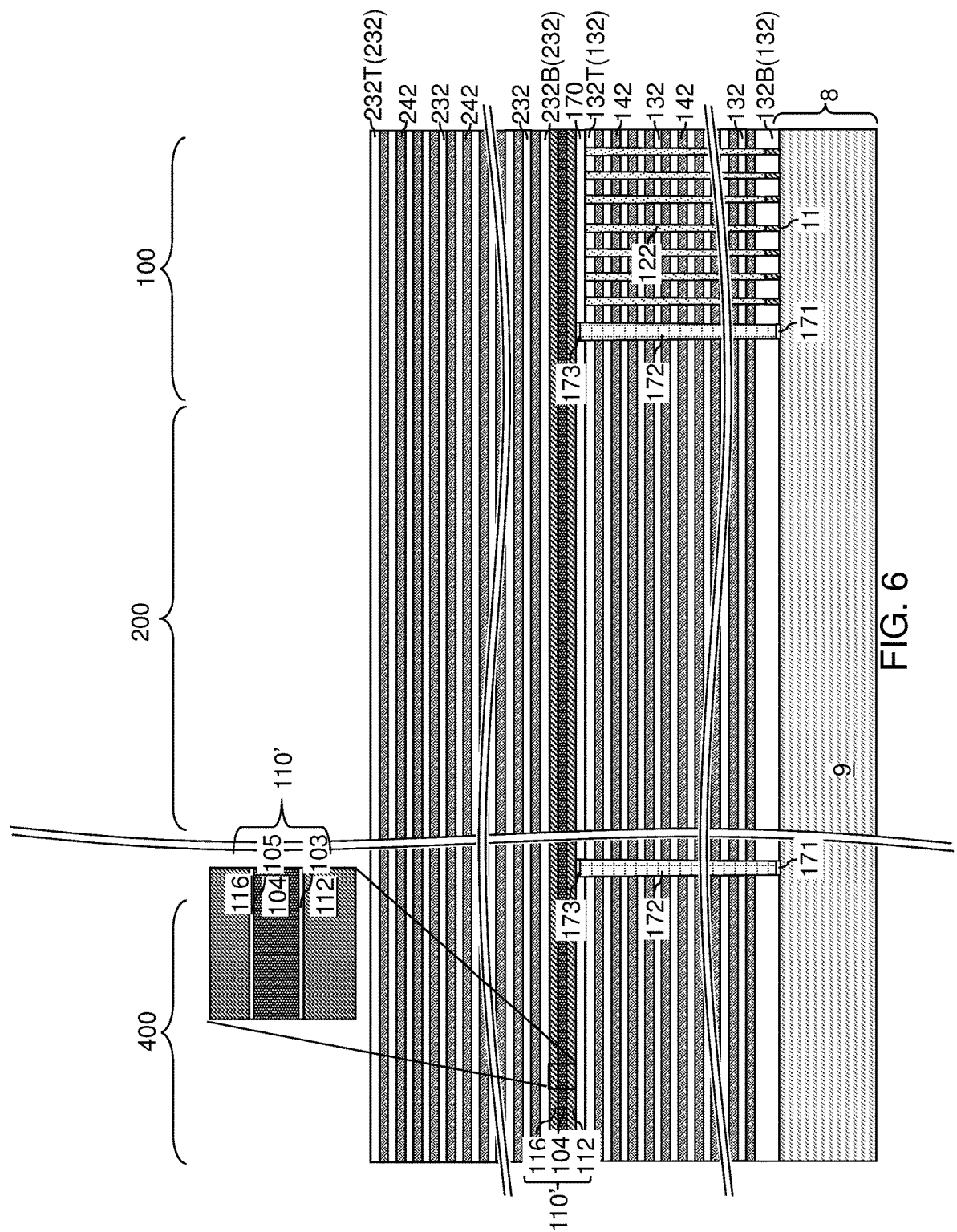
FIG. 6 is a vertical cross-sectional view of the first exemplary after formation of in-process source-level material layers and a second alternating stack of second insulating layers and second sacrificial material layers according to a first embodiment of the present disclosure.

Referring to FIG. 6, in-process source-level material layers 110' including a layer stack of material layers can be formed over first insulating cap layer 170 and the first-tier backside trench fill structures (171, 172, 173). The in-process source-level material layers 110' can include various layers that are subsequently modified to form source-level material layers. The source-level material layers, upon formation, include a source contact layer that functions as a common source region for vertical NAND strings of a three-dimensional memory device. In one embodiment, the in-process source-level material layer 110' can include, from bottom to top, a lower source-level material layer 112, an optional lower sacrificial liner 103, a source-level sacrificial layer 104, an optional upper sacrificial liner 105, and an upper source-level material layer 116.

The lower source-level material layer 112 and the upper source-level material layer 116 can include a doped semiconductor material, such as doped polysilicon or doped amorphous silicon. The doped semiconductor material of the lower source-level material layer 112 is herein referred to as a first doped semiconductor material, and the doped semiconductor material of the upper source-level material layer 116 is herein referred to as a second doped semiconductor material, which may be the same or different from the first doped semiconductor material. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a second sacrificial material that can be removed selective to the lower sacrificial liner 103 and the upper sacrificial liner 105. The second sacrificial material can be different from the first sacrificial material of the first sacrificial material layers 142. In one embodiment, the source-level sacrificial layer 104 can include a semiconductor material such as undoped amorphous silicon, undoped polysilicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

An alternating stack of second insulating layers 232 and second spacer material layers is formed over the in-process source-level material layers 110'. The alternating stack is herein referred to as a second vertically alternating sequence, and is also referred to as a second-tier alternating stack. In one embodiment, the second spacer material layers can be second sacrificial material layers 242 that are subsequently replaced with second electrically conductive layers. In another embodiment, the second spacer material layers can be second electrically conductive layers that are not subsequently replaced with other layers. While an embodiment is described in which second sacrificial material layers are replaced with second electrically conductive layers, embodiments in which the second spacer material layers are formed as second electrically conductive layers (thereby obviating the need to perform replacement processes) are expressly contemplated herein.

In one embodiment, each second insulating layer 232 can include an insulating material, which may be the same as the insulating material of the first insulating layers 132. Each second sacrificial material layer 242 can include a sacrificial material, which may be the same as the first sacrificial material of the first sacrificial material layers 142. The second sacrificial material layers 242 may comprise an insulating material, a semiconductor material, or a conductive material. The second sacrificial material of the second sacrificial material layers 242 can be subsequently replaced with electrically conductive electrodes which can function, for example, as control gate electrodes of a vertical NAND device. In one embodiment, the second sacrificial material layers 242 can be material layers that comprise silicon nitride.

In one embodiment, the second insulating layers 232 can include silicon oxide, and the second sacrificial material layers 242 can include silicon nitride sacrificial material layers. For example, if silicon oxide is employed for the second insulating layers 232, tetraethylorthosilicate (TEOS) can be employed as the precursor material for the CVD process. The material of the second sacrificial material layers 242 can be formed, for example, CVD or atomic layer deposition (ALD). The bottommost one of the second insulating layers 232 is herein referred to as a bottommost second insulating layer 232B, and a topmost one of the second insulating layers 232 is herein referred to as a topmost second insulating layer 232T.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the first vertically alternating sequence (232, 242) can have a uniform thickness that is substantially invariant within each respective second sacrificial material layer 242.

Figure 7:
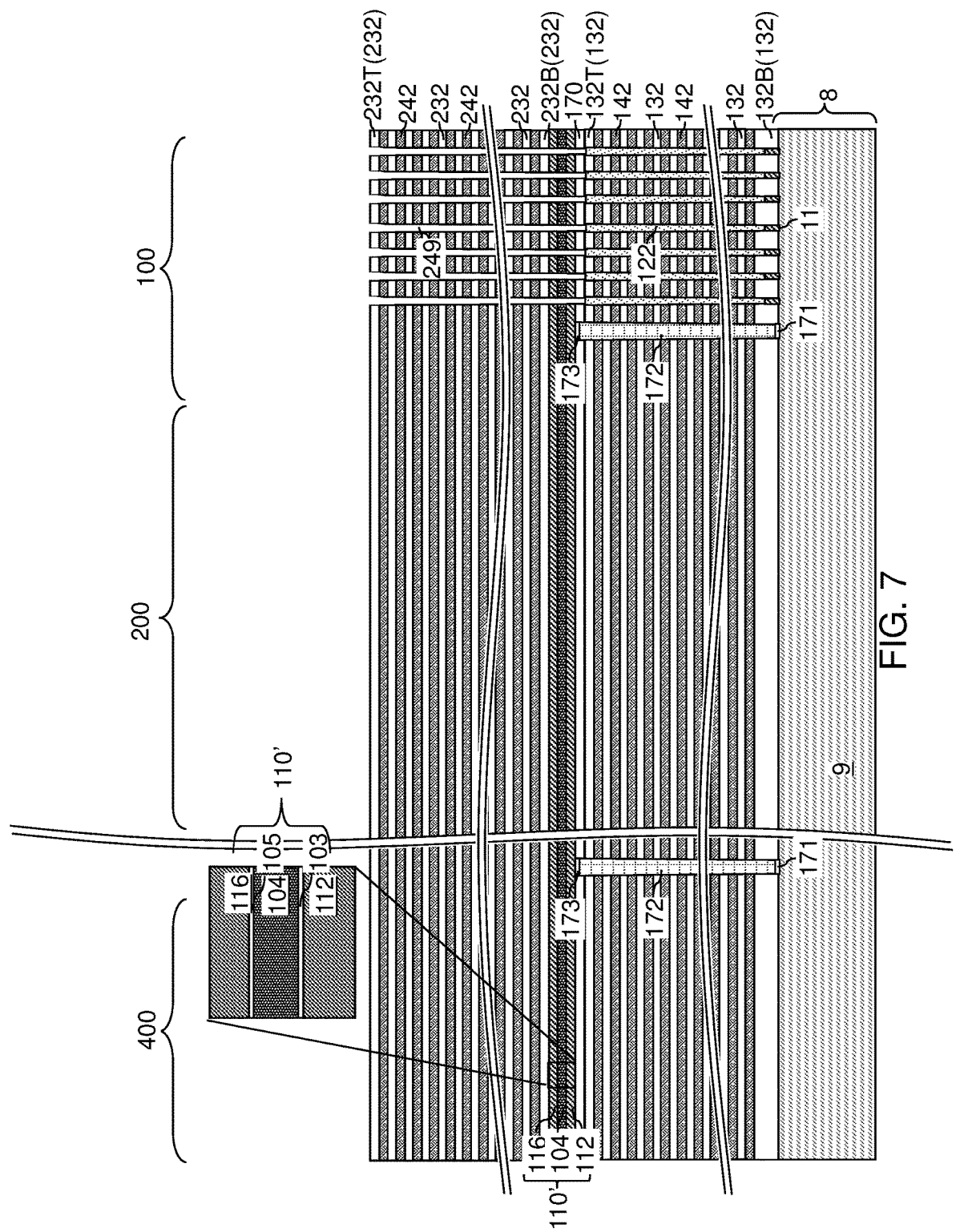
FIG. 7 is a vertical cross-sectional view of the first exemplary structure after formation of second-tier memory openings according to the first embodiment of the present disclosure.

Referring to FIG. 7, second-tier memory openings 249 can be formed through the second-tier alternating stack (232, 242) and through the in-process source-level material layers 110'. For example, a photoresist layer (not shown) can be applied over the second-tier alternating stack (232, 242), and can be lithographically patterned to form discrete openings within areas that overlie the sacrificial first-tier memory opening fill structures 122. The pattern of openings in the photoresist layer can be transferred through the second-tier alternating stack (232, 242) by a second anisotropic etch process to form second-tier memory openings 249. A top surface of a sacrificial first-tier memory opening fill structure 122 can be physically exposed at the bottom of each second-tier memory opening 249. The photoresist layer can be subsequently removed, for example, by ashing. A sidewall of each component layer within the in-process source-level material layers 110' can be physically exposed at a bottom portion of each second-tier memory opening 249.

Figure 8:
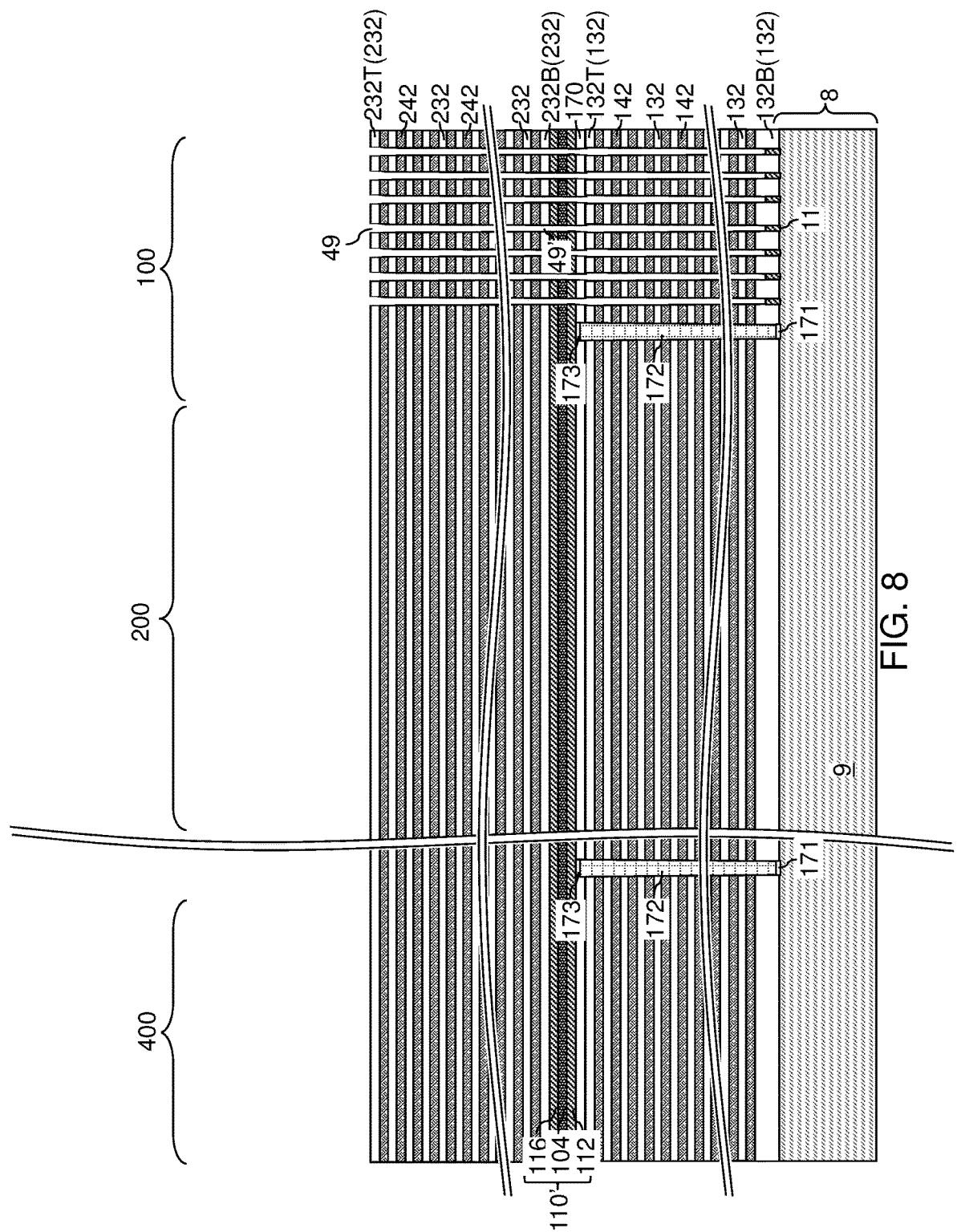
FIG. 8 is a vertical cross-sectional view of the first exemplary structure after formation of inter-tier memory openings according to the first embodiment of the present disclosure.

Referring to FIG. 8, the material of the sacrificial first-tier memory opening fill structures 122 can be removed selective to materials of the first-tier alternating stack (132, 232), the second-tier alternating stack (232, 242), and the in-process source-level material layers 110'. In an illustrative example, if the sacrificial first-tier memory opening fill structures 122 comprise a carbon-based material (such as amorphous carbon or diamond-like carbon (DLC), an ashing process may be performed to remove the material of the sacrificial first-tier memory opening fill structures 122 can be removed selective to materials of the first-tier alternating stack (132, 232), the second-tier alternating stack (232, 242), and the in-process source-level material layers 110'.

Each contiguous volume including a volume of a second-tier memory opening 249 and a volume of an underlying first-tier memory opening 149 is herein referred to as a memory opening 49, or an inter-tier memory opening. A sacrificial via structure 11 can be located at a bottom portion of each inter-tier memory opening. A void, which is herein referred to as a memory cavity 49', may be present above the sacrificial via structure 11 within each inter-tier memory opening. Generally, arrays of memory openings can be formed in the first exemplary structure. Each array of memory openings vertically extends through a first-tier alternating stack (132, 142), the in-process source-level material layers 110', and the second-tier alternating stack (232, 242). A top surface of a sacrificial via structure 11 can be physically exposed at the bottom of each memory cavity 49'.

FIGS. 9A-9D are sequential vertical cross-sectional views of the a memory array region 100 during formation of a memory opening fill structure 58 according to the first embodiment of the present disclosure.

Referring to FIG. 9A, a memory opening in the first exemplary device structure of FIG. 8 is illustrated. A memory cavity 49' and a sacrificial via structure 11 can be located within each memory opening 49.

Referring to FIG. 9B, a stack of layers including a blocking dielectric layer 52, a memory material layer 54, an optional dielectric liner 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the memory material layer 54 can be formed. Generally, the memory material layer may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a conductive material, such as doped polysilicon or a metallic material, that is patterned into multiple electrically isolated portions (e.g., floating gates), for example, by being formed within lateral recesses into sacrificial material layers (142, 242). In one embodiment, the memory material layer 54 includes a silicon nitride layer. In one embodiment, the sacrificial material layers (142, 242) and the insulating layers (132, 232) can have vertically coincident sidewalls, and the memory material layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the memory material layer 54 as a plurality of memory material portions that are vertically spaced apart. While an embodiment is described in which the memory material layer 54 is a single continuous layer, embodiments are expressly contemplated herein in which the memory material layer 54 is replaced with a plurality of discrete memory material portions (which can be charge trapping material portions or electrically isolated conductive material portions) that are vertically spaced apart. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

Generally, any vertical stack of memory elements known in the art may replace the memory material layer 54. The vertical stack of memory elements can be formed at levels of the sacrificial material layers (142, 242) within each memory opening, and may be formed as portions of a continuous memory material layer, or may be formed as discrete memory material portions.

The optional dielectric liner 56, if present, includes a dielectric material. In one embodiment, the optional dielectric liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The optional dielectric liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the optional dielectric liner 56 can include a stack of a first silicon oxide layer, a silicon oxynitride layer, and a second silicon oxide layer, which is commonly known as an ONO stack. In one embodiment, the optional dielectric liner 56 can include a silicon oxide layer that is substantially free of carbon or a silicon oxynitride layer that is substantially free of carbon. The thickness of the optional dielectric liner 56 can be in a range from 2 nm to 20 nm, although lesser and greater thicknesses can also be employed. The stack of the blocking dielectric layer 52, the memory material layer 54, and the optional dielectric liner 56 constitutes a memory film 50, which is also referred to as a continuous memory film 50, that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. A memory cavity 49' may be present in the volume of each memory opening that is not filled with the deposited material layers (52, 54, 56, 60L).

Referring to FIG. 9C, in case the memory cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the topmost second insulating layer 232T can be removed, for example, by a recess etch. The recess etch continues until top surfaces of the remaining portions of the dielectric core layer are recessed to a height between the top surface of the topmost second insulating layer 232T and the bottom surface of the topmost second insulating layer 232T. Each remaining portion of the dielectric core layer constitutes a dielectric core 62. In some embodiments, an encapsulated cavity 69 that is free of any solid phase material may be formed within a dielectric core 62.

Referring to FIG. 9D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the optional dielectric liner 56, the memory material layer 54, and the blocking dielectric layer 52 that overlie the horizontal plane including the top surface of the topmost second insulating layer 232T can be removed by a planarization process such as a chemical mechanical planarization (CMP) process.

Each remaining portion of the doped semiconductor material having a doping of the second conductivity type constitutes a top drain region 63. The drain regions 63 can have a doping of a second conductivity type that is the opposite of the first conductivity type. For example, if the first conductivity type is p-type, the second conductivity type is n-type, and vice versa. The dopant concentration in the top drain regions 63 can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A optional dielectric liner 56 is surrounded by a memory material layer 54, and laterally surrounds a vertical semiconductor channel 60. Each adjoining set of a blocking dielectric layer 52, a memory material layer 54, and an optional dielectric liner 56 collectively constitute a memory film 50, which is also referred to as a continuous memory film 50. Each memory film 50 includes a vertical stack of memory elements that can store memory bits for a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening constitutes a memory stack structure 55. The memory stack structure 55 is a combination of a vertical semiconductor channel 60, the optional dielectric liner 56, a plurality of memory elements which comprise portions of the memory material layer 54, and an optional blocking dielectric layer 52. Each combination of a sacrificial via structure 11, a memory stack structure 55, a dielectric core 62, and a top drain region 63 within a memory opening fills an entire volume of a memory opening, and as such, constitutes a memory opening fill structure 58.

Generally, a memory opening fill structure 58 can be formed in each memory opening. The memory opening fill structure 58 comprises a vertical semiconductor channel 60 vertically extending through the first-tier alternating stack (132, 142), the sacrificial source-level material layer 104, and the second-tier alternating stack (232, 242), and further comprises a vertical stack of memory elements located at levels of the first spacer material layers (such as the first sacrificial material layers 142) and the second spacer material layers (such as the second sacrificial material layers 242). In one embodiment, the memory opening fill structure 58 comprises a continuous memory film 50 that is formed on a sidewall of the memory opening. A vertical semiconductor channel 60 can be formed on an inner sidewall of the continuous memory film 50. In one embodiment, the memory opening fill structure 58 comprises a top drain region 63 contacting a top end portion of the vertical semiconductor channel 60. The top drain region 63 is located above a level of a topmost second sacrificial material layer 242, and contacts a top end portion of the vertical semiconductor channel 60. In one embodiment, the vertical semiconductor channel 60 has a doping of a first conductivity type, and the top drain region 63 has a doping of a second conductivity type that is an opposite of the first conductivity type. In one embodiment, the top drain region 63 contacts a cylindrical surface segment of an inner sidewall of the vertical semiconductor channel 60. In one embodiment, the top drain region 63 is laterally spaced from the continuous memory film 50 by a top end portion of the vertical semiconductor channel 60.

Figure 10:
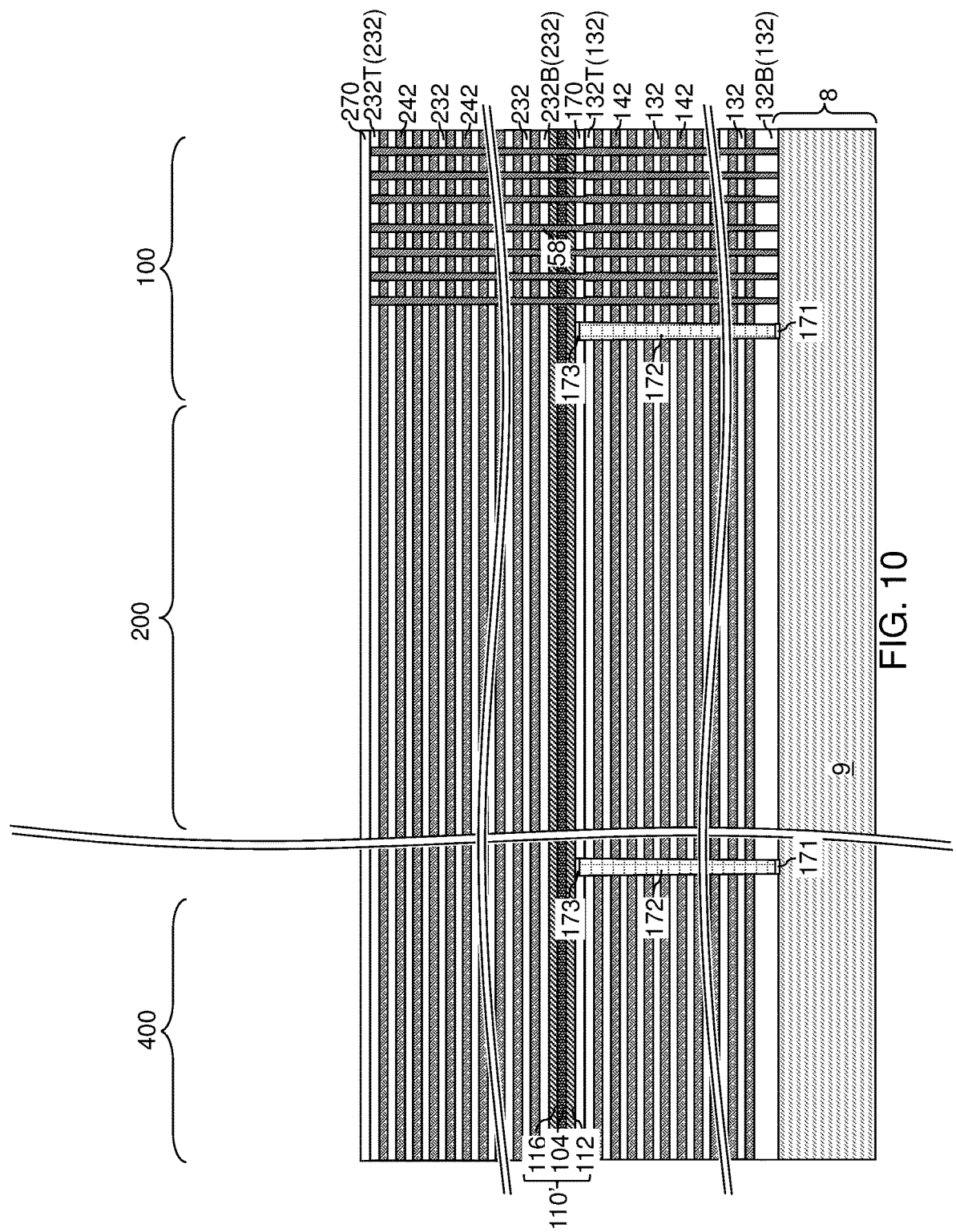
FIG. 10 is a vertical cross-sectional view of the first exemplary structure after formation of memory opening fill structures and a second insulating cap layer according to the first embodiment of the present disclosure.

Referring to FIG. 10, the first exemplary structure is shown after formation of memory opening fill structures 58 in the memory openings. Each memory opening 49 is filled with a respective memory opening fill structure 58. Each memory opening fill structure 58 comprises a respective vertical semiconductor channel 60 and a respective vertical stack of memory elements (which may comprise portions of a memory material layer 54 located at levels of the sacrificial material layers (142, 242)). Each cluster of memory opening fill structures 58 may be arranged as a two-dimensional periodic array having a first periodicity along a first horizontal direction hd1 and having a second periodicity along a second horizontal direction hd2.

An insulating material, such as silicon oxide can be deposited over the second-tier alternating stack (232, 242) to form a second insulating cap layer 270. The thickness of the second insulating cap layer 270 may be in a range from 10 nm to 100 nm, although lesser and greater thicknesses may also be employed.

Figure 11A:
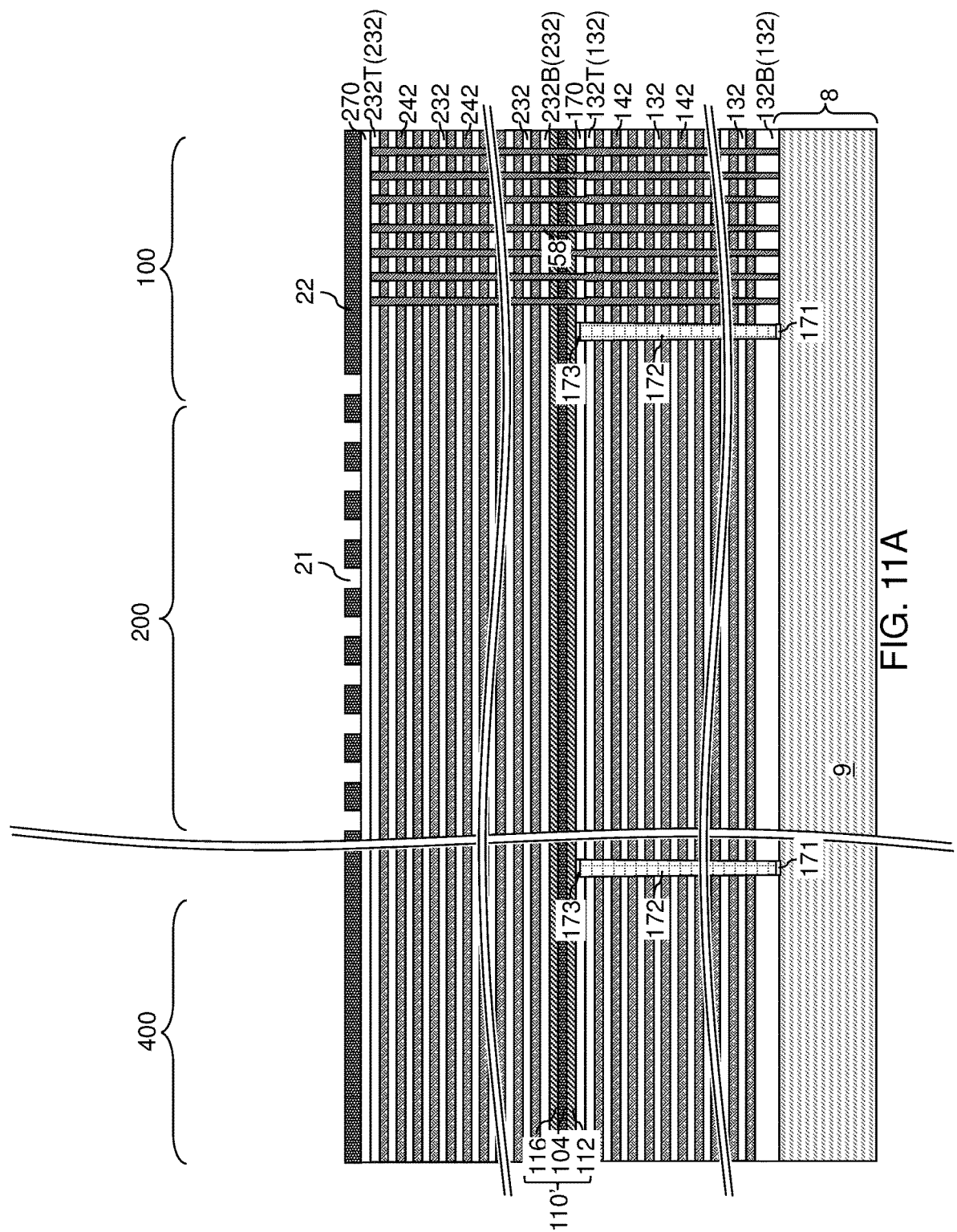
FIG. 11A is a vertical cross-sectional view of the first exemplary structure after formation of a patterned hard mask layer according to the first embodiment of the present disclosure.
Figure 11B:
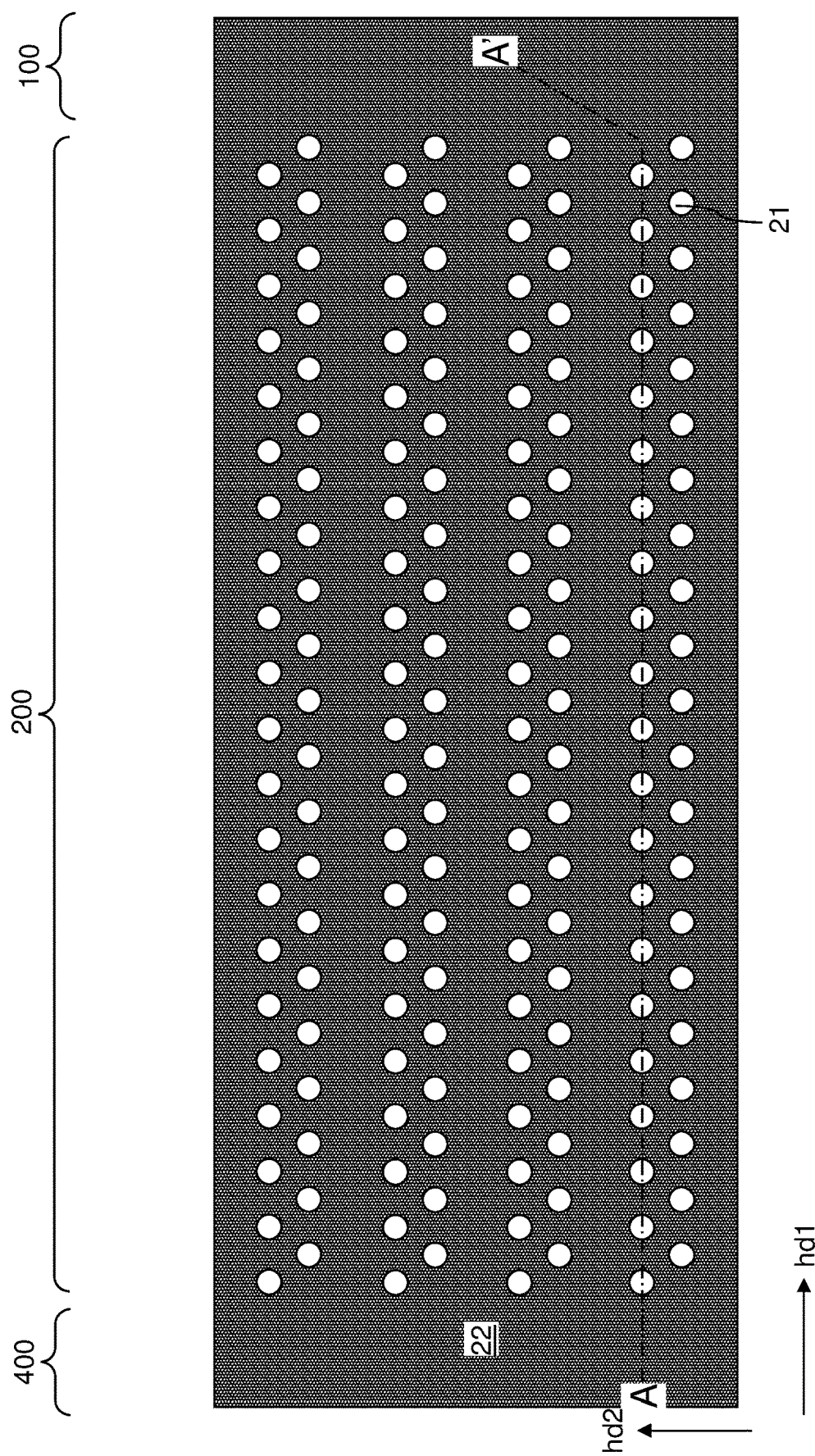
FIG. 11B is a top-down view of the first exemplary structure of FIG. 11A.

Referring to FIGS. 11A and 11B, a patterned hard mask layer 22 can be formed over the second insulating cap layer 270. In one embodiment, the patterned hard mask layer 22 may comprise a metallic material (such as TiN, TaN, WN, Ti, Ta, W, Ru, etc.), a carbon material (e.g., Advanced patterning Film® available from Applied Materials, Inc.) and/or an inorganic dielectric material (such as silicon nitride, silicon carbide, silicon carbide nitride, or at least one dielectric metal oxide material). The patterned hard mask layer 22 can be formed by depositing a blanket etch mask layer (i.e., an unpatterned hard mask layer) over the second insulating cap layer 270, by applying a photoresist layer (not shown) over the blanket etch mask layer and lithographically patterning the photoresist layer, and by transferring a pattern in the patterned photoresist layer though the blanket etch mask layer by performing an anisotropic etch process that etches unmasked portions of the blanket etch mask layer that are not covered by the patterned photoresist layer. The patterned photoresist layer can be subsequently removed, for example, by ashing.

The patterned hard mask layer 22 may comprise arrays of mask openings 21. Each array of mask openings 21 comprises a plurality of openings that are located between a respective strip region that laterally extends along the first horizontal direction hd1. Generally, the arrays of mask openings 21 may be laterally spaced apart along the second horizontal direction hd2. Each array of mask openings 21 may be laterally offset along the first horizontal direction hd1 from a respective array of memory opening fill structures 58 located in the memory array region 100. The thickness of the patterned hard mask layer 22 may be in a range from 100 nm to 1,000 nm, although lesser and greater thicknesses may also be employed.

Figure 12A:
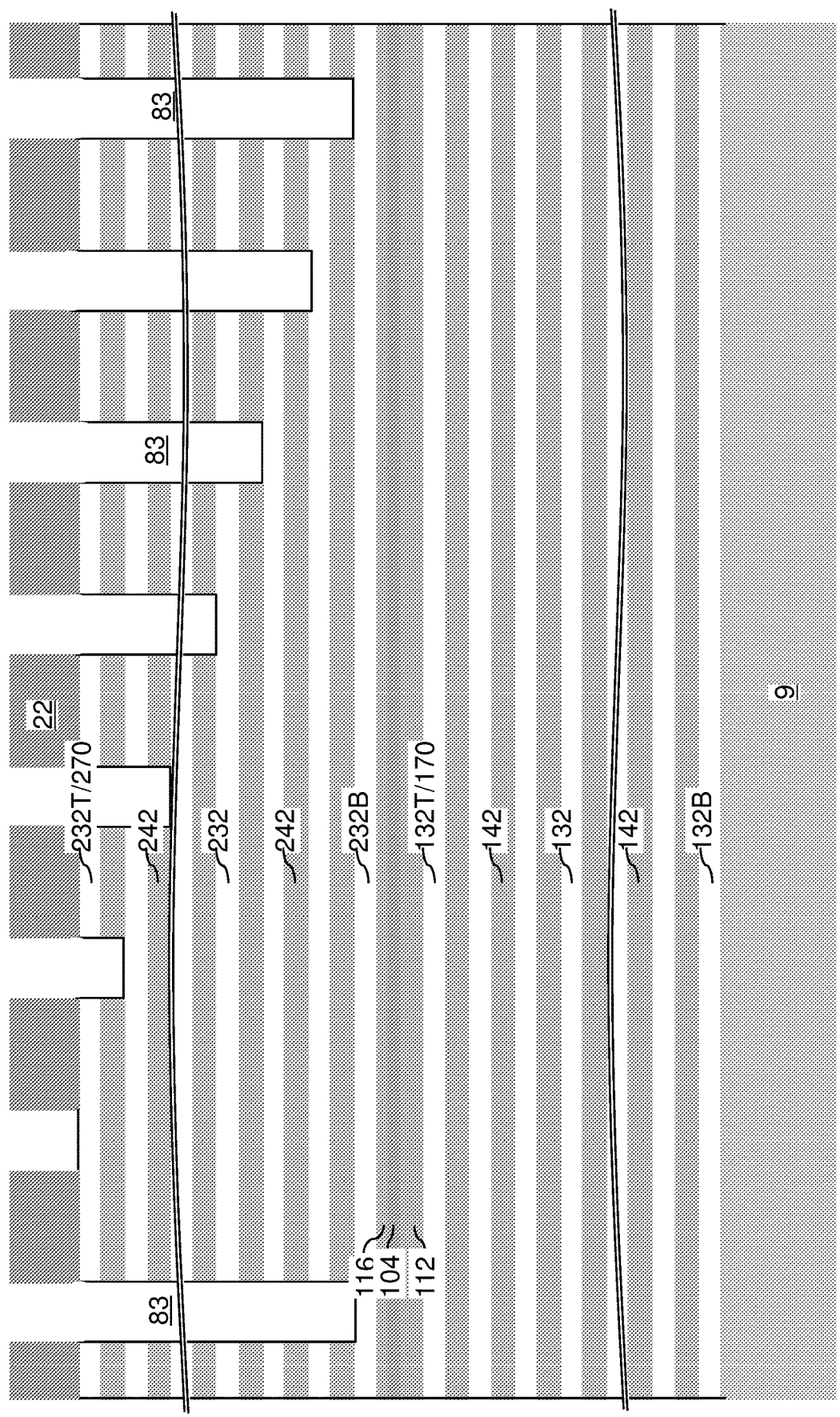
FIGS. 12A-12Q are sequential vertical cross-sectional view of a contact region during formation of in-process layer contact assemblies according to the first embodiment of the present disclosure.
Figure 12B:
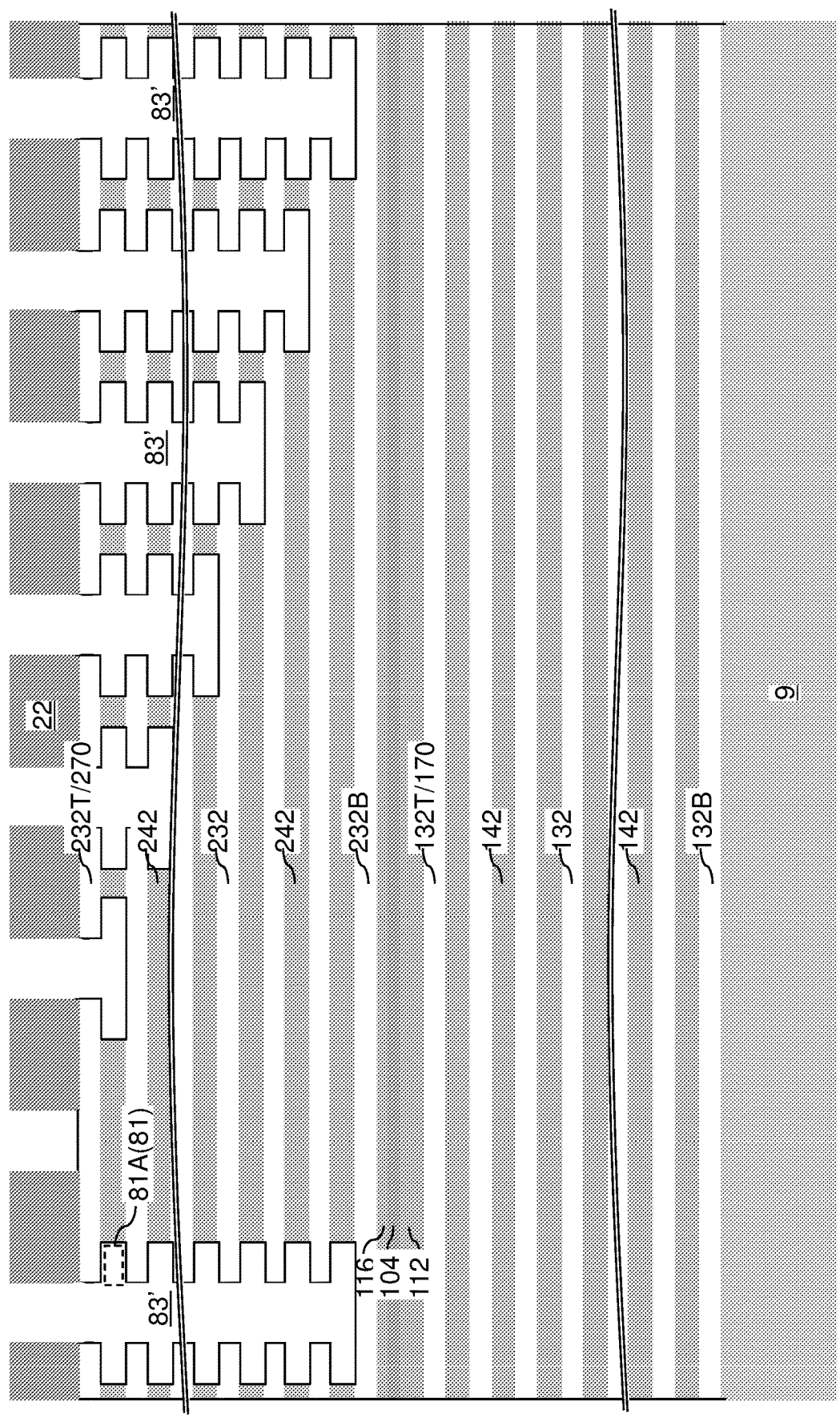
Figure 12C:
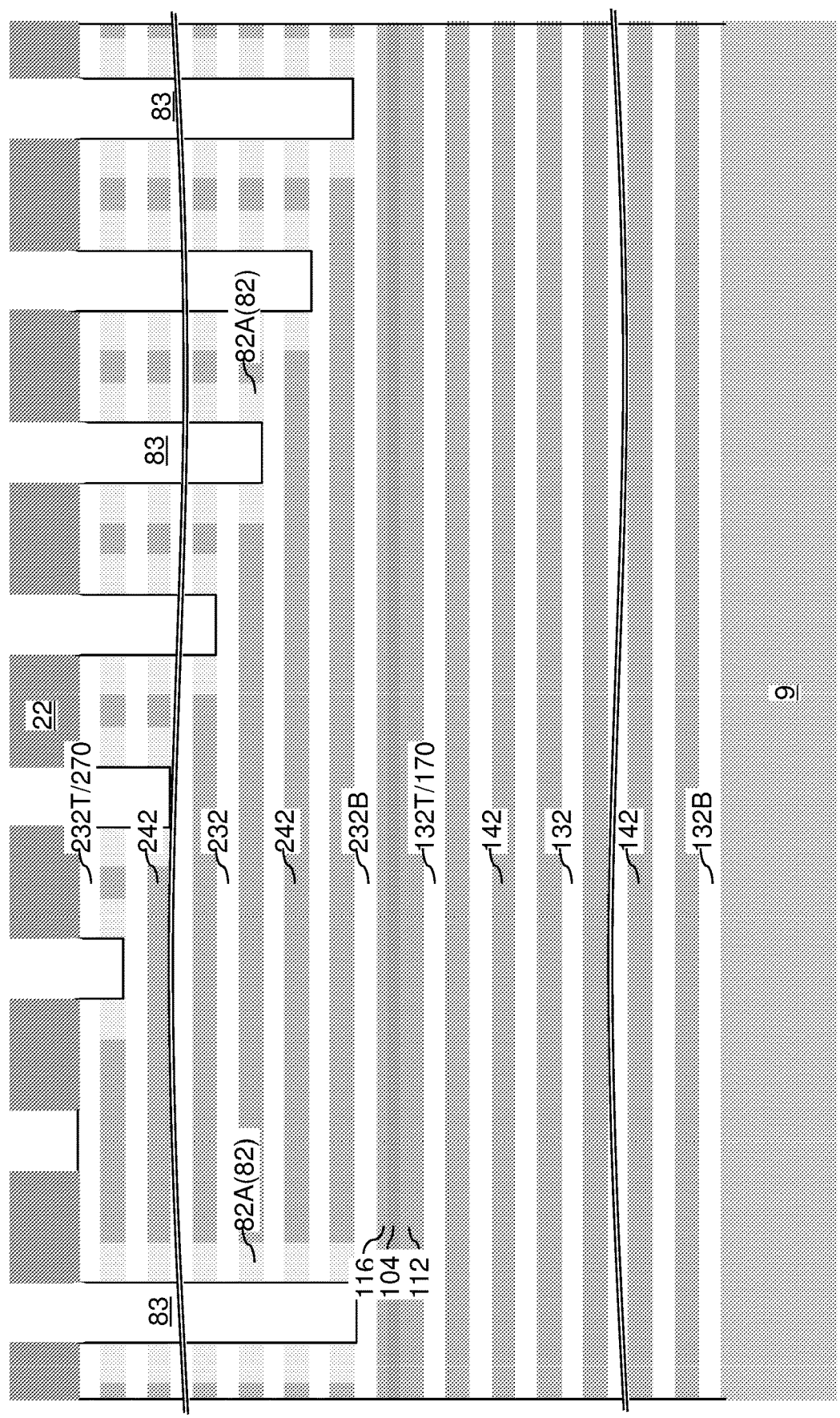
Figure 12D:
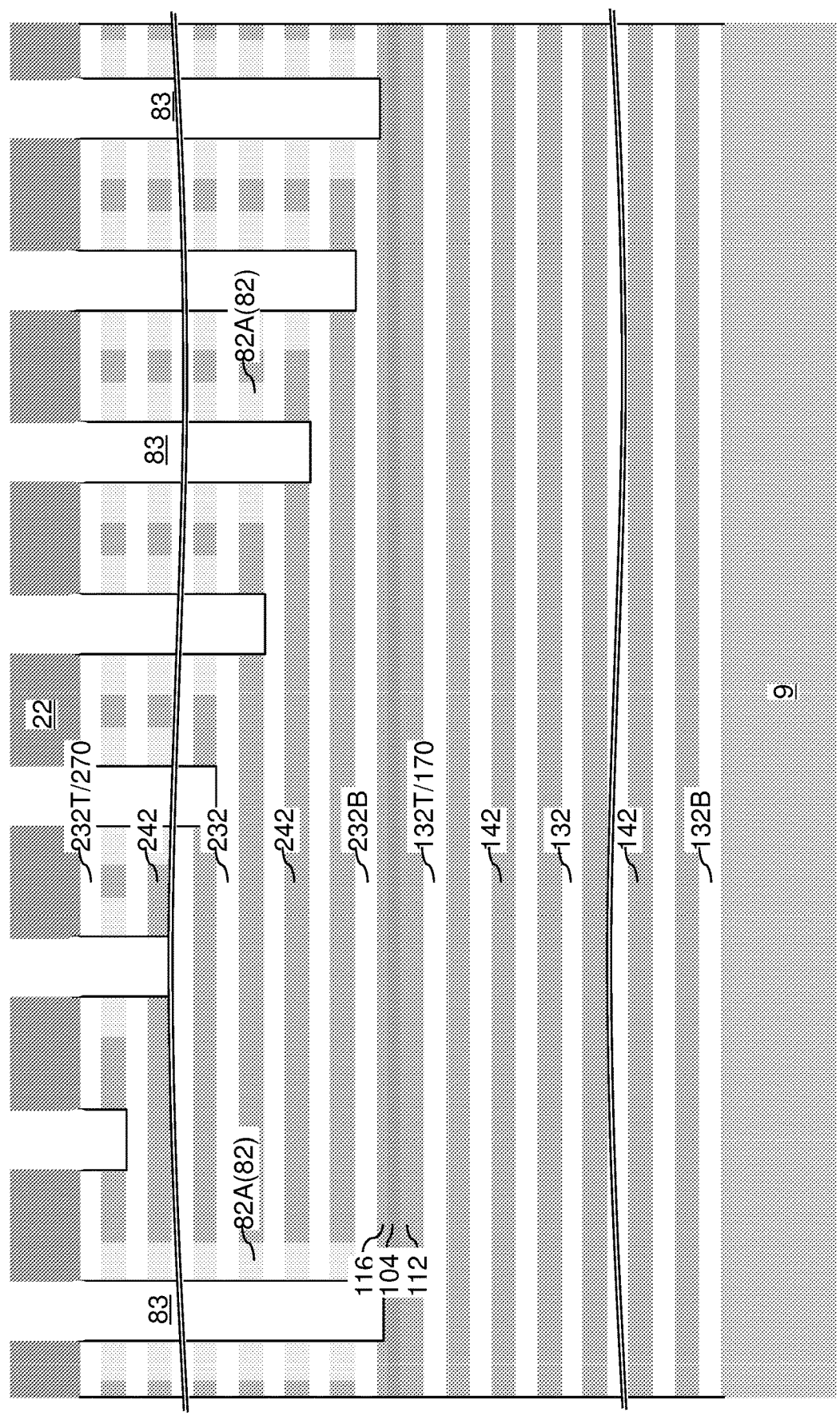
Figure 12E:
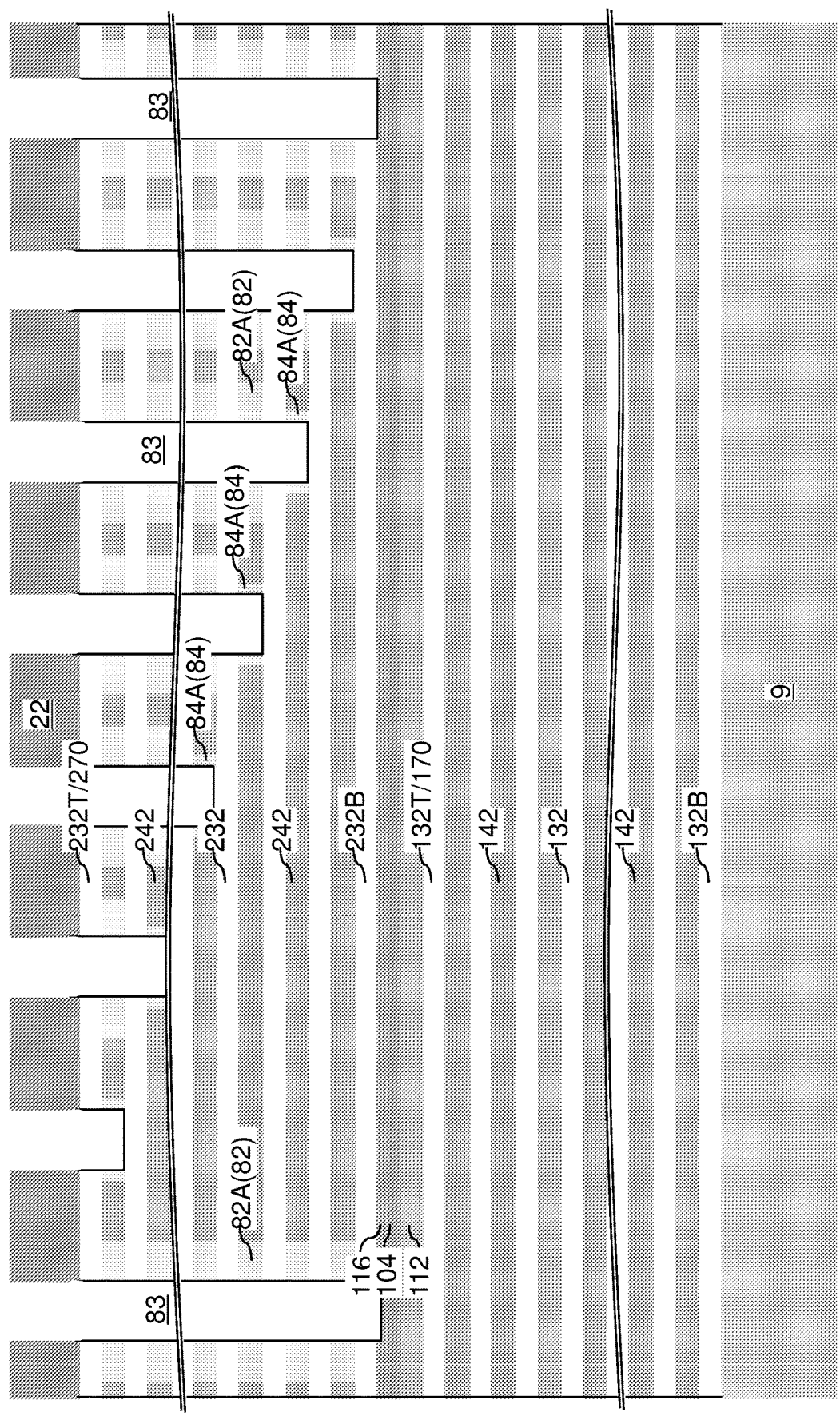
Figure 12F:
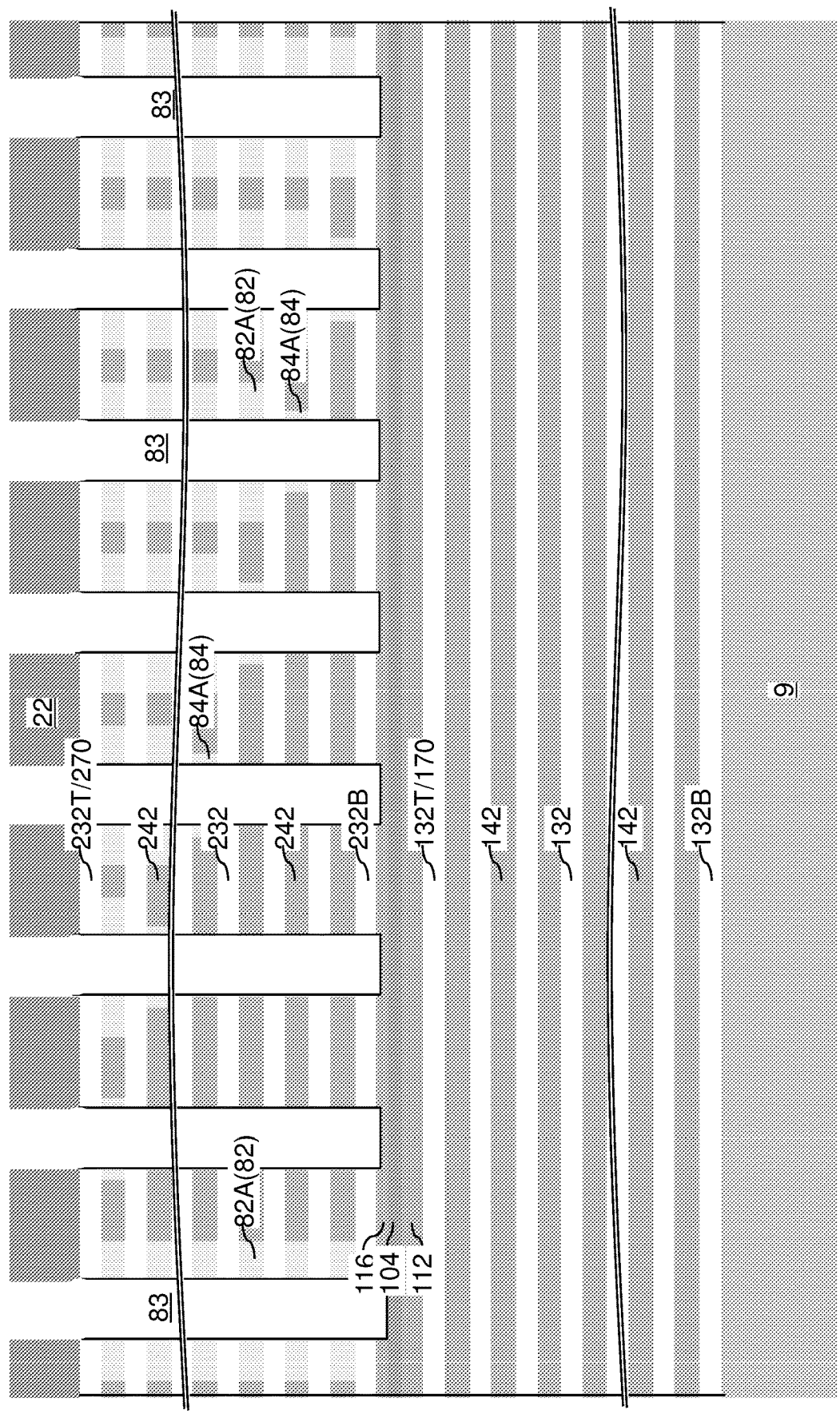
Figure 12G:
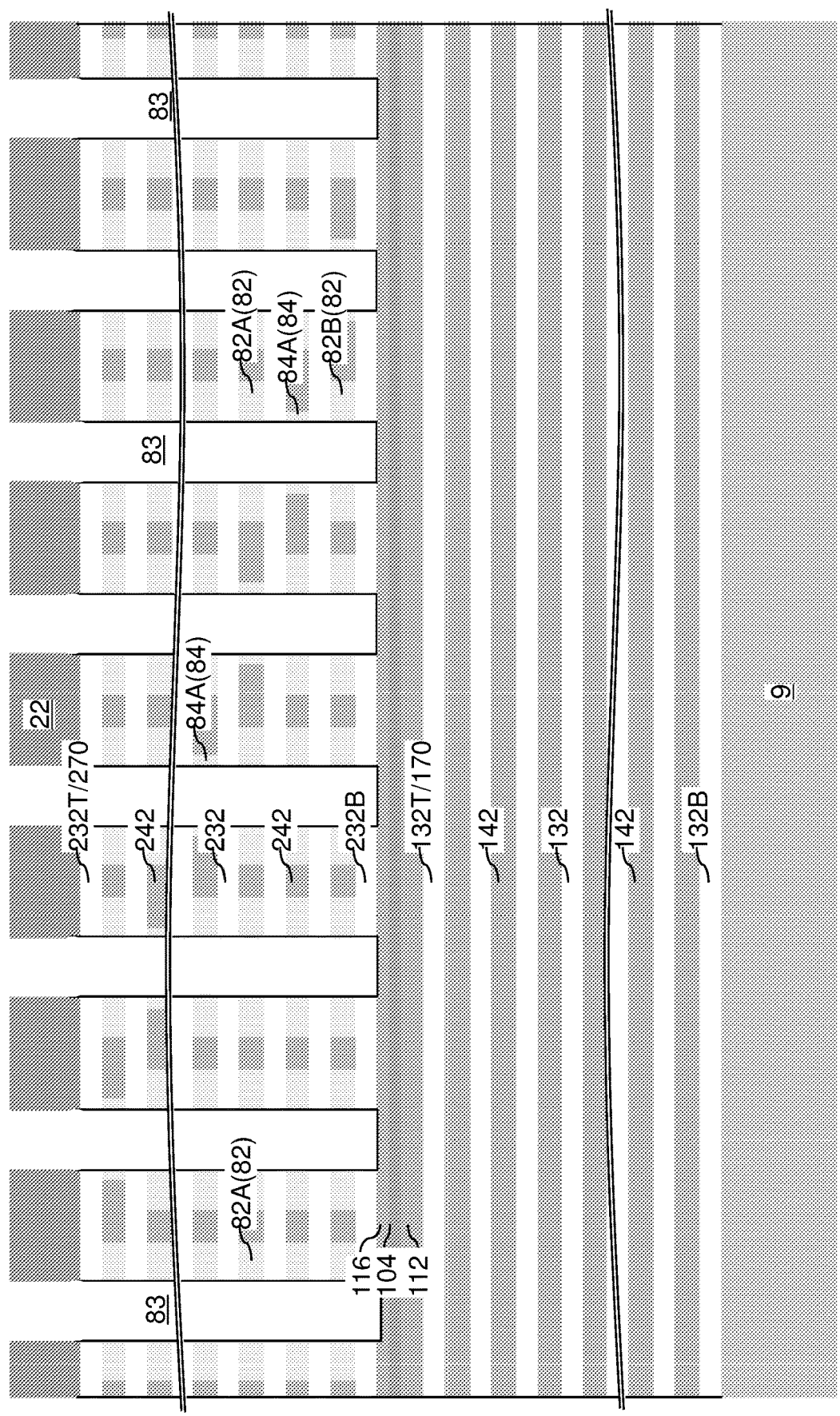
Figure 12H:
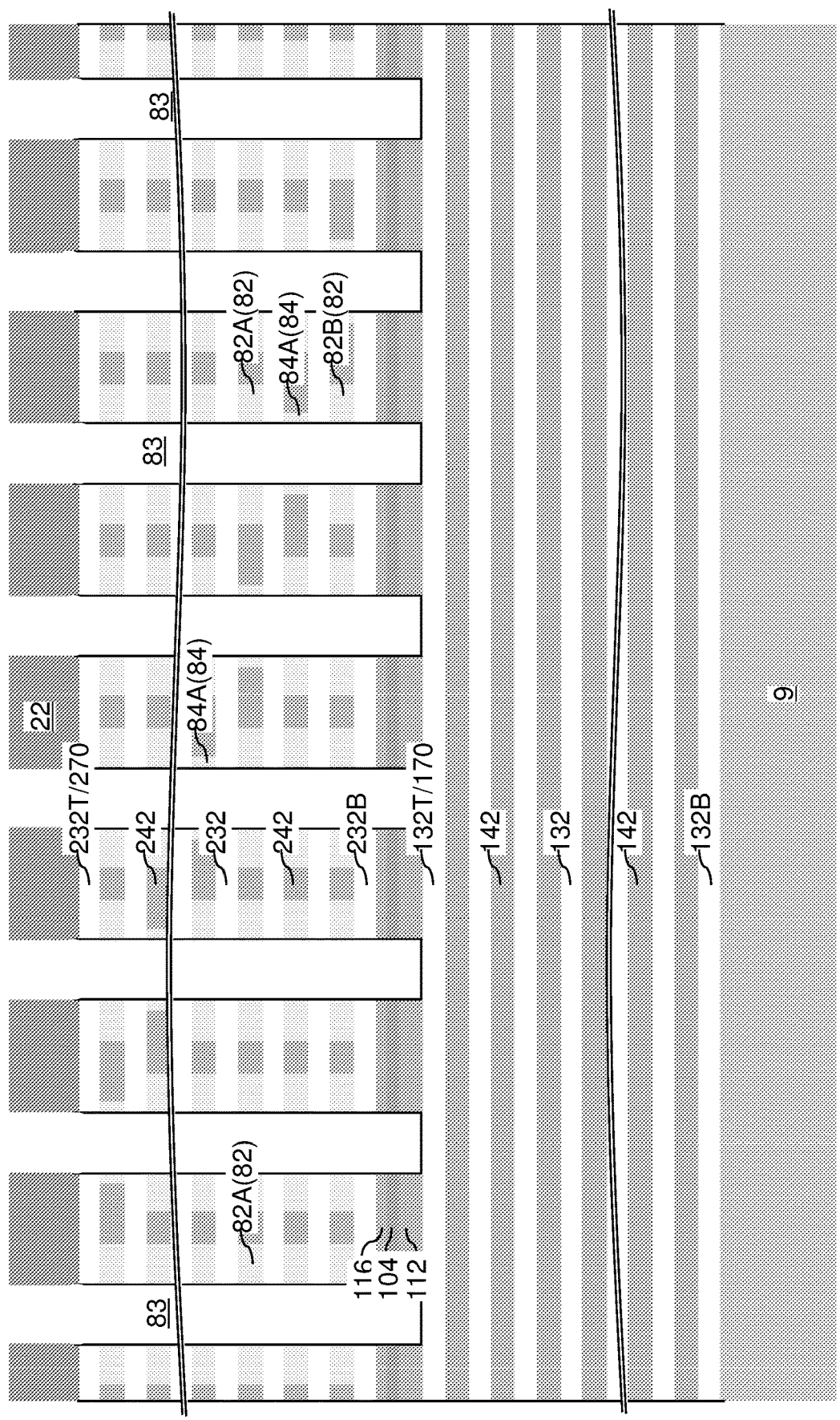
Figure 12I:
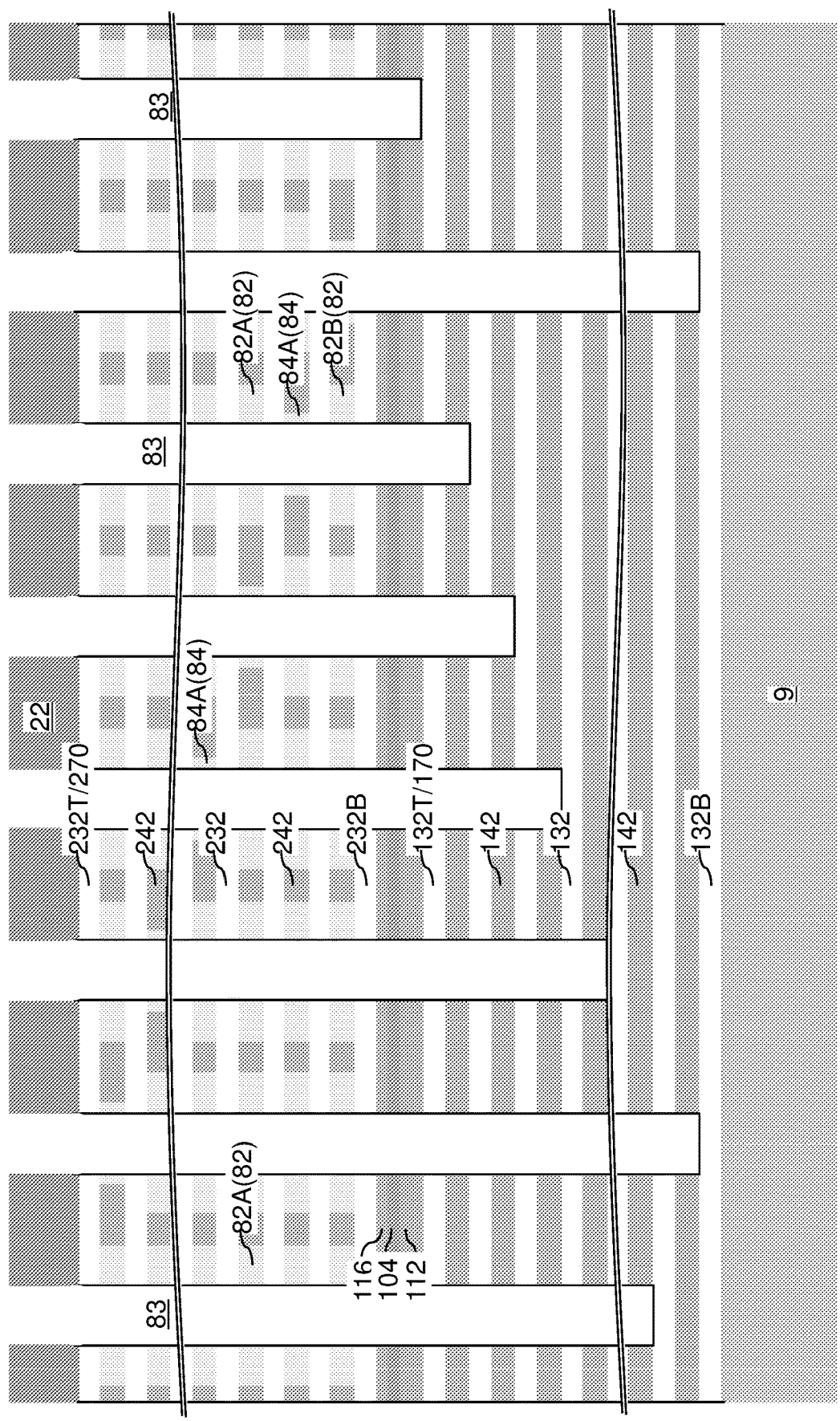
Figure 12J:
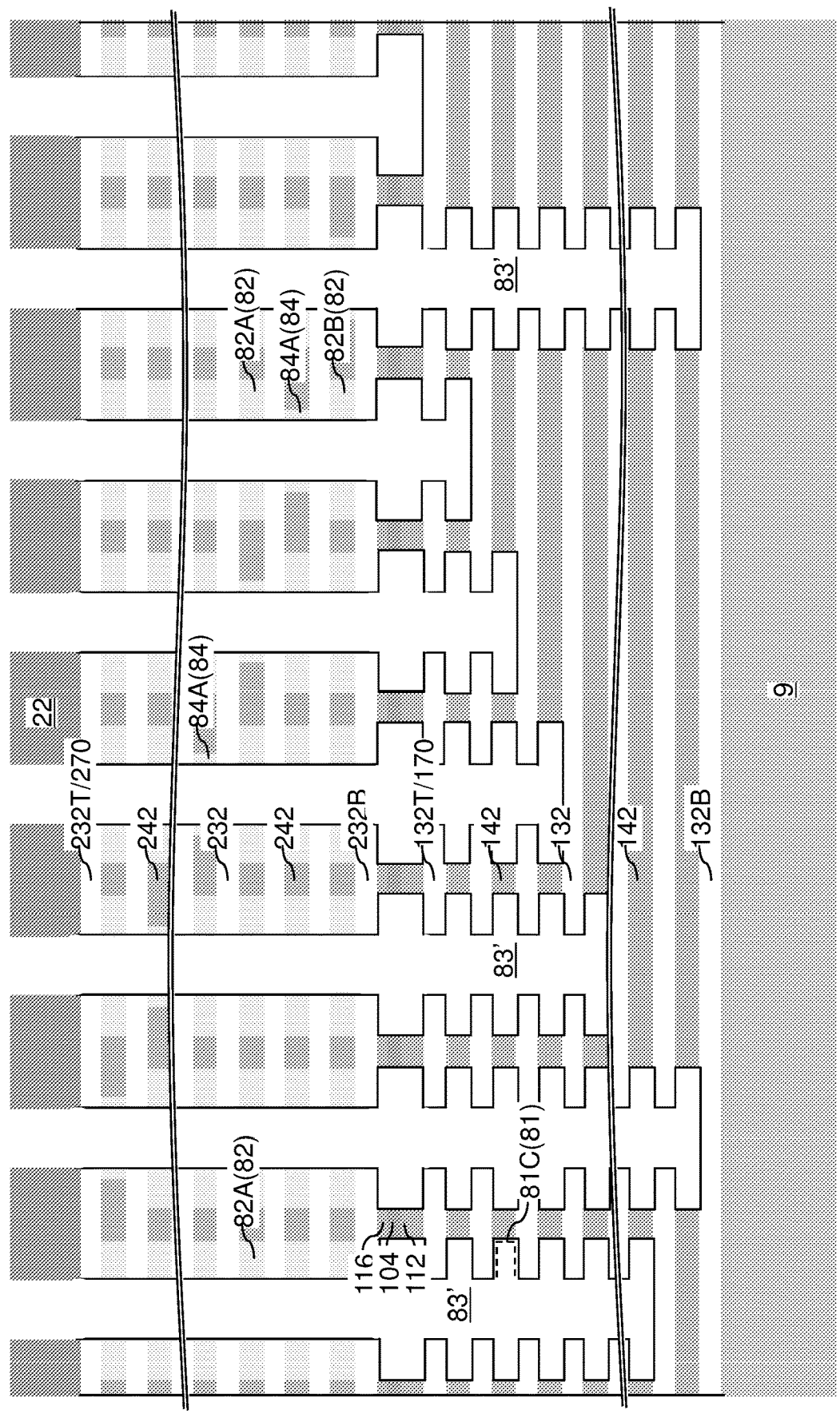
Figure 12K:
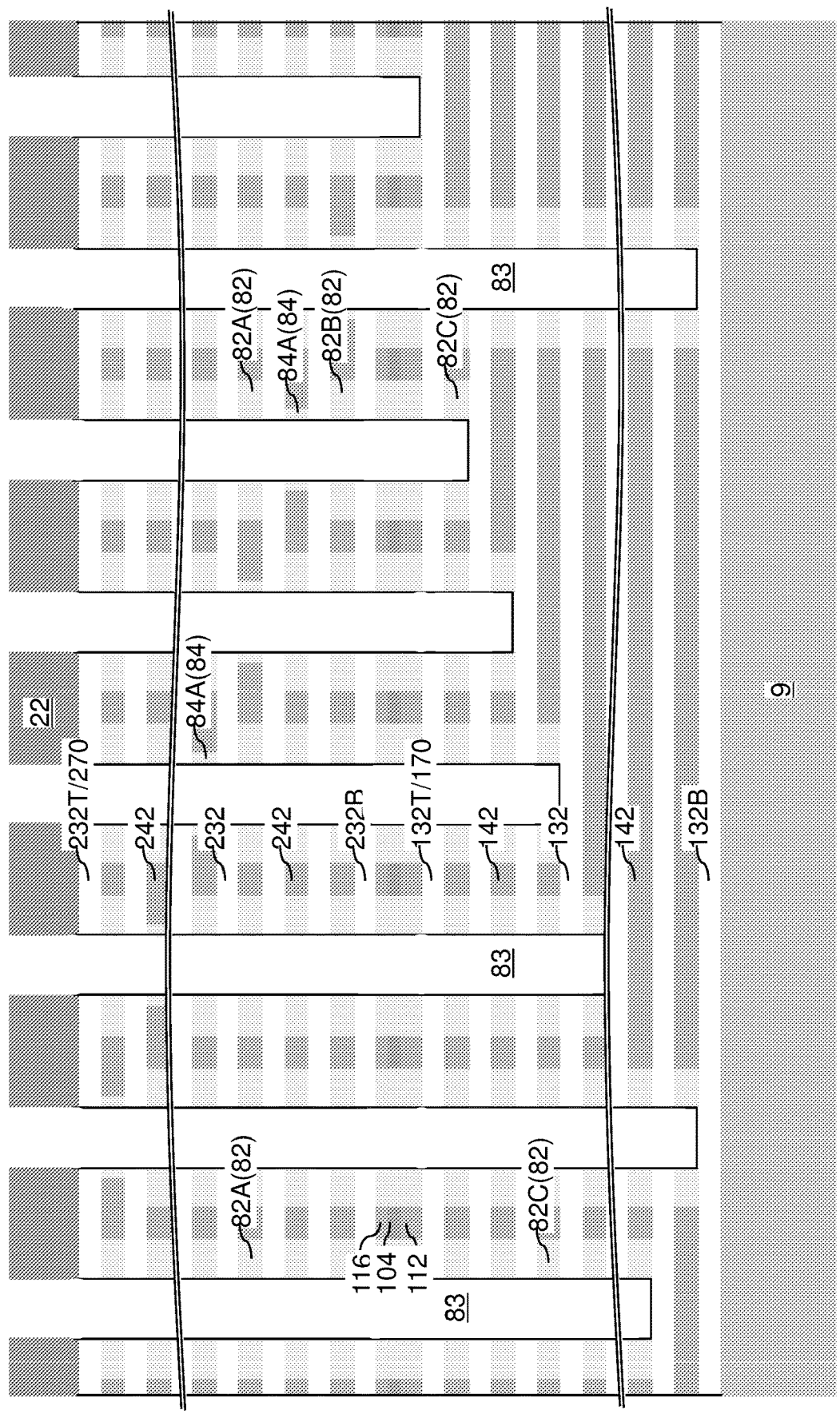
Figure 12L:
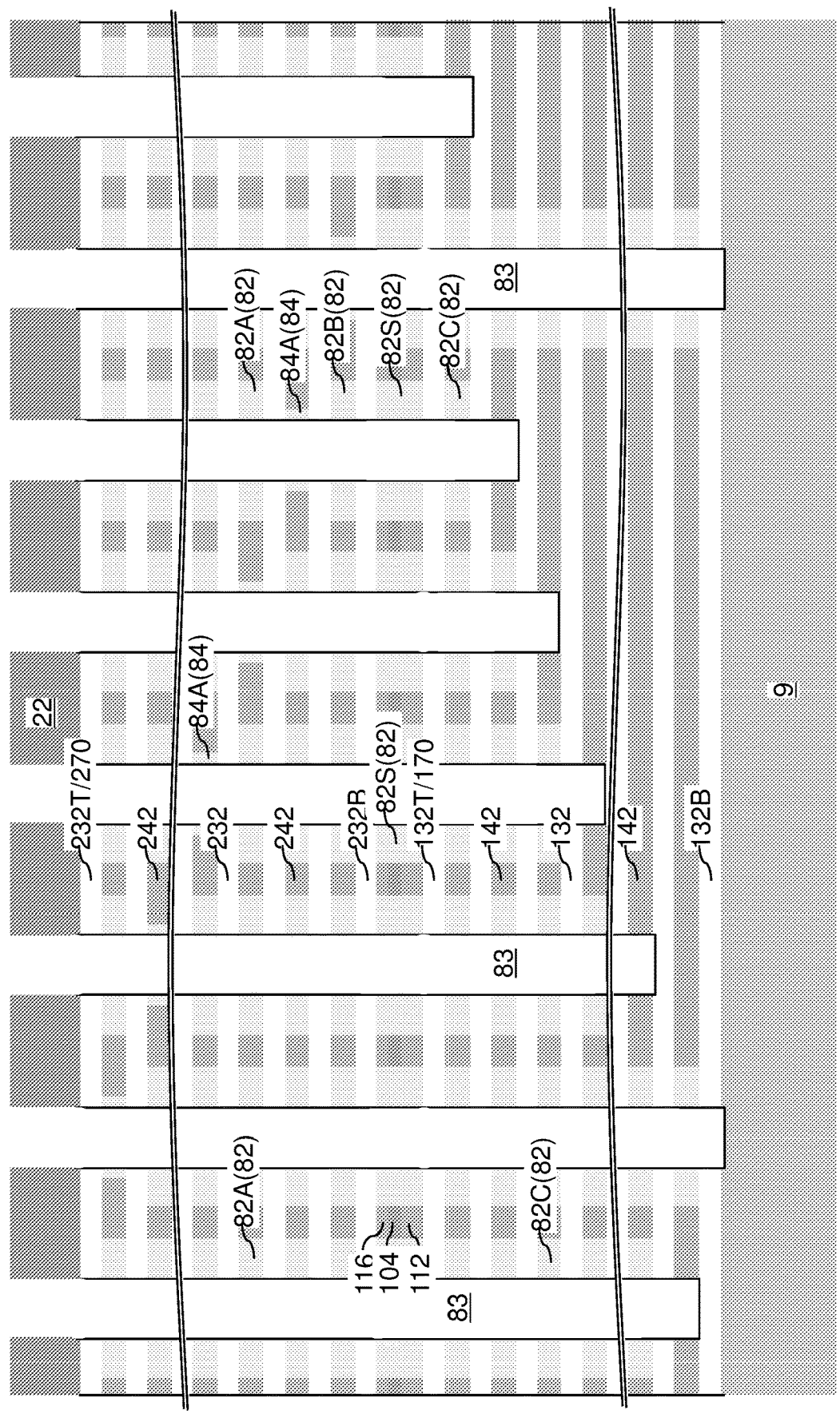
Figure 12M:
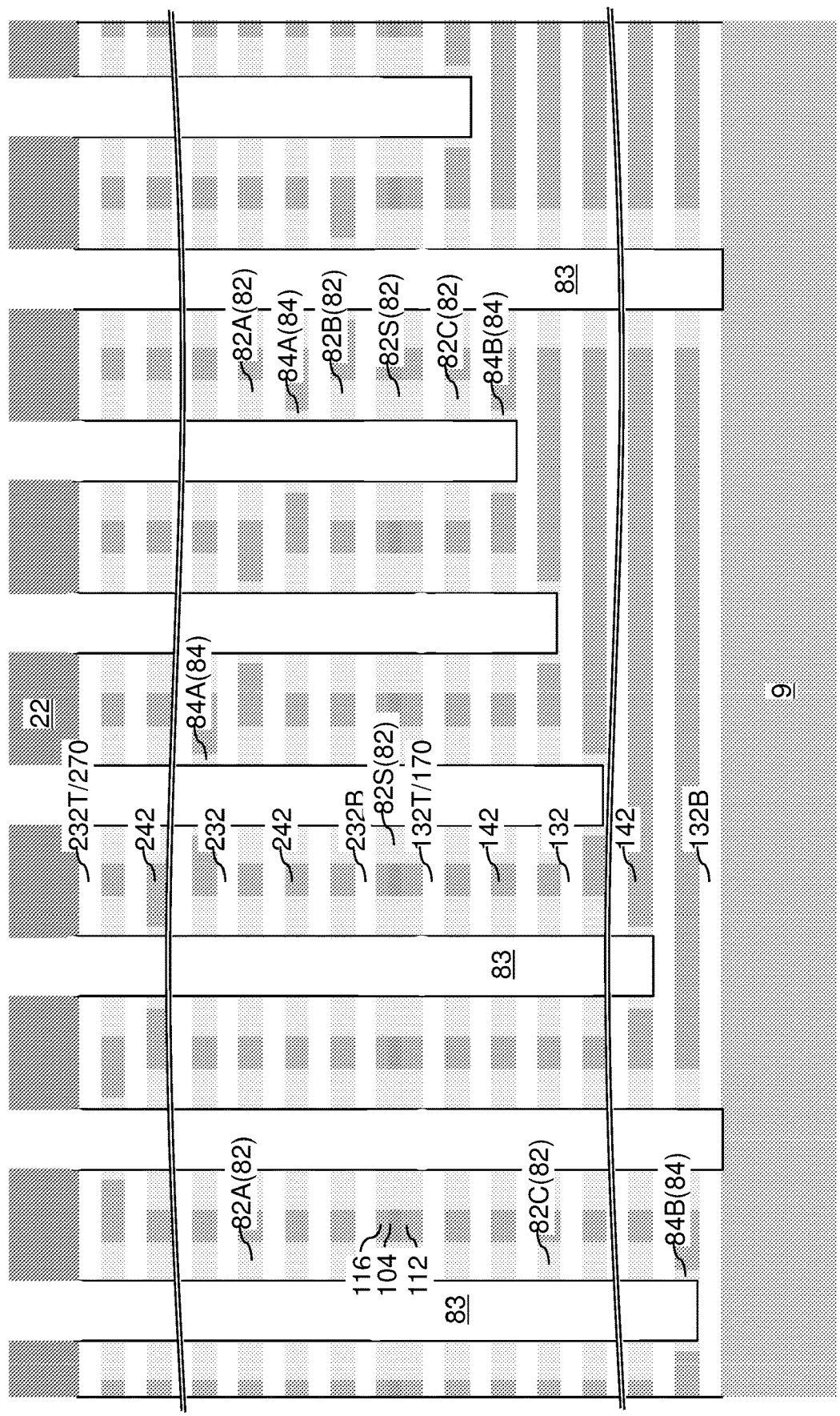
Figure 12N:
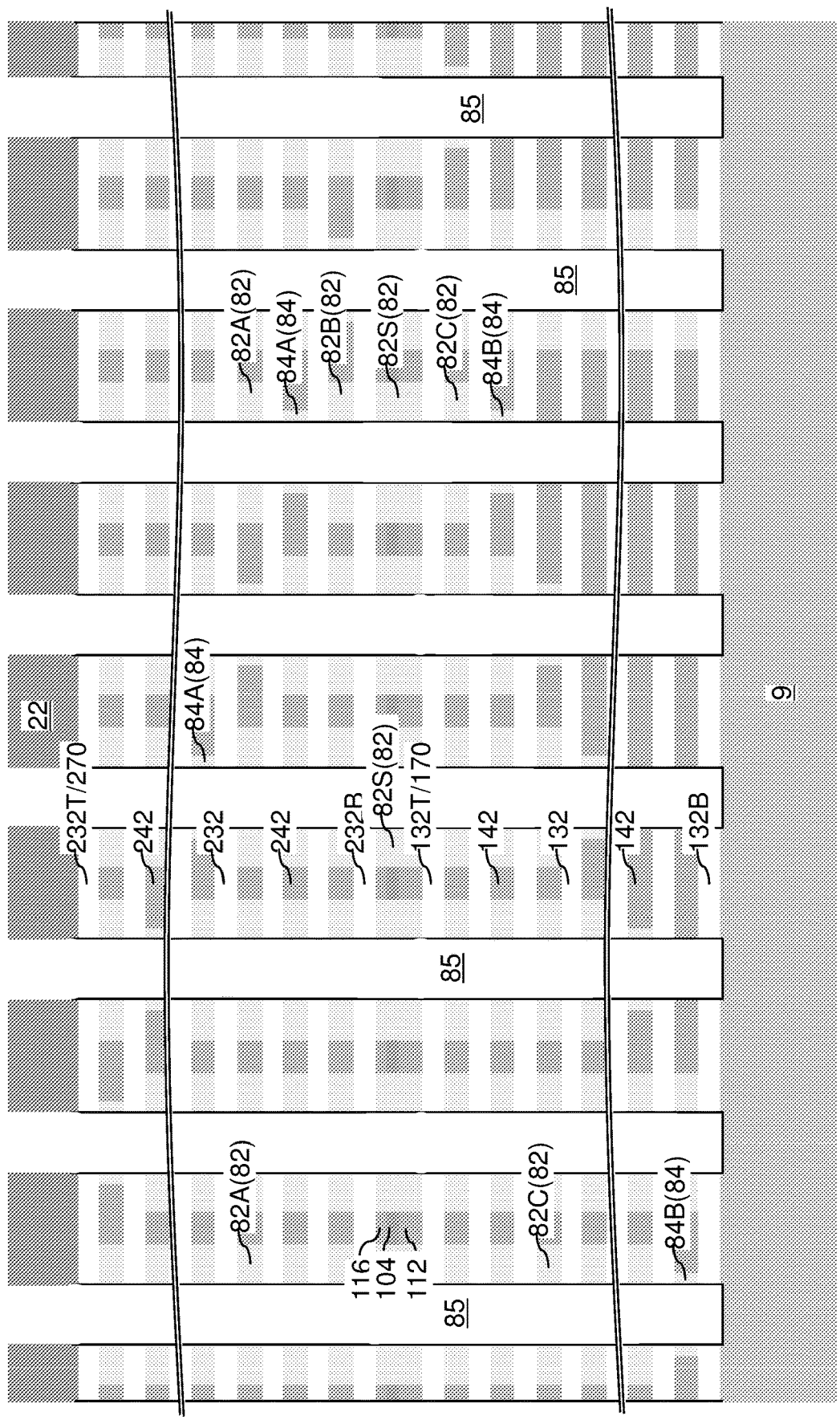
Figure 12O:
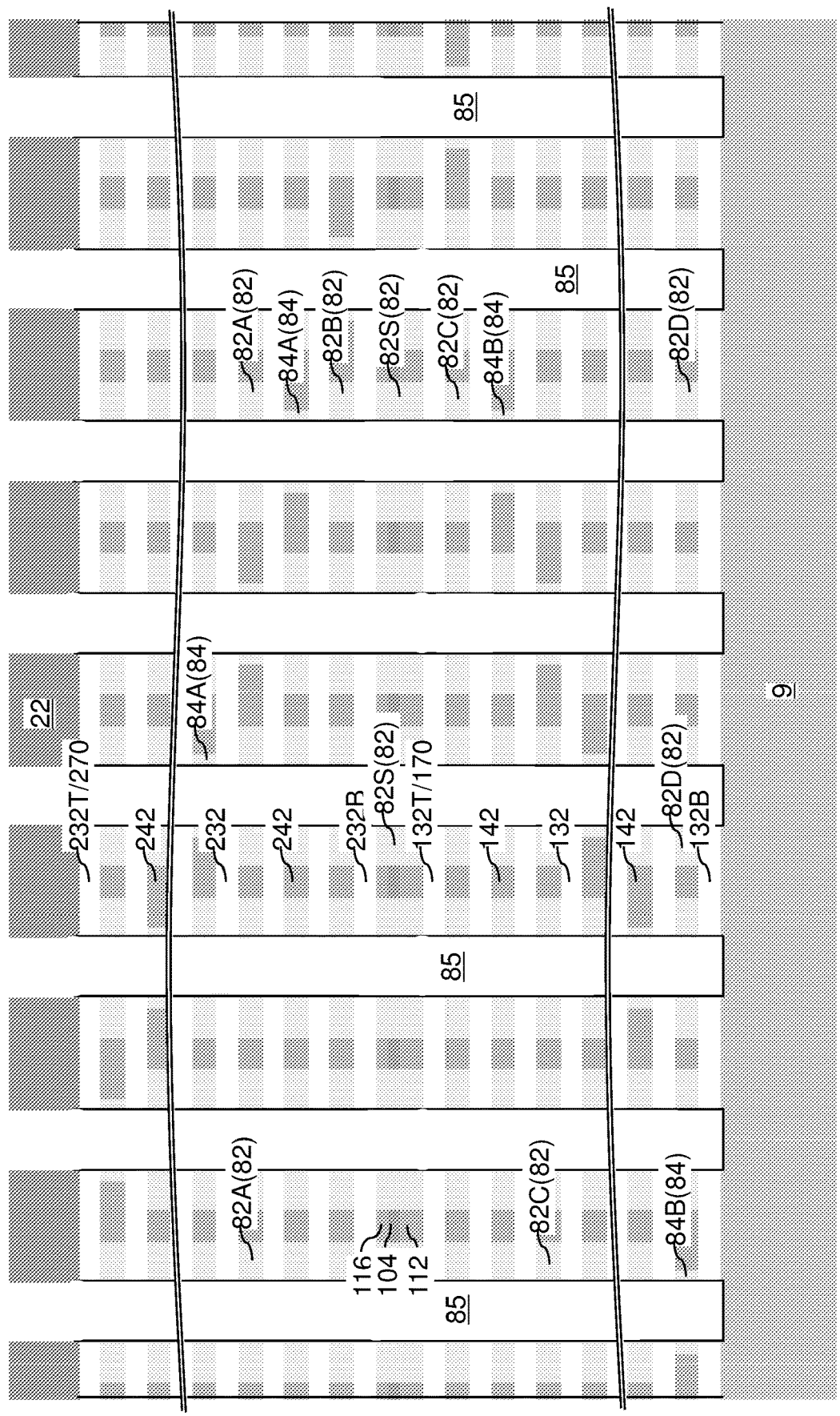
Figure 12P:
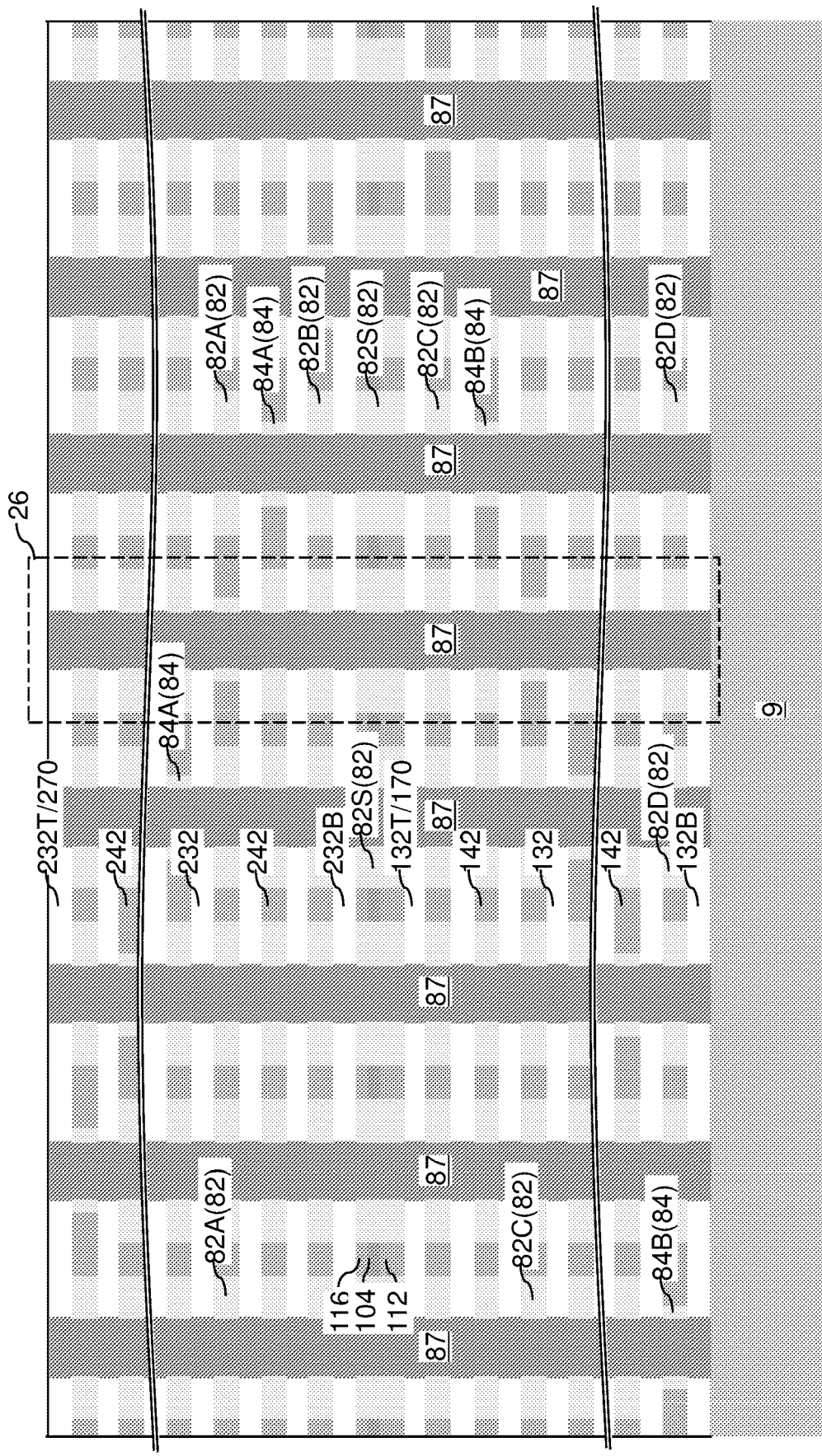
Figure 12Q:
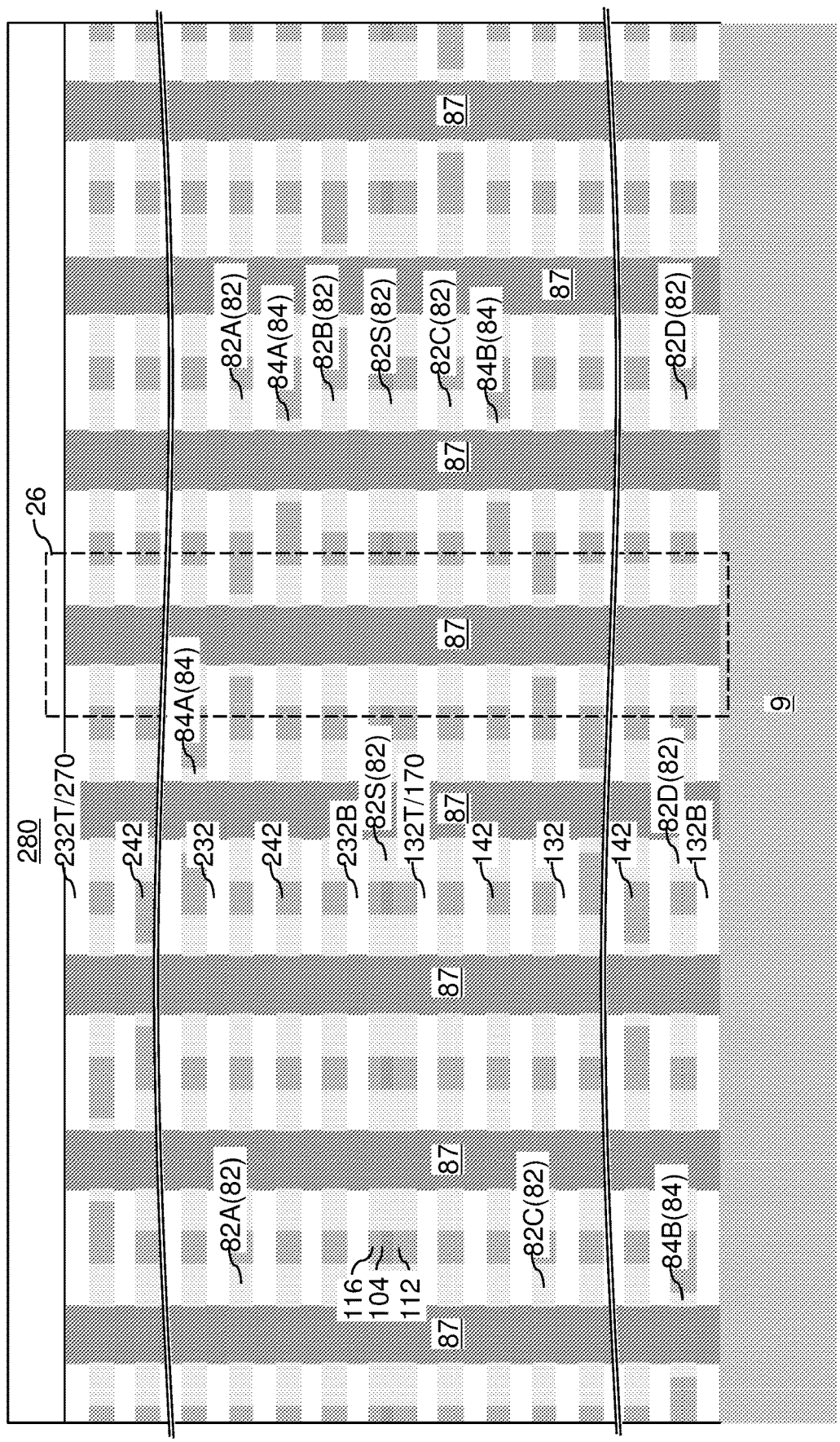

FIGS. 12A-12Q are sequential vertical cross-sectional view of a contact region 200 during formation of in-process layer contact assemblies 26 according to the first embodiment of the present disclosure.

Referring to FIG. 12A, a combination of an etch mask formation process and an anisotropic etch process may be repeated N times with variations in the patterns of openings in the etch masks and with changes in the duration of the anisotropic etch processes. The integer N may be in integer from 2 to 10, such as from 3 to 8. The integer N can be selected such that $2^N$ is the same as, or greater than, the total number of second sacrificial material layers 242.

For each i-th iteration of the combination of an etch mask formation process and an anisotropic etch process for which the integer i runs from 1 to N, an i-th masking layer, such as an i-th photoresist, can be applied over the patterned hard mask layer 22, and can be lithographically patterned to form openings therethrough. The areas of the pattern of the openings in the i-th masking layer includes areas of an i-th subset of the mask openings 21 in the patterned hard mask layer 22. In one embodiment, the i-th subset of the mask openings 21 may comprise about one half of all i-th subset of the mask openings 21.

An i-th anisotropic etch process can be performed to transfer the pattern of the openings in the i-th masking layer through a respective set of F(i) second insulating layers 232 and F(i) second sacrificial material layers 242 within each opening in the i-th masking layer. In one embodiment, each function F(i) may have a different positive integer value for each integer value i. In one embodiment, the value of each function F(i) may be positive integers that are integer powers of 2. In an illustrative example, F(i) may be $2^{(i-1)}$. In another example, F(i) may be $2^{(N-i)}$. In yet another example, the set of all values for F(i), $0<i<N+1$, may include all integer powers of 2 between 1 and $2^{N-1}$ in any order. In still another example, the set of all values of F(i) may include any set of non-overlapping positive integers less than $2^{N-1}$.

In one embodiment, the second insulating layers 232 can include silicon oxide and the second sacrificial material layers 242 can include a sacrificial material, such as silicon nitride. In this case, an anisotropic etch process that etches F(i) pairs of second insulating layers 232 and second sacrificial material layers 242 can include F(i) iterations of a first anisotropic etch step that etches the sacrificial material of the second sacrificial material layers 242 selective to silicon oxide, and a second anisotropic etch step that etches silicon oxide selective to the sacrificial material of the second sacrificial material layers 242. The i-th subset of the in-process contact openings 83 can be vertically extended through a respective contiguous set of F(i) second sacrificial material layers 242 and F(i) second insulating layers 232. The i-th subset of the in-process contact openings 83 can be vertically extended through a respective contiguous set of F(i) second sacrificial material layers 242 and F(i) second insulating layers 232. The i-th masking layer can be subsequently removed, for example, by ashing and/or selective etching.

Generally, the masking patterns for the N masking layers (which may be N patterned photoresist layers) and the set of values for F(i), $0<i<N+1$, may be selected such that via openings, which are herein referred to as in-process contact openings 83, which are formed underneath the mask openings 21 in the patterned photoresist layer have different depths. In one embodiment, the masking patterns for the N masking layers (which may be N patterned photoresist layers) and the set of values for F(i), $0<i<N+1$, may be selected such that each second sacrificial material layer 242 is physically exposed to a respective in-process contact opening 83 within each array of in-process contact openings 83 that underlie a respective array of mask openings 21. Each array of in-process contact openings 83 may be formed between a respective pair of strip regions in the patterned hard mask layer 22 that are free of any mask opening 21 therein. A first subset of the in-process contact opening 83 can have a respective bottom surface located above a bottommost one of the second sacrificial material layers 242. A second subset of the in-process contact openings 83 can have a respective bottom surface on a top surface of a bottommost second insulating layer 232B. Each of the in-process contact openings 83 vertically extends through a respective first subset of layers within the second-tier alternating stack (232, 242).

Referring to FIG. 12B, a second selective isotropic etch process can be performed to isotropically etch the material of the second sacrificial material layers 242 selective to the material of the second insulating layers 232. First annular cavities 81A can be formed at each level of physically exposed second sacrificial material layers 242 around each in-process contact opening 83. The first annular cavities 81A are a first subset of annular cavities 81 that are formed around contact openings, which are formed underneath the mask openings 21 in the hard mask layer 22. In an illustrative example, the second insulating layers 232 may comprise silicon oxide, the second sacrificial material layers 242 may comprise silicon nitride, and the first selective isotropic etch process may comprise a wet etch process employing dilute hydrofluoric acid. The duration of the first selective isotropic etch process may be selected such that the lateral etch distance may be in a range from 5 nm to 100 nm, such as from 10 nm to 50 nm, although lesser and greater lateral etch distances may also be employed. The first annular cavities 81A are formed within annular volumes from which the material of the second sacrificial material layers 242 are removed. Each contiguous combination of an in-process contact opening 83 and at least one first annular cavity 81A constitutes a finned opening 83', which is also referred to as a finned cavity.

Referring to FIG. 12C, a dielectric fill material, such as undoped silicate glass (i.e., silicon oxide), a doped silicate glass, silicon carbide, or a dielectric metal oxide material can be conformally deposited in the first annular cavities 81A. An anisotropic etch process can be performed to remove portions of the dielectric fill material that are deposited outside the volume of the first annular cavities 81A. Each remaining portion of the dielectric fill material that fills a respective first annular cavity 81A is herein referred to as a first annular dielectric spacer 82A, or as a second-tier upper annular dielectric spacer 82A. The first annular dielectric spacers 82A are a first subset of annular dielectric spacers 82 that are formed around via openings underneath the mask openings 21 in the patterned hard mask layer 22. Generally, the first annular dielectric spacers 82A (i.e., the first subset of the annular dielectric spacers 82) can be formed by replacing proximal portions of the second sacrificial material layers 242 with dielectric material portions around the in-process contact openings 83. In one embodiment, inner cylindrical sidewalls of the first annular dielectric spacers 82A may be vertically coincident with (i.e., located within a same vertical plane as) physically exposed sidewalls of the second insulating layers 232 around each in-process contact opening 83.

Referring to FIG. 12D, an anisotropic etch process can be performed to vertically extend each in-process contact opening 83 through a respective underlying pair of a second insulating layer 232 and a second sacrificial material layer 242, or down to a top surface of an upper source-level semiconductor material layer 116 in case an underlying second sacrificial material layer 242 is not present underneath a respective in-process contact opening 83. The patterned hard mask layer 22 is employed as an etch mask during the anisotropic etch process. The anisotropic etch process may have a first etch step that etches the material of the second insulating layers 232 selective to materials of the second sacrificial material layers 242 and the upper source-level semiconductor material layer 116, and a second etch step that etches the material of the second sacrificial material layers 232 selective to materials of the second insulating layers 232 and the upper source-level semiconductor material layer 116.

Each in-process contact opening 83 within the first subset of the in-process contact openings 83 can be vertically extended downward through a respective underlying second insulating layer 232 and a respective underlying spacer material layer (such as a respective underlying second sacrificial material layer 242) within the at least one alternating stack (32, 242) that are located underneath the bottom surface of the respective in-process contact opening 83. A cylindrical sidewall of the underlying second sacrificial material layer 242 can be physically exposed to each vertically extended in-process contact opening 83 within the first subset of the in-process contact openings 83. Each in-process contact opening 83 within the second subset of the in-process contact openings 83 can be vertically extended to the top surface of the upper source-level semiconductor material layer 116. Thus, the top surface of the upper source-level semiconductor material layer 116 can be physically exposed underneath each in-process contact opening 83 within the second subset of the in-process contact openings 83.

Referring to FIG. 12E, upper annular sacrificial spacers 84A can be formed on each second spacer material layer 242 having a physically exposed cylindrical sidewall. In other words, the upper annular sacrificial spacers 84A can be formed on each portion of the second sacrificial material layers 242 that are physically exposed to the in-process contact openings 83. In one embodiment, each of the upper annular sacrificial spacers 84A may be self-aligned to the physically exposed sidewalls of the second sacrificial material layers 242. The upper annular sacrificial spacers 84A are a first subset of annular sacrificial spacers 84 that are formed around the in-process contact openings 83.

In an illustrative example, the second sacrificial material layers 242 may be composed of a silicon nitride material, and the upper annular sacrificial spacers 84A may be formed by oxidation of physically exposed surface portions of the second sacrificial material layers 242. The oxidation process may comprise a thermal oxidation process or a plasma oxidation process. In this case, the upper annular sacrificial spacers 84A may comprise silicon oxide and/or silicon oxynitride. In one embodiment, the upper annular sacrificial spacers 84A may be formed by oxidation of tubular surface portions of physically exposed spacer material layers, which may be embodied as the second sacrificial material layers 242.

In an alternative example, the second sacrificial material layers 242 may be isotropically recessed relative to the second insulating layers 232 to form annular recesses. A dielectric fill material may be conformally deposited in the annular recesses, and an anisotropic etch process may be performed to remove portions of the dielectric fill material that are deposited outside the volumes of the annular recesses. Portions of the dielectric fill material that fill the annular recesses constitute the upper annular sacrificial spacers 84A.

The lateral thickness of each upper annular sacrificial spacer 84A may be less than the lateral thickness of each first annular dielectric spacer 82A. As used herein, a lateral thickness of an annular element refers to a lateral distance between an inner sidewall and an outer sidewall. In one embodiment, the lateral thickness of each upper annular sacrificial spacer 84A may be in range from 1 nm to 20 nm, such as from 2 nm to 10 nm, although lesser and greater lateral thicknesses may also be employed.

Referring to FIG. 12F, the in-process contact openings 83 may be vertically extended further downward after formation of the upper annular sacrificial spacers 84A by performing an additional anisotropic etch process. The etch chemistry of the additional anisotropic etch process may be selected such that the additional anisotropic etch process etches through the second insulating layers 232 and the second sacrificial material layers 242 underneath the in-process contact openings 83 selective to the semiconductor material of the upper source-level semiconductor material layer 116. In one embodiment, a top surface of the upper source-level semiconductor layer 116 can be physically exposed underneath each in-process contact opening 83 after the additional anisotropic etch process.

Referring to FIG. 12G, a second selective isotropic etch process can be performed to isotropically etch the material of the second sacrificial material layers 242 selective to the material of the second insulating layers 232. Second annular cavities can be formed at each level of physically exposed second sacrificial material layers 242 around each in-process contact opening 83. The second annular cavities are a second subset of annular cavities that are formed around the in-process contact openings 83, which are formed underneath the mask openings 21 in the hard mask layer 22. In an illustrative example, the second insulating layers 232 may comprise silicon oxide, the second sacrificial material layers 242 may comprise silicon nitride, and the second selective isotropic etch process may comprise a wet etch process employing dilute hydrofluoric acid. The duration of the second selective isotropic etch process may be selected such that the lateral etch distance may be in a range from 5 nm to 100 nm, such as from 10 nm to 50 nm, although lesser and greater lateral etch distances may also be employed. The second annular cavities are formed within annular volumes from which the material of the second sacrificial material layers 242 are removed.

A dielectric fill material such as undoped silicate glass, a doped silicate glass, silicon carbide, or a dielectric metal oxide material can be conformally deposited in the second annular cavities. An anisotropic etch process can be performed to remove portions of the dielectric fill material that are deposited outside the volume of the second annular cavities. Each remaining portion of the dielectric fill material that fills a respective second annular cavity is herein referred to as a second annular dielectric spacer 82B, or a second-tier lower annular dielectric spacer 82B. The second annular dielectric spacers 82B are a second subset of annular dielectric spacers 82 that are formed around via openings underneath the mask openings 21 in the patterned hard mask layer 22. Generally, the second annular dielectric spacers 82B (i.e., the second subset of the annular dielectric spacers 82) can be formed by replacing proximal portions of the second sacrificial material layers 242 with dielectric material portions around the in-process contact openings 83 after formation of the upper annular sacrificial spacers 84A. In one embodiment, inner cylindrical sidewalls of the second annular dielectric spacers 82B may be vertically coincident with (i.e., located within a same vertical plane as) physically exposed sidewalls of the second insulating layers 232 around each in-process contact opening 83. In one embodiment, the second annular dielectric spacers 82B may comprise the same material as the first annular dielectric spacers 82A. In one embodiment, the first annular dielectric spacers 82A and the second annular dielectric spacers 82B may comprise a dielectric material such as undoped silicate glass, a doped silicate glass, a dielectric metal oxide material, or silicon carbide.

Referring to FIG. 12H, an anisotropic etch process can be performed to remove portions of the in-process source-level material layers 110' that underlie the in-process contact openings 83. The in-process contact openings 83 can be vertically extended through the in-process source-level material layers 110'.

Referring to FIG. 12I, a combination of an etch mask formation process and an anisotropic etch process may be repeated M times with variations in the patterns of openings in the etch masks and with changes in the duration of the anisotropic etch processes. The integer M may be in integer from 2 to 10, such as from 3 to 8. The integer M can be selected such that $2^M$ is the same as, or greater than, the total number of first sacrificial material layers 142.

For each j-th iteration of the combination of an etch mask formation process and an anisotropic etch process for which the integer j runs from 1 to M, a j-th masking layer, such as a j-th photoresist, can be applied over the patterned hard mask layer 22, and can be lithographically patterned to form openings therethrough. The areas of the pattern of the openings in the j-th masking layer includes areas of a j-th subset of the mask openings 21 in the patterned hard mask layer 22. In one embodiment, the j-th subset of the mask openings 21 may comprise about one half of all j-th subset of the mask openings 21.

A j-th anisotropic etch process can be performed to transfer the pattern of the openings in the j-th masking layer through a respective set of G(j) first insulating layers 132 and G(j) first sacrificial material layers 142 within each opening in the j-th masking layer. In one embodiment, each function G(j) may have a different positive integer value for each integer value j. In one embodiment, the value of each function G(j) may be positive integers that are integer powers of 2. In an illustrative example, G(j) may be $2^{(j-1)}$. In another example, G(j) may be $2^{(N-j)}$. In yet another example, the set of all values for G(j), $0 \leq j < M+1$, may include all integer powers of 2 between 1 and $2^{M-1}$ in any order. In still another example, the set of all values of G(j) may include any set of non-overlapping positive integers less than $2^{M-1}$.

In one embodiment, the first insulating layers 132 can include silicon oxide and the first sacrificial material layers 142 can include a sacrificial material such as silicon nitride. In this case, an anisotropic etch process that etches G(j) pairs of first insulating layers 132 and first sacrificial material layers 142 can include G(j) iterations of a first anisotropic etch step that etches the sacrificial material of the first sacrificial material layers 142 selective to silicon oxide, and a first anisotropic etch step that etches silicon oxide selective to the sacrificial material of the first sacrificial material layers 142. The j-th subset of the in-process contact openings 83 can be vertically extended through a respective contiguous set of G(j) first sacrificial material layers 142 and G(j) first insulating layers 132. The j-th subset of the in-process contact openings 83 can be vertically extended through a respective contiguous set of G(j) first sacrificial material layers 142 and G(j) first insulating layers 132. The j-th masking layer can be subsequently removed, for example, by ashing and/or selective etching.

Generally, the masking patterns for the M masking layers (which may be M patterned photoresist layers) and the set of values for G(j), $0 \leq j < M+1$, may be selected such that via openings, which are herein referred to as in-process contact openings 83, which are formed underneath the mask openings 21 in the patterned photoresist layer have different depths. In one embodiment, the masking patterns for the M masking layers (which may be M patterned photoresist layers) and the set of values for G(j), $0 \leq j < M+1$, may be selected such that each first sacrificial material layer 142 is physically exposed to a respective in-process contact opening 83 within each array of in-process contact openings 83 that underlie a respective array of mask openings 21. Each array of in-process contact openings 83 may be formed between a respective pair of strip regions in the patterned hard mask layer 22 that are free of any mask opening 21 therein. A subset of the in-process contact opening 83 can have a respective bottom surface located above a bottommost one of the first sacrificial material layers 142. Another subset of the in-process contact openings 83 can have a respective bottom surface on a top surface of a bottommost first insulating layer 132B. Each of the in-process contact openings 83 vertically extends through a respective subset of layers within the first-tier alternating stack (132, 142).

Referring to FIG. 12J, a third selective isotropic etch process can be performed to isotropically etch the material of the first sacrificial material layers 142 selective to the material of the first insulating layers 132. Third annular cavities 81C can be formed at each level of physically exposed first sacrificial material layers 142 around each in-process contact opening 83. The third annular cavities 81C are a third subset of annular cavities 81 that are formed around contact openings, which are formed underneath the mask openings 21 in the hard mask layer 22. In an illustrative example, the first insulating layers 132 may comprise silicon oxide, the first sacrificial material layers 142 may comprise silicon nitride, and the third selective isotropic etch process may comprise a wet etch process employing dilute hydrofluoric acid. The duration of the third selective isotropic etch process may be selected such that the lateral etch distance may be in a range from 5 nm to 100 nm, such as from 10 nm to 50 nm, although lesser and greater lateral etch distances may also be employed. The third annular cavities 81C are formed within annular volumes from which the material of the first sacrificial material layers 142 are removed. Each contiguous combination of an in-process contact opening 83 and at least one third annular cavity 81C constitutes a finned opening 83', which is also referred to as a finned cavity.

Referring to FIG. 12K, a dielectric fill material, such as undoped silicate glass, a doped silicate glass, silicon carbide, or a dielectric metal oxide material can be conformally deposited in the third annular cavities 81C. An anisotropic etch process can be performed to remove portions of the dielectric fill material that are deposited outside the volume of the third annular cavities 81C. Each remaining portion of the dielectric fill material that fills a respective third annular cavity 81C is herein referred to as a third annular dielectric spacer 82C, or as a first-tier upper annular dielectric spacer 82C. The third annular dielectric spacers 82C are a third subset of annular dielectric spacers 82 that are formed around via openings underneath the mask openings 21 in the patterned hard mask layer 22. Generally, the third annular dielectric spacers 82C (i.e., the third subset of the annular dielectric spacers 82) can be formed by replacing proximal portions of the first sacrificial material layers 142 with dielectric material portions around the in-process contact openings 83. In one embodiment, inner cylindrical sidewalls of the third annular dielectric spacers 82C may be vertically coincident with (i.e., located within a same vertical plane as) physically exposed sidewalls of the first insulating layers 132 around each in-process contact opening 83.

Referring to FIG. 12L, an anisotropic etch process can be performed to vertically extend each in-process contact opening 83 through a respective underlying pair of a first insulating layer 132 and a first sacrificial material layer 142, or down to a top surface of the substrate material layer 9 in case an underlying first sacrificial material layer 142 is not present underneath a respective in-process contact opening 83. The patterned hard mask layer 22 is employed as an etch mask during the anisotropic etch process. The anisotropic etch process may have a first etch step that etches the material of the first insulating layers 132 selective to materials of the first sacrificial material layers 142 and the substrate material layer 9, and a first etch step that etches the material of the first sacrificial material layers 132 selective to materials of the first insulating layers 132 and the substrate material layer 9.

Each in-process contact opening 83 within a subset of the in-process contact openings 83 can be vertically extended downward through a respective underlying first insulating layer 132 and a respective underlying spacer material layer (such as a respective underlying first sacrificial material layer 142) within the at least one alternating stack (32, 142) that are located underneath the bottom surface of the respective in-process contact opening 83. A cylindrical sidewall of the underlying first sacrificial material layer 142 can be physically exposed to each vertically extended in-process contact opening 83 within the first subset of the in-process contact openings 83.

Referring to FIG. 12M, lower annular sacrificial spacers 84B can be formed on each first spacer material layer 142 having a physically exposed cylindrical sidewall. In other words, the lower annular sacrificial spacers 84B can be formed on each portion of the first sacrificial material layers 142 that are physically exposed to the in-process contact openings 83. In one embodiment, each of the lower annular sacrificial spacers 84B may be self-aligned to the physically exposed sidewalls of the first sacrificial material layers 142. The lower annular sacrificial spacers 84B are a second subset of annular sacrificial spacers 84 that are formed around the in-process contact openings 83.

In an illustrative example, the first sacrificial material layers 142 may be composed of a silicon nitride material, and the lower annular sacrificial spacers 84B may be formed by oxidation of physically exposed surface portions of the first sacrificial material layers 142. The oxidation process may comprise a thermal oxidation process or a plasma oxidation process. In this case, the lower annular sacrificial spacers 84B may comprise silicon oxide and/or silicon oxynitride. In one embodiment, the lower annular sacrificial spacers 84B may be formed by oxidation of tubular surface portions of physically exposed spacer material layers, which may be embodied as the first sacrificial material layers 142.

In an alternative example, the first sacrificial material layers 142 may be isotropically recessed relative to the first insulating layers 132 to form annular recesses. A dielectric fill material may be conformally deposited in the annular recesses, and an anisotropic etch process may be performed to remove portions of the dielectric fill material that are deposited outside the volumes of the annular recesses. Portions of the dielectric fill material that fill the annular recesses constitute the lower annular sacrificial spacers 84B.

The lateral thickness of each lower annular sacrificial spacer 84B may be less than the lateral thickness of each of the first annular dielectric spacers 82A, the second annular dielectric spacers 82B, and the third annular dielectric spacers 82C. In one embodiment, the lateral thickness of each lower annular sacrificial spacer 84B may be in range from 1 nm to 20 nm, such as from 2 nm to 10 nm, although lesser and greater lateral thicknesses may also be employed.

Referring to FIG. 12N, the in-process contact openings 83 may be vertically extended further downward after formation of the lower annular sacrificial spacers 84B by performing an additional anisotropic etch process. The etch chemistry of the additional anisotropic etch process may be selected such that the additional anisotropic etch process etches through the first insulating layers 132 and the first sacrificial material layers 142 underneath the in-process contact openings 83 selective to the material of the substrate material layer 9. In one embodiment, a top surface of the substrate material layer 9 can be physically exposed underneath each in-process contact opening 83 after the additional anisotropic etch process. The vertical extent of the in-process contact openings 83 reaches a maximum upon vertically extending the in-process contact openings 83 to a top surface of the substrate material layer 9. As such, the in-process contact openings 83 are hereafter referred to as contact openings 85.

Referring to FIG. 12O, a fourth selective isotropic etch process can be performed to isotropically etch the material of the first sacrificial material layers 142 selective to the material of the first insulating layers 132. Fourth annular cavities can be formed at each level of physically exposed first sacrificial material layers 142 around each contact opening 85. The fourth annular cavities are a fourth subset of annular cavities that are formed around the contact openings 85, which are formed underneath the mask openings 21 in the hard mask layer 22. In an illustrative example, the first insulating layers 132 may comprise silicon oxide, the first sacrificial material layers 142 may comprise silicon nitride, and the fourth selective isotropic etch process may comprise a wet etch process employing dilute hydrofluoric acid. The duration of the fourth selective isotropic etch process may be selected such that the lateral etch distance may be in a range from 5 nm to 100 nm, such as from 10 nm to 50 nm, although lesser and greater lateral etch distances may also be employed. The fourth annular cavities are formed within annular volumes from which the material of the first sacrificial material layers 142 are removed.

A dielectric fill material, such as undoped silicate glass, a doped silicate glass, silicon carbide, or a dielectric metal oxide material can be conformally deposited in the fourth annular cavities. An anisotropic etch process can be performed to remove portions of the dielectric fill material that are deposited outside the volume of the fourth annular cavities. Each remaining portion of the dielectric fill material that fills a respective fourth annular cavity is herein referred to as a fourth annular dielectric spacer 82D, or a first-tier lower annular dielectric spacer 82D. The fourth annular dielectric spacer 82D are a fourth subset of annular dielectric spacers 82 that are formed around via openings underneath the mask openings 21 in the patterned hard mask layer 22. Generally, the fourth annular dielectric spacers 82D (i.e., the fourth subset of the annular dielectric spacers 82) can be formed by replacing proximal portions of the first sacrificial material layers 142 with dielectric material portions around the contact openings 85 after formation of the lower annular sacrificial spacers 84B. In one embodiment, inner cylindrical sidewalls of the fourth annular dielectric spacers 82D may be vertically coincident with (i.e., located within a same vertical plane as) physically exposed sidewalls of the first insulating layers 132 around each contact opening 85. In one embodiment, the fourth annular dielectric spacers 82D may comprise the same material as the first annular dielectric spacers 82A, the second annular dielectric spacers 82B, and the third annular dielectric spacers 82C. In one embodiment, the first annular dielectric spacers 82A, the second annular dielectric spacers 82B, the third annular dielectric spacers 82C, and the fourth annular dielectric spacers 82D may comprise a dielectric material, such as undoped silicate glass, a doped silicate glass, or a dielectric metal oxide material.

Generally, a combination of a contact opening 85 and a vertical stack of annular dielectric spacers 82 and at least one annular sacrificial spacer 84 can be formed through the first-tier alternating stack (132, 142), the in-process source-level material layers 110', and the second-tier alternating stack (232, 242) underneath each mask opening 21 in the patterned hard mask layer 22. A first subset of the combinations comprises combinations of a respective contact opening 85, a respective vertical stack of annular dielectric spacers 82, an upper annular sacrificial spacer 84A, and a lower annular sacrificial spacer 84B. Such combinations are subsequently employed contact via structures electrically connected to a pair of a first electrically conductive layer and a second electrically conductive layer. A second subset of the combinations comprises combinations of a respective contact opening 85, a respective vertical stack of annular dielectric spacers 82, and one of an upper annular sacrificial spacer 84A and a lower annular sacrificial spacer 84B. In other words, only a single annular sacrificial spacer 84 is formed around a contact opening 85 within the second subset of the combinations. In this case, the single annular sacrificial spacer 84 may be formed at a drain select level. The drain select level may be the level of the topmost second sacrificial material layer 242 and/or adjacent second sacrificial material layers 242, or may be the level of the bottommost first sacrificial material layer 142 and/or adjacent first sacrificial material layers 142.

Optionally, etch stop plates (not expressly shown) may be formed at the bottom of each contact opening 85. In one embodiment, the substrate material layer 9 may comprise a semiconductor material, such as silicon, and the etch stop plates may be formed by oxidation of physically exposed surface portions of the substrate material layer 9.

Referring to FIG. 12P, a sacrificial fill material can be deposited into the contact openings 85. The sacrificial fill material comprises a material that can be subsequently removed selective to materials of the annular dielectric spacers 82, the annular sacrificial spacers 84, and the insulating layers (132, 232), and the semiconductor oxide plates 120. For example, the sacrificial fill material may comprise a semiconductor material (such as amorphous silicon, polysilicon, or a silicon-germanium alloy), a carbon-based material (such as amorphous carbon or diamond-like carbon), organosilicate glass, or a polymer material, etc. Excess portions of the sacrificial fill material may be removed from above the horizontal plane including the top surface of the topmost second insulating layer 232T. The patterned hard mask layer 22 may be removed selective to the materials of the topmost second insulating layer 232T and the sacrificial fill material, for example, employing an etch process such as a wet etch process. Each remaining portion of the sacrificial fill material that fills a respective contact opening 85 constitutes a sacrificial contact opening fill structure 87. Each of the sacrificial contact opening fill structure 87 may have a respective cylindrical shape. In one embodiment, top surfaces of the sacrificial contact opening fill structures 87 may be formed within the horizontal plane including the top surface of the topmost second insulating layer 232T. Each contiguous combination of a sacrificial contact opening fill structure 87, a vertical stack of annular dielectric spacers 82, and at least one annular sacrificial spacer 84 is herein referred to as an in-process layer contact assembly 26. Arrays of in-process layer contact assemblies 26 are formed through the first-tier alternating stack (132, 142), the in-process source-level material layers 110', and the second-tier alternating stack (232, 242).

Figure 13A:
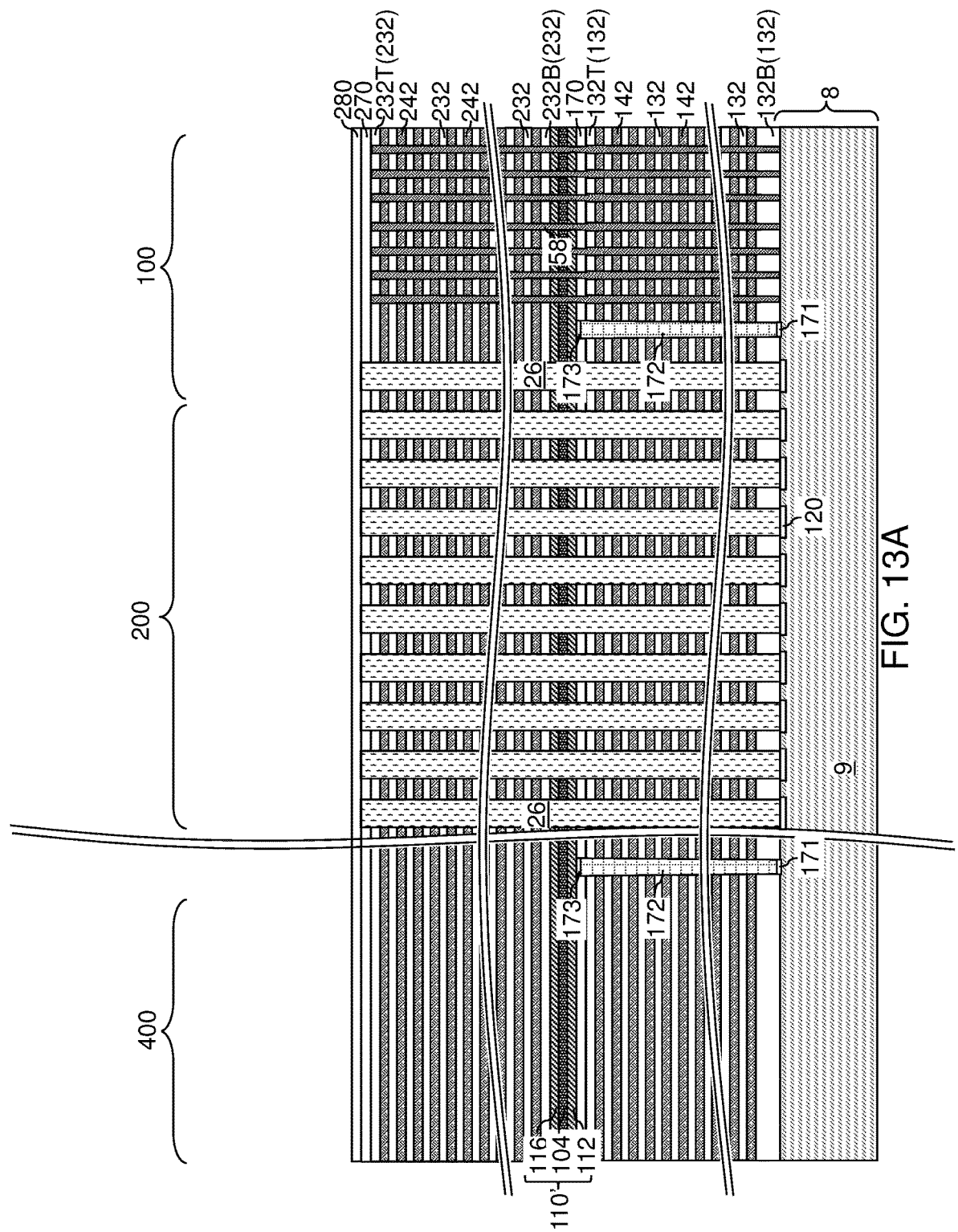
FIG. 13A is a vertical cross-sectional view of the first exemplary structure after formation of a contact-level dielectric layer according to the first embodiment of the present disclosure.
Figure 13B:
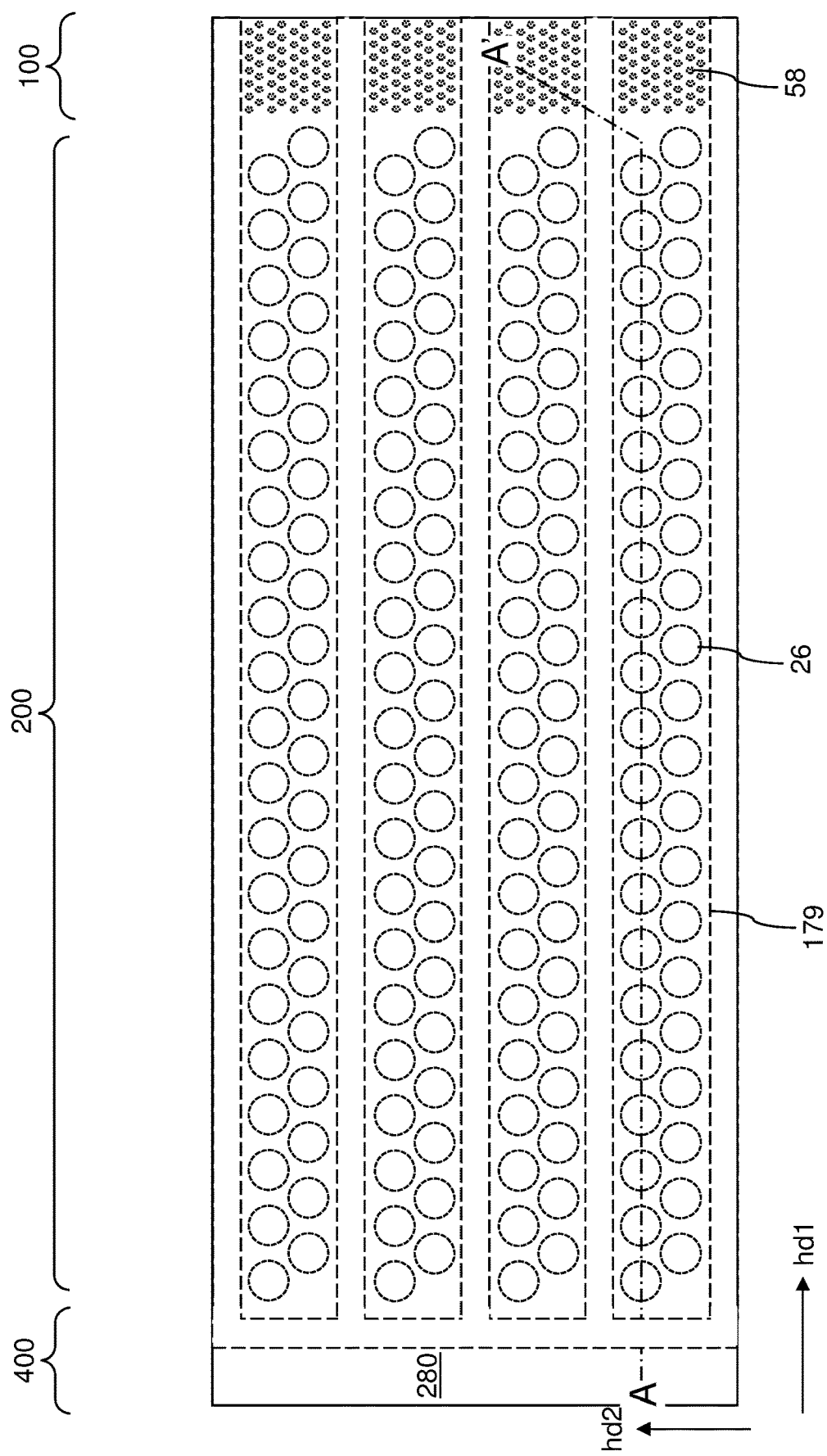
FIG. 13B is a top-down view of the first exemplary structure of FIG. 13A.

Referring to FIGS. 12Q, 13A, and 13B, a contact-level dielectric layer 280 may be formed above the alternating stack (32, 242) and the in-process layer contact assemblies 26 by conformal or non-conformal deposition of a dielectric material. The contact-level dielectric layer 280 comprises a dielectric material such as undoped silicate glass or a doped silicate glass. The thickness of the contact-level dielectric layer 280 may be in a range from 50 nm to 600 nm, such as from 100 nm to 300 nm, although lesser and greater thicknesses may also be employed.

Figure 14A:
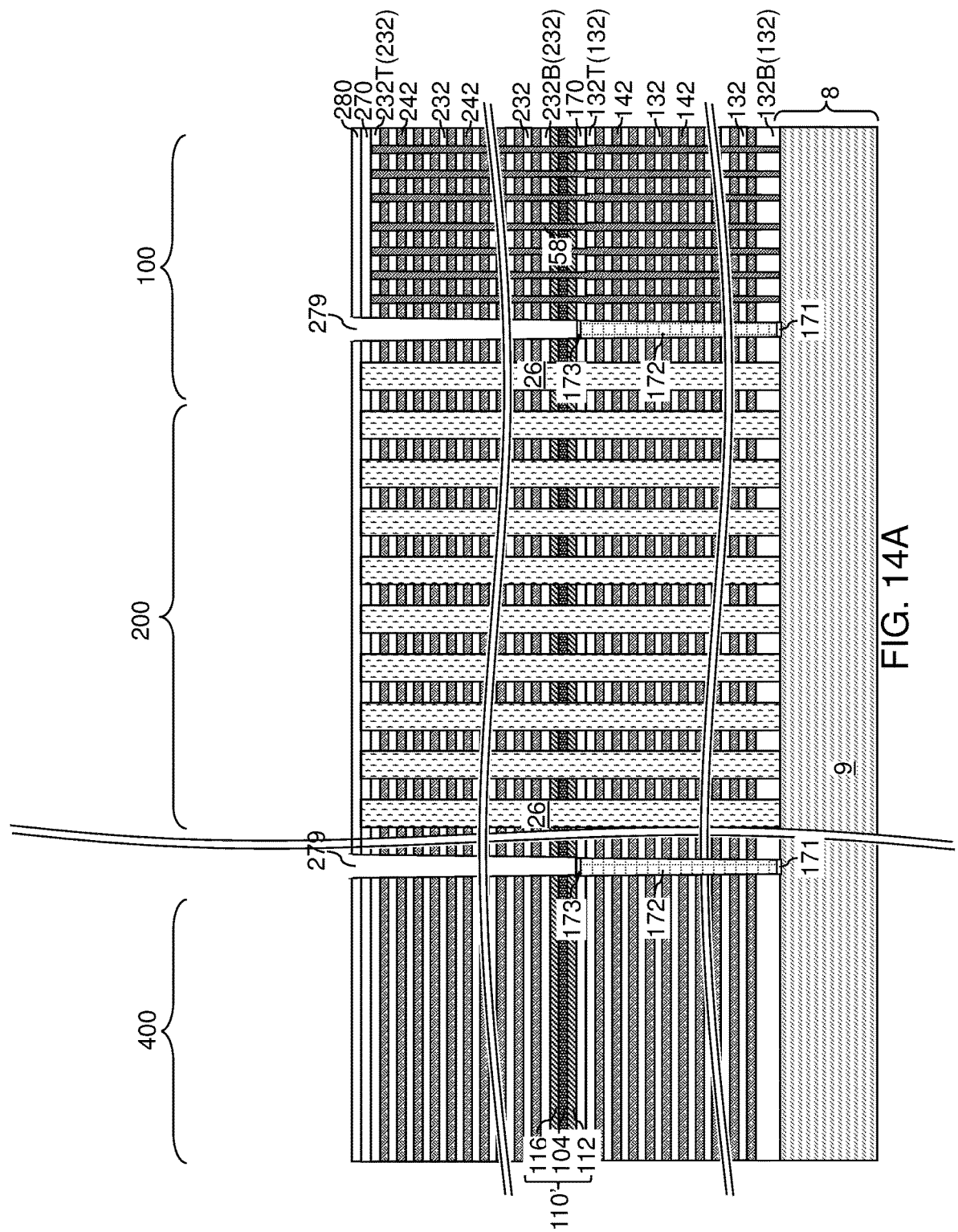
FIG. 14A is a vertical cross-sectional view of the first exemplary structure after formation of second-tier backside trenches according to the first embodiment of the present disclosure.
Figure 14B:
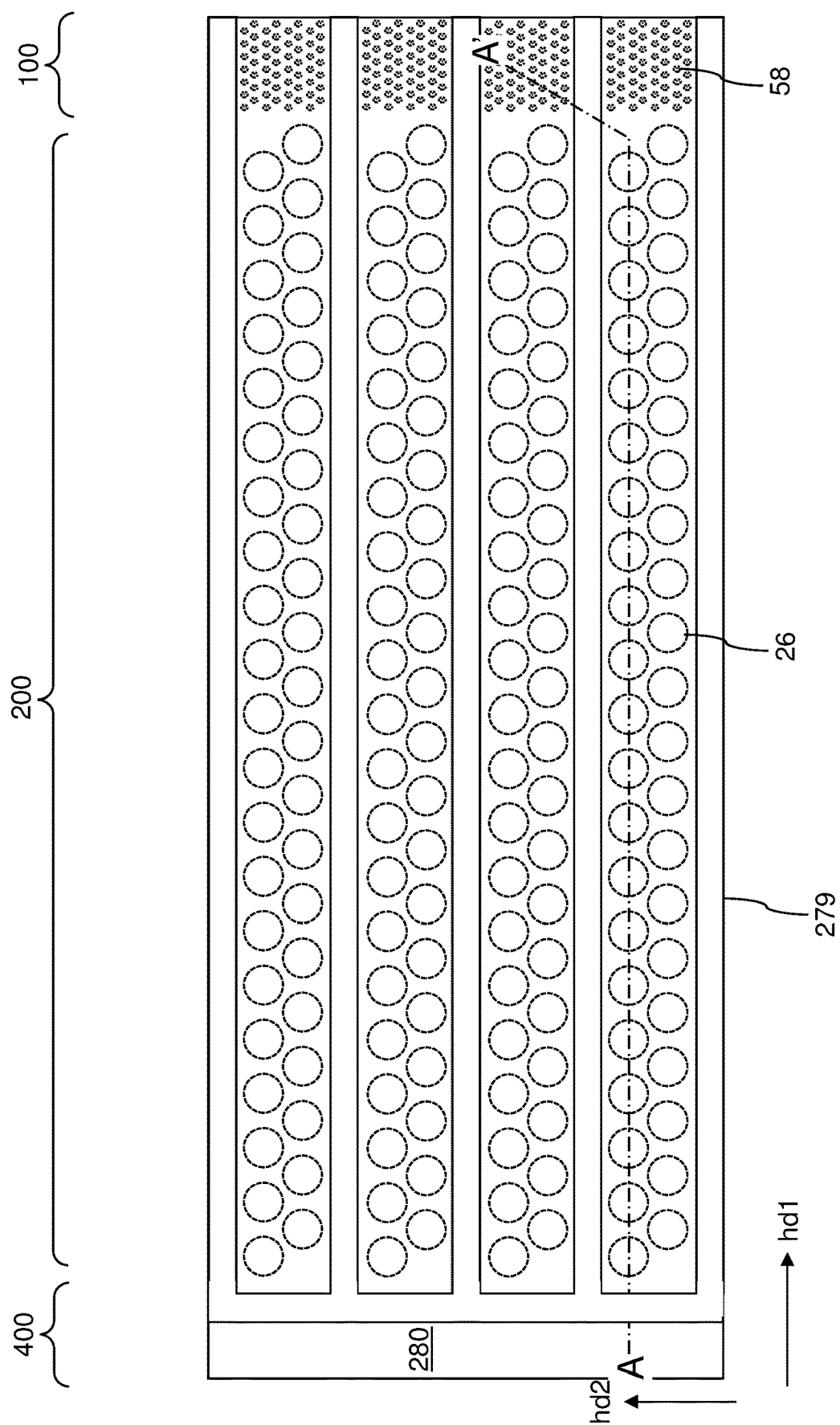
FIG. 14B is a top-down view of the first exemplary structure of FIG. 14A.

Referring to FIGS. 14A and 14B, a photoresist layer (not shown) may be applied over the contact-level dielectric layer 280, and may be lithographically patterned to form openings having the same pattern as the first-tier backside trench fill structure (171, 172, 173) (which has the same pattern as the first-tier backside trenches 179). An anisotropic etch process can be performed to transfer the pattern in the photoresist layer through the contact-level dielectric layer 280, the second insulating cap layer 270, the second-tier alternating stack (232, 242), and the in-process source-level material layers 110'. Second-tier backside trenches 279 be formed through the contact-level dielectric layer 280, the second insulating cap layer 270, the second-tier alternating stack (232, 242), and the in-process source-level material layers 110'. The top etch stop barrier layers 173 may be employed as etch stop structures during the anisotropic etch process that forms the second-tier backside trenches 279. Sidewalls of each layer within the in-process source-level material layers 110' can be physically exposed at the bottom portion of the second-tier backside trenches 279.

In one embodiment, a subset of the second-tier backside trenches 279 may be formed between clusters of memory opening fill structures 58 and between clusters of in-process layer contact assemblies 26. In one embodiment, neighboring clusters of memory opening fill structures 58 may be laterally spaced apart along the second horizontal direction hd2 by the second-tier backside trenches 279. Further, neighboring clusters of in-process layer contact assemblies 26 may be laterally spaced apart along the second horizontal direction hd2 by the second-tier backside trenches 279.

Figure 15:
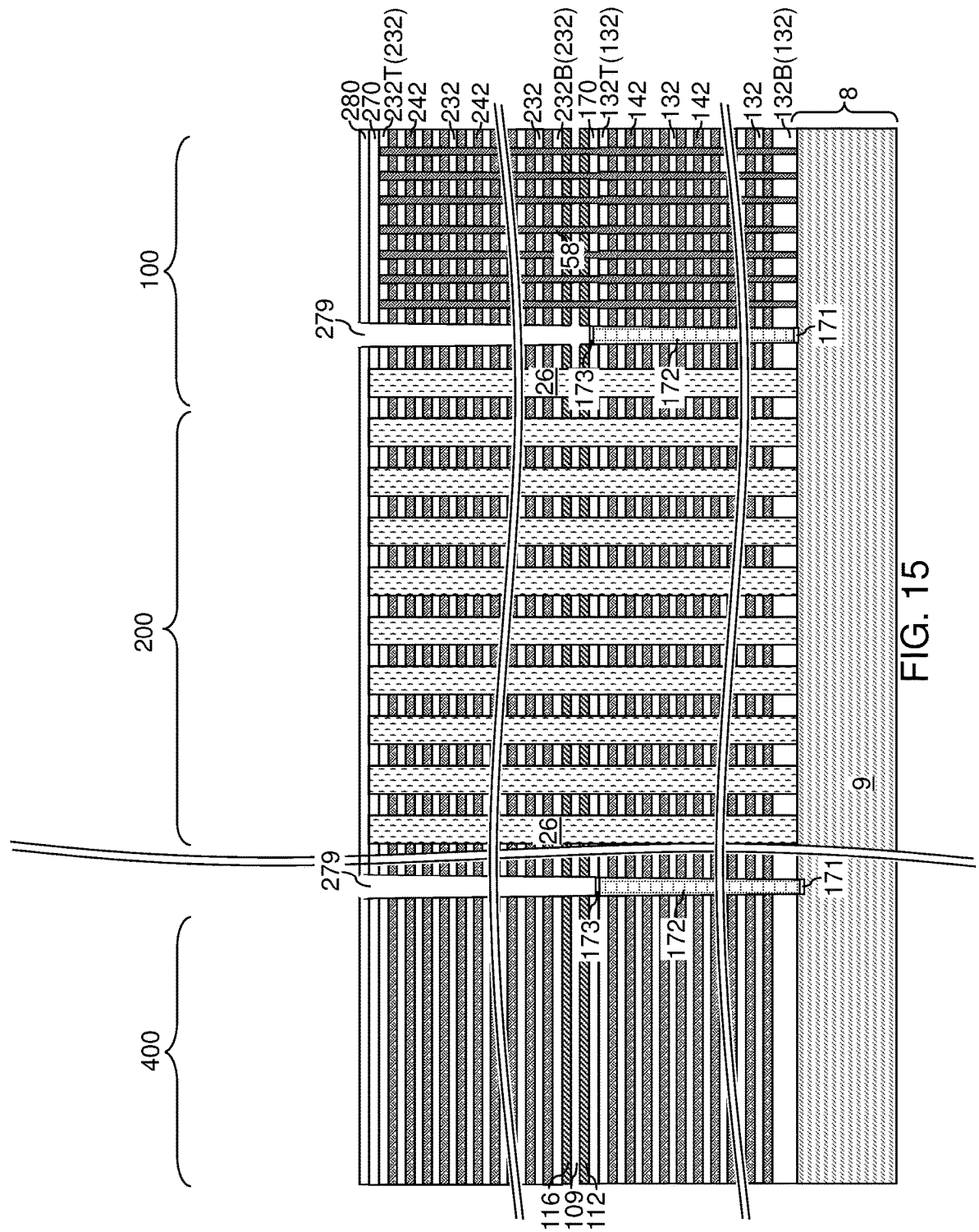
FIG. 15 is a vertical cross-sectional view of the first exemplary structure after formation of a source cavity according the first embodiment of the present disclosure.

Referring to FIGS. 15 and 16A, an isotropic etch process can be performed to introduce an etchant that etches the material of the source-level sacrificial layer 104 selective to the materials of the second-tier alternating stack (232, 242), the second insulating cap layer 270, the contact-level dielectric layer 80, the upper dielectric liner layer 105, the lower dielectric liner layer 103, the lower source-level semiconductor layer 112, and the upper source-level semiconductor layer 116 into the second-tier backside trenches 79. For example, if the source-level sacrificial layer 104 includes undoped amorphous silicon or undoped polysilicon, the lower source-level semiconductor layer 112 and the upper source-level semiconductor layer 116 comprise heavily doped silicon having a doping of the second conductivity type, and the upper and lower dielectric liner layers (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the second-tier alternating stack (232, 242), the upper dielectric liner layer 105, the lower dielectric liner layer 103, the lower source-level semiconductor layer 112, and the upper source-level semiconductor layer 116. A source cavity 109 is formed in the volume from which the source-level sacrificial layer 104 is removed.

In case the first spacer material layers and the second spacer material layers comprise first sacrificial material layers 142 and second sacrificial material layers 242, respectively, the first sacrificial material layers 142 and second sacrificial material layers 242 may comprise a first sacrificial material, and the sacrificial source-level material layer 104 comprises a second sacrificial material that is different from the first sacrificial material. The isotropic etch process can etch the second sacrificial material selective to the first sacrificial material and the insulating material of the first insulating layers 132 and the second insulating layers 232.

Referring to FIG. 16B, a sequence of isotropic etchants, such as wet etchants, can be applied through the second-tier backside trenches 279 and the source cavity 109 to the physically exposed portions of the continuous memory films 50 to sequentially etch the various component layers of the continuous memory films 50 from outside to inside, and to physically expose cylindrical side surfaces of the vertical semiconductor channels 60 at the level of the source cavity 109. The upper and lower dielectric liner layers (105, 103) can be collaterally etched during removal of the portions of the continuous memory films 50 located at the level of the source cavity 109. The source cavity 109 can be expanded in volume by removal of the portions of the continuous memory films 50 at the level of the source cavity 109 and the upper and lower dielectric liner layers (105, 103). A top surface of the lower source-level material layer 112 and a bottom surface of the upper source-level material layer 116 can be physically exposed to the source cavity 109. An outer sidewall of each vertical semiconductor channel 60 is physically exposed to the source cavity 109 after removing the physically exposed portions of the continuous memory films 50.

Generally, a tubular portion of each continuous memory film 50 that is exposed to the source cavity 109 can be removed between the first-tier alternating stack (132, 142) and the second-tier alternating stack (232, 242). A cylindrical surface segment of the outer sidewall of each vertical semiconductor channel 60 can be exposed to the source cavity 109 upon removal of the tubular portions of the continuous memory films 50. Each continuous memory film 50 can be divided into two discrete portions upon removal of the tubular portions of the continuous memory films 50. Specifically, remaining portions of each continuous memory film 50 after removal of the tubular portions of the continuous memory films 50 may comprise a first memory film 50A that underlies the cylindrical surface segment of the outer sidewall of a respective vertical semiconductor channel 60 and laterally surrounded by the first-tier alternating stack (132, 142), and a second memory film 50B that overlies the cylindrical surface segment of the outer sidewall of the respective vertical semiconductor channel 60 and laterally surrounded by the second-tier alternating stack (232, 242). Each first memory film 50A may comprise a respective layer stack of a first blocking dielectric layer 52A, a first memory material layer 54A, and an optional first dielectric liner 56A (which may be a first tunneling dielectric layer). Each second memory film 50A may comprise a respective layer stack of a second blocking dielectric layer 52B, a second memory material layer 54B, and an optional second dielectric liner 56B (which may be a second tunneling dielectric layer). In one embodiment, a vertical spacing between the first memory film 50A and the second memory film 50B may be greater than the height of the source cavity 109.

Each first memory film 50A may have a tapered convex annular top surface that is physically exposed to the source cavity 109, and each second memory film 50B may have a tapered convex annular bottom surface that is physically exposed to the source cavity 109. Each first memory film 50A comprises a vertical stack of first memory elements located at levels of the first sacrificial material layers 142, and each second memory film 50B comprises a vertical stack of second memory elements located at levels of the second sacrificial material layers 242. In one embodiment, each vertical stack of first memory elements comprises portions of a first memory film 50A, which vertically extend through each layer within the first-tier alternating stack (132, 142). In one embodiment, each vertical stack of second memory elements comprises portions of a second memory film 50B, which vertically extends through each layer within the second-tier alternating stack (232, 242).

Figure 16C:
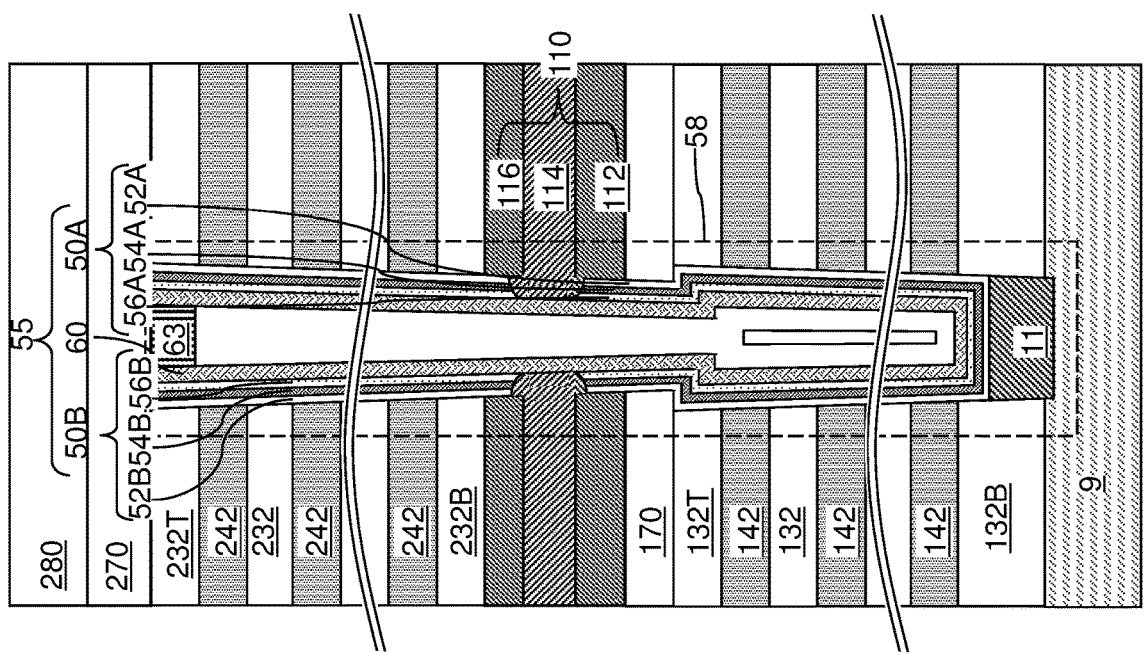
Figure 17:
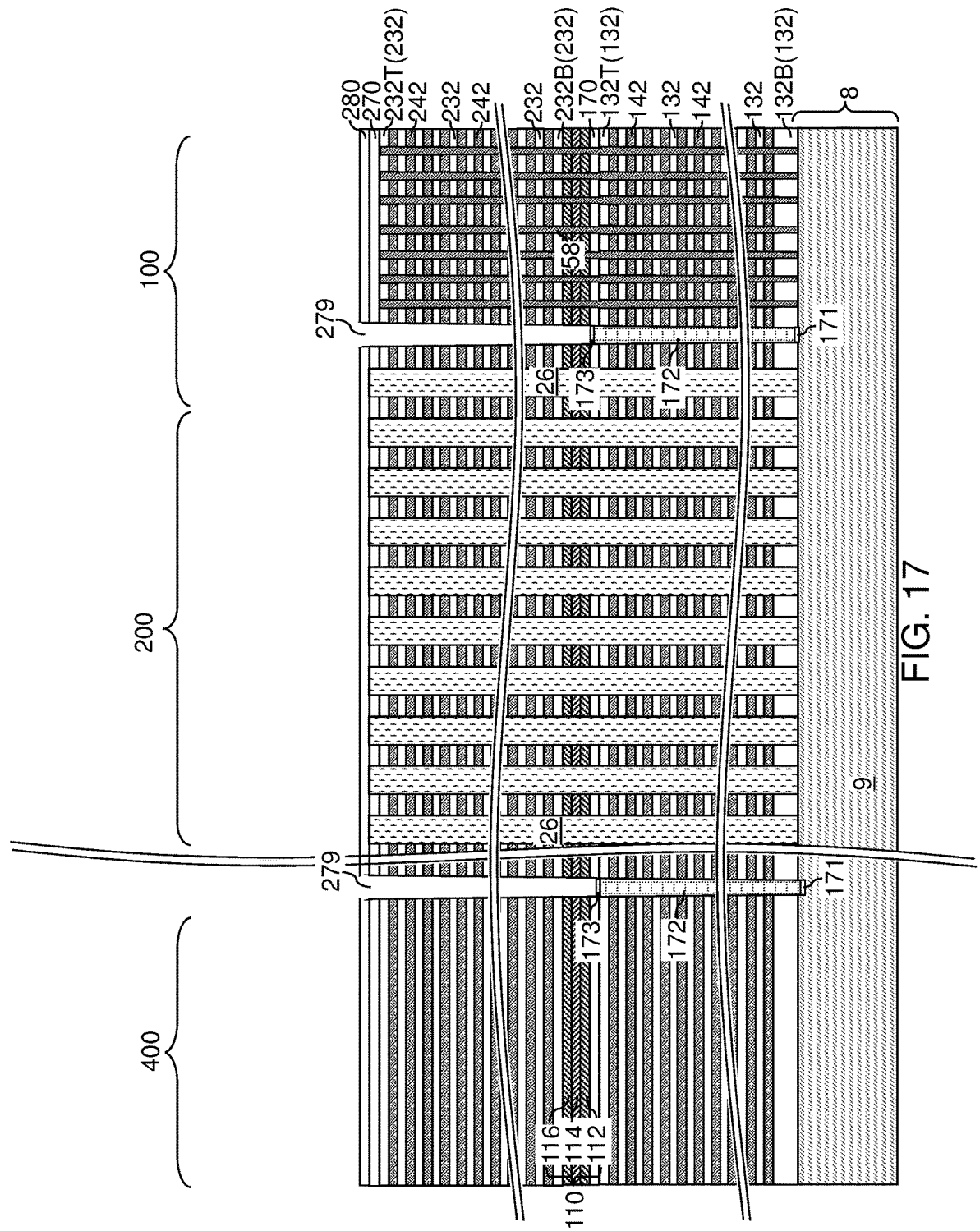
FIG. 17 is a vertical cross-sectional view of the first exemplary structure after formation of source-level material layers according to the first embodiment of the present disclosure.

Referring to FIGS. 16C and 17, a source contact layer 114 can be formed by a selective deposition process that deposits a doped semiconductor material having a doping of the second conductivity type. The doped semiconductor material can include amorphous silicon, polysilicon, or a silicon-germanium alloy. The doped semiconductor material of the source contact layer 114 can grow from physically exposed semiconductor surfaces around the source cavity 109. The average atomic concentration of dopants of the second conductivity type in the source contact layer 114 can be in a range from $5.0 \times 10^{19}/cm^3$ to $2.0 \times 10^{21}/cm^3$, although lesser and greater dopant concentrations can also be employed.

The in-process source-level material layers 110' are replaced with source-level material layers (112, 114, 116) which function as a source layer (e.g., source line) 110. The source-level material layers include a layer stack including, from bottom to top, the lower source-level material layer 112, the source contact layer 114, and the upper source-level material layer 116. The combination of the lower source-level material layer 112, the source contact layer 114, the upper source-level material layer 116 constitutes a source layer 110. Upon replacement of the source-level sacrificial layer 104 with a source contact layer 114, the in-process source-level material layers 110' are converted into source-level material layers (112, 114, 116).

Generally, the source contact layer 114 can be formed directly on a cylindrical surface segment of an outer sidewall of each vertical semiconductor channel 60 within the source cavity 109. The lower source-level semiconductor layer 112 overlies the first-tier alternating stack (132, 142) and contacts a bottom surface of the source contact layer 114, and the upper source-level semiconductor layer 116 underlies the second-tier alternating stack (232, 242) and contacts a top surface of the source contact layer 114. In one embodiment, the lower source-level semiconductor layer 112 contacts a cylindrical surface segment of an upper portion of an outer sidewall of each first memory film 50A, and the upper source-level semiconductor layer 116 comprises a cylindrical surface segment of a lower portion of an outer sidewall of each second memory film 50B. In one embodiment, each first memory film 50A comprises a first annular tapered concave surface segment that contacts the source contact layer 114, and the second memory film 50B comprises a second annular tapered concave surface segment that contacts the source contact layer 114.

Generally, each memory opening 49 vertically extends through the first-tier alternating stack (132, 142), the source contact layer 114, and the second-tier alternating stack (232, 242). A memory opening fill structure 58 is located in each memory opening 49. Each memory opening fill structure 58 comprises a vertical stack of first memory elements located at levels of the first sacrificial material layers 142 (e.g., in the lower memory block), a vertical stack of second memory elements located at levels of the second sacrificial material layers 242 (e.g., in the upper memory block), and a vertical semiconductor channel 60 vertically extending through each of the first sacrificial material layers 142 and the second sacrificial material layers 242 and having a cylindrical surface segment in contact with the source contact layer 114.

Figure 18:
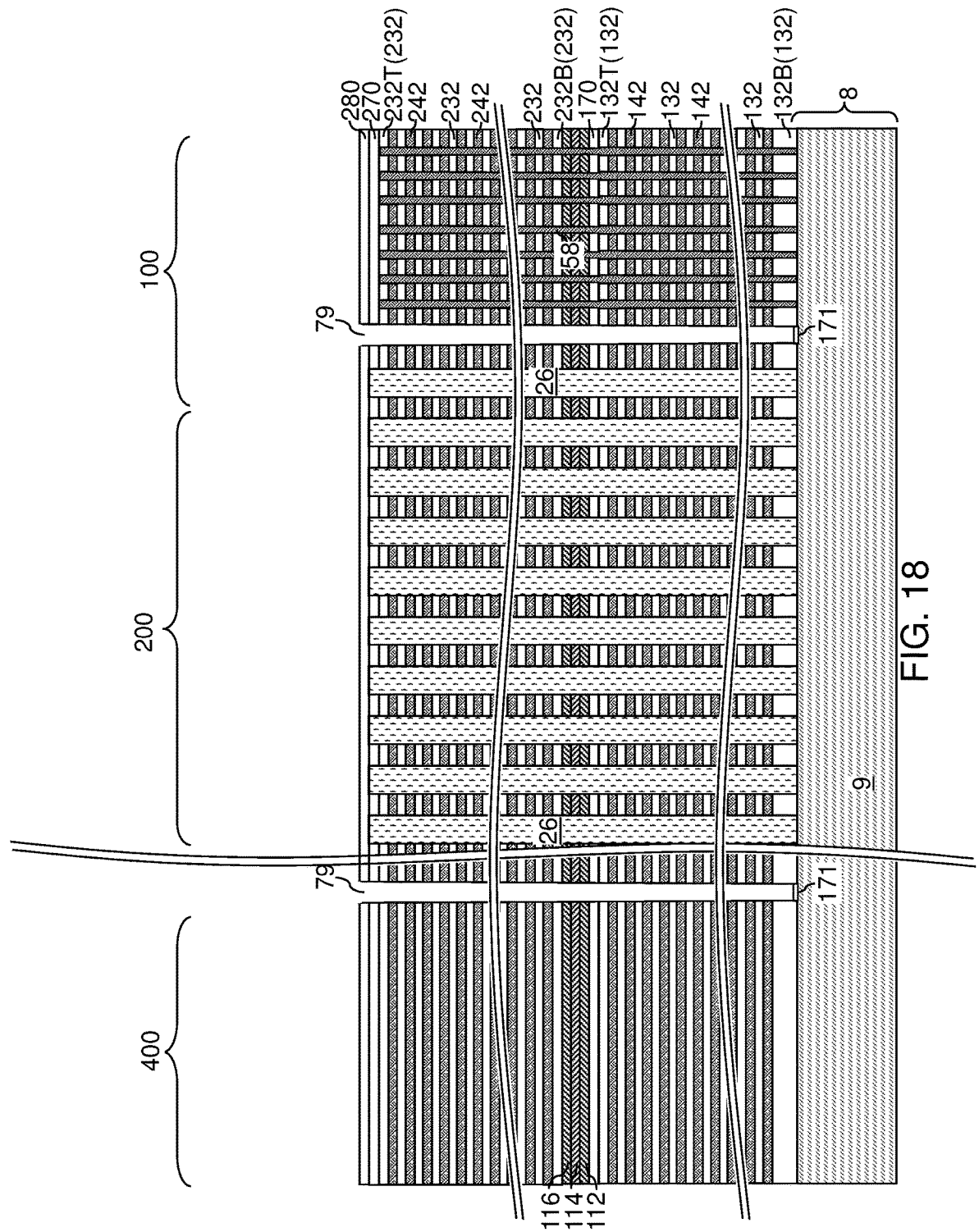
FIG. 18 is a vertical cross-sectional view of the first exemplary structure after formation of inter-tier backside trenches according to the first embodiment of the present disclosure.

Referring to FIG. 18, an anisotropic etch process can be performed to sequentially etch the top etch stop barrier layers 173 and the first-tier sacrificial trench fill material portions 172. The anisotropic etch process may comprise a first anisotropic etch step that etches the material of the top etch stop barrier layers 173, and a second anisotropic etch step that etches the material of the first-tier sacrificial trench fill material portions 172 selective to the material of the bottom etch stop barrier layers 171. A backside trench 79 is formed within each contiguous set of volumes including the volume of a second-tier backside trench 279, a volume from which a top etch stop barrier layer 173 is removed, and a volume from which a first-tier sacrificial trench fill material portion 172 is removed.

Figure 19:
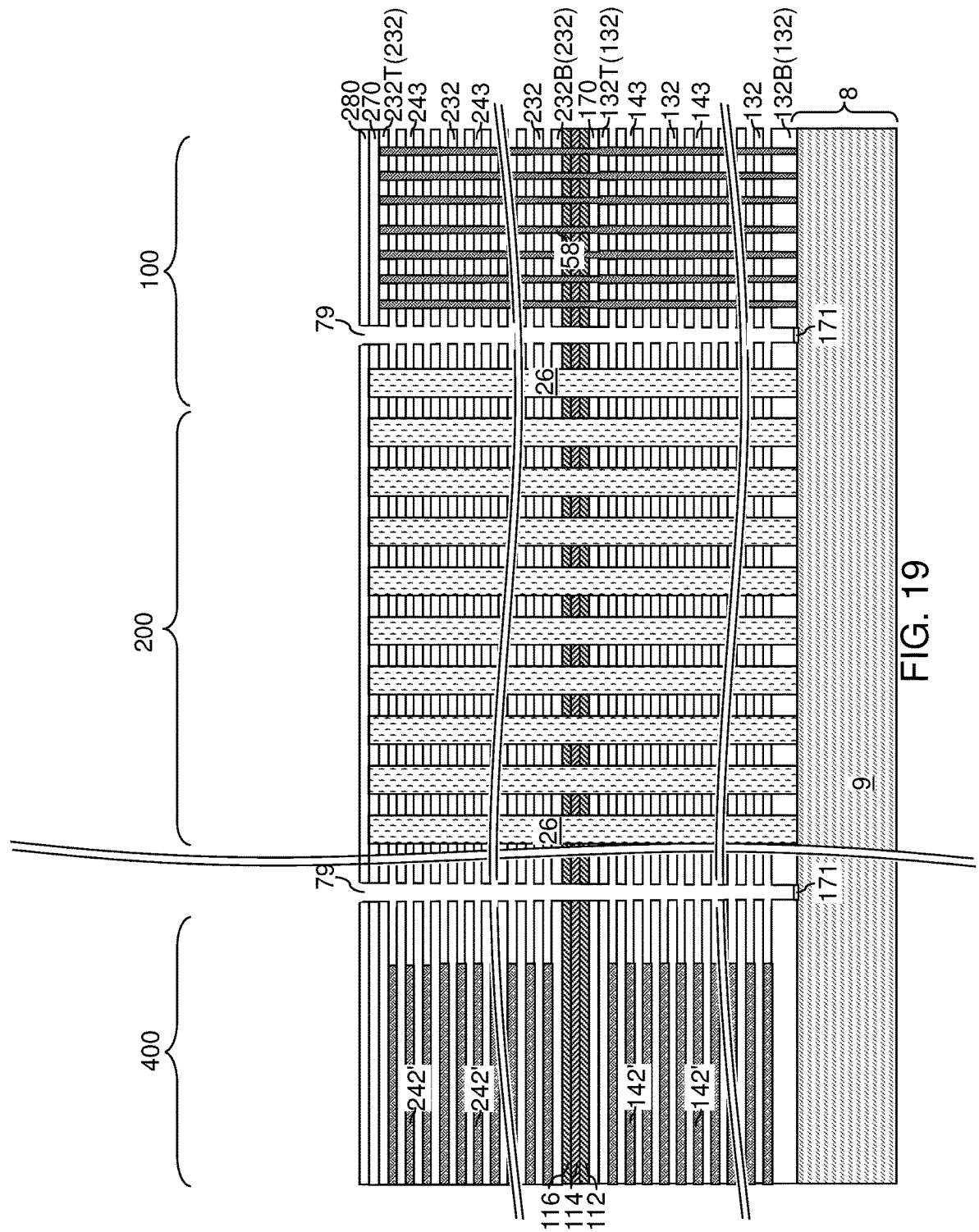
FIG. 19 is a vertical cross-sectional view of the first exemplary structure after formation of backside recesses according to the first embodiment of the present disclosure.
Figure 20A:
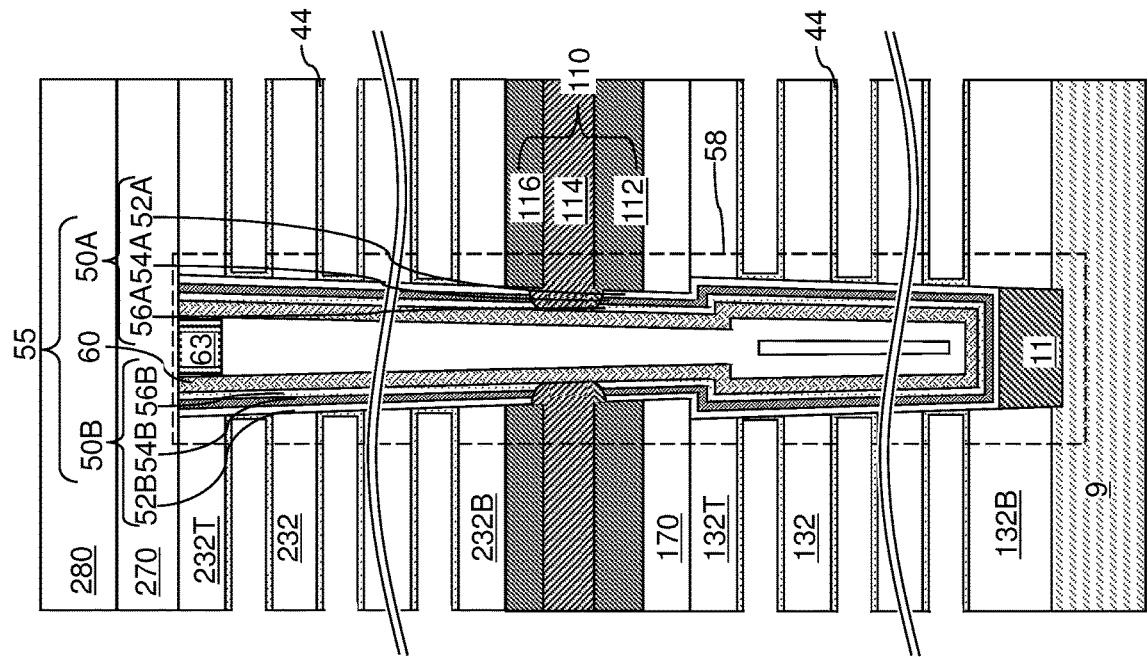
FIGS. 20A-20C are sequential vertical cross-sectional views of a region of the first exemplary structure during formation of electrically conductive layers according to the first embodiment of the present disclosure.
Figure 21A:
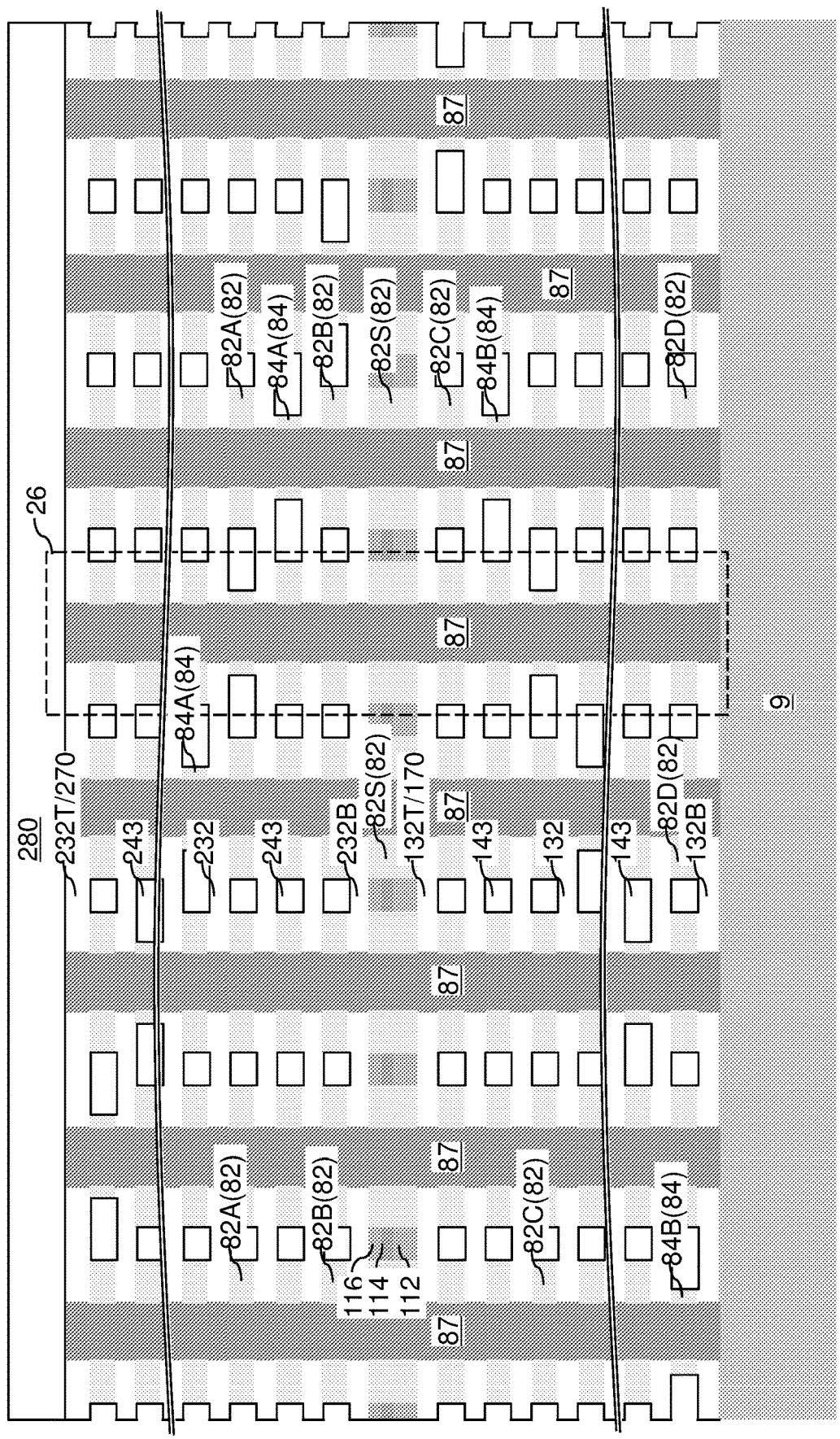

Referring to FIGS. 19, 20A, and 21A, an etchant that selectively etches the materials of the first and second sacrificial material layers (142, 242) with respect to the materials of the first and second insulating layers (132, 232) and the material of the outermost layer of the memory films (50A, 50B) can be introduced into the backside trenches 79, for example, employing an isotropic etch process. For example, the first and second sacrificial material layers (142, 242) can include silicon nitride, the materials of the first and second insulating layers (132, 232), the first and second insulating cap layers (170, 270), and the outermost layer of each memory films (50A, 50B) can include silicon oxide materials. First backside recesses 143 are formed in volumes from which the first sacrificial material layers 142 are removed. Second backside recesses 243 are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trenches 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 8. A backside recess (143, 243) can be vertically bounded by a top surface of an underlying insulating layer (132 or 232) and a bottom surface of an overlying insulating layer (132 or 232). In one embodiment, each of the first and second backside recesses (143, 243) can have a uniform height throughout.

Remaining portions of the first sacrificial material layers 142 and the second sacrificial material layers 242 may be present in the connection region 400. The remaining portions of the first sacrificial material layers 142 are referred to as first dielectric material plates 142', and the remaining portions of the second sacrificial material layers 242 are referred to as second dielectric material plates 242'. A vertical stack of dielectric material plates (142', 242') can be vertically interlaced with insulating layers (132, 232) in the connection region 400.

Figure 20B:
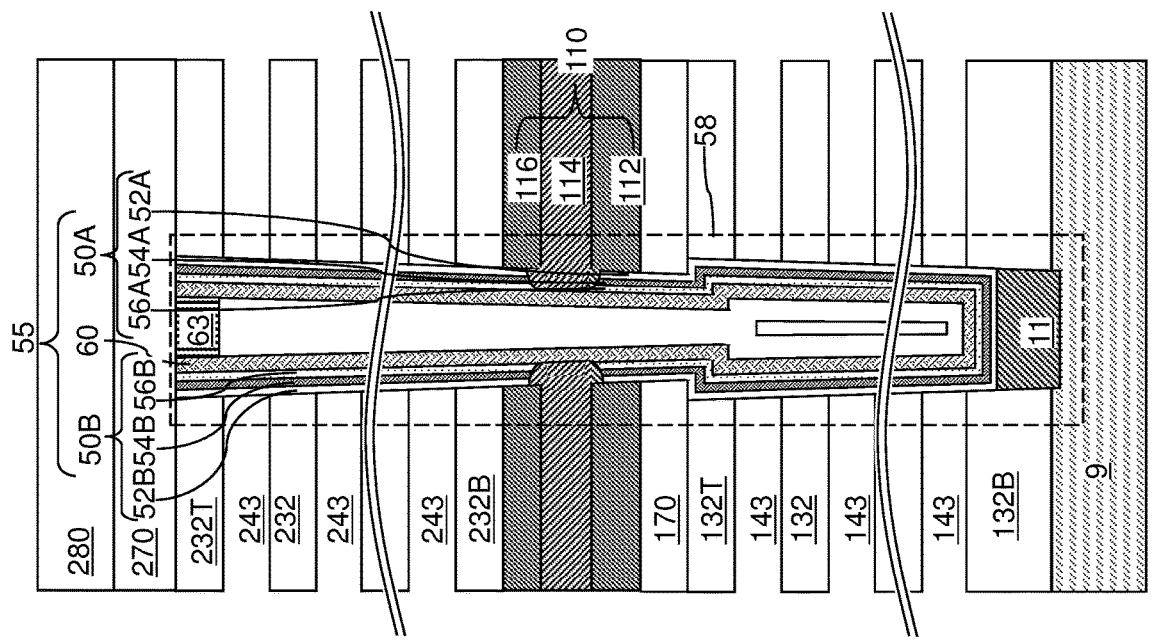
Figure 21B:
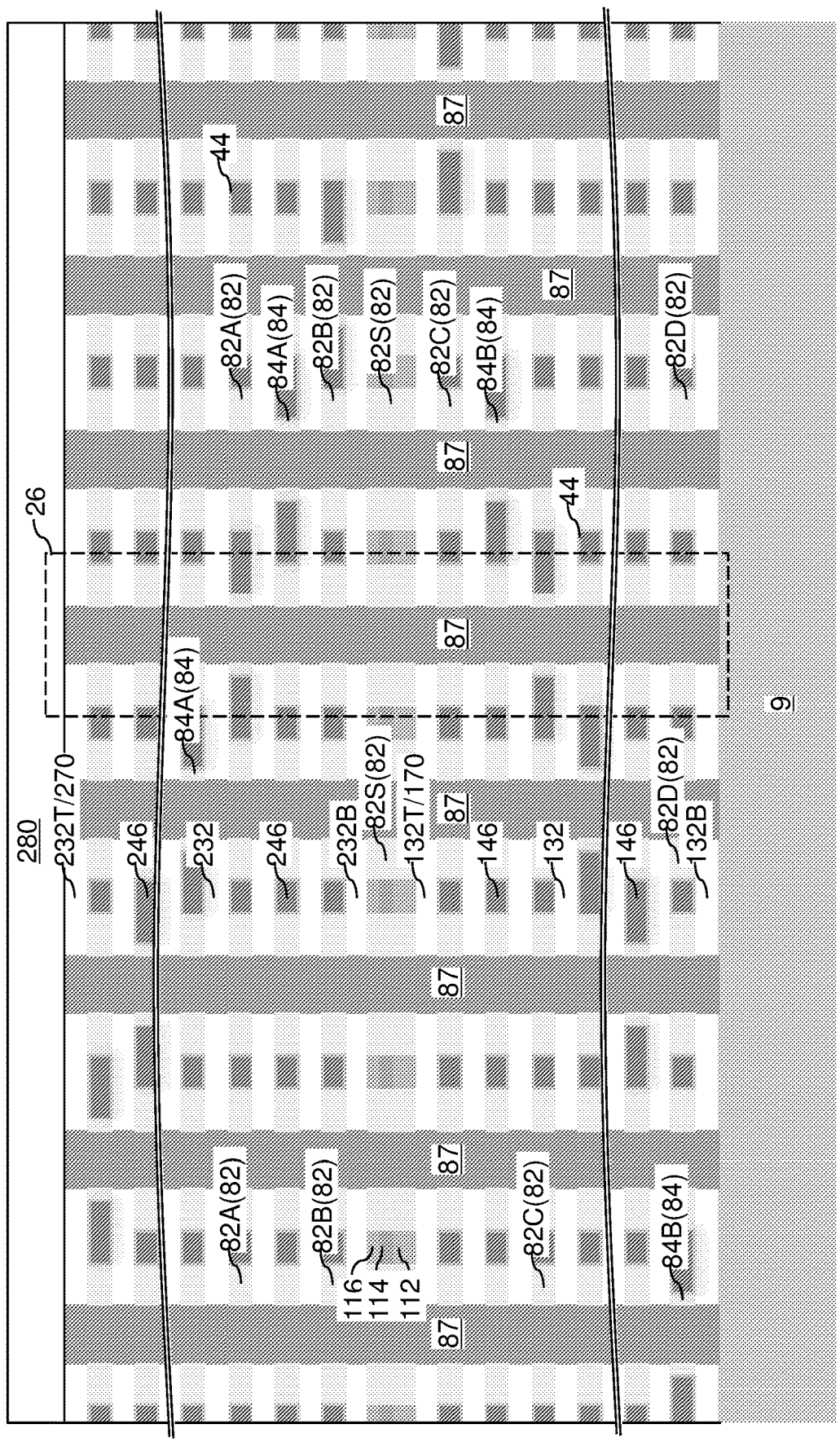

Referring to FIGS. 20B and 21B, a backside blocking dielectric layer 44 can be optionally deposited in the backside recesses and the backside trenches 79 and over the contact-level dielectric layer 280.

Figure 20C:
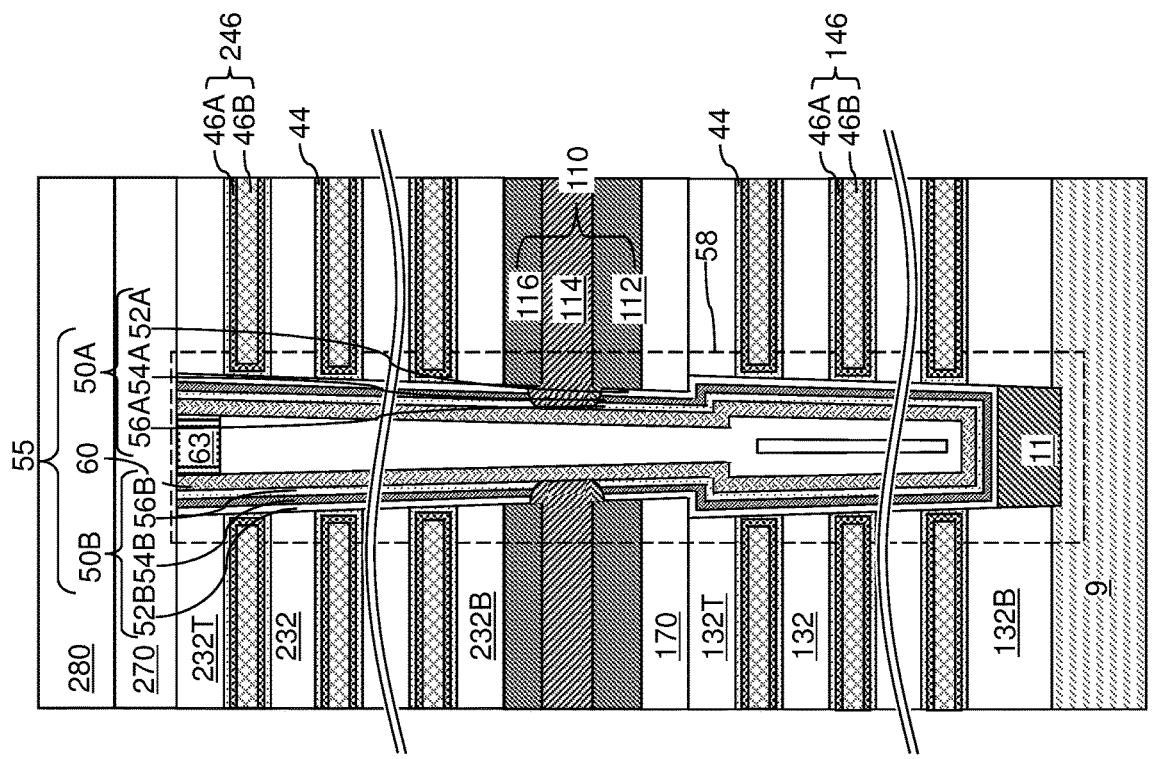
Figure 22:
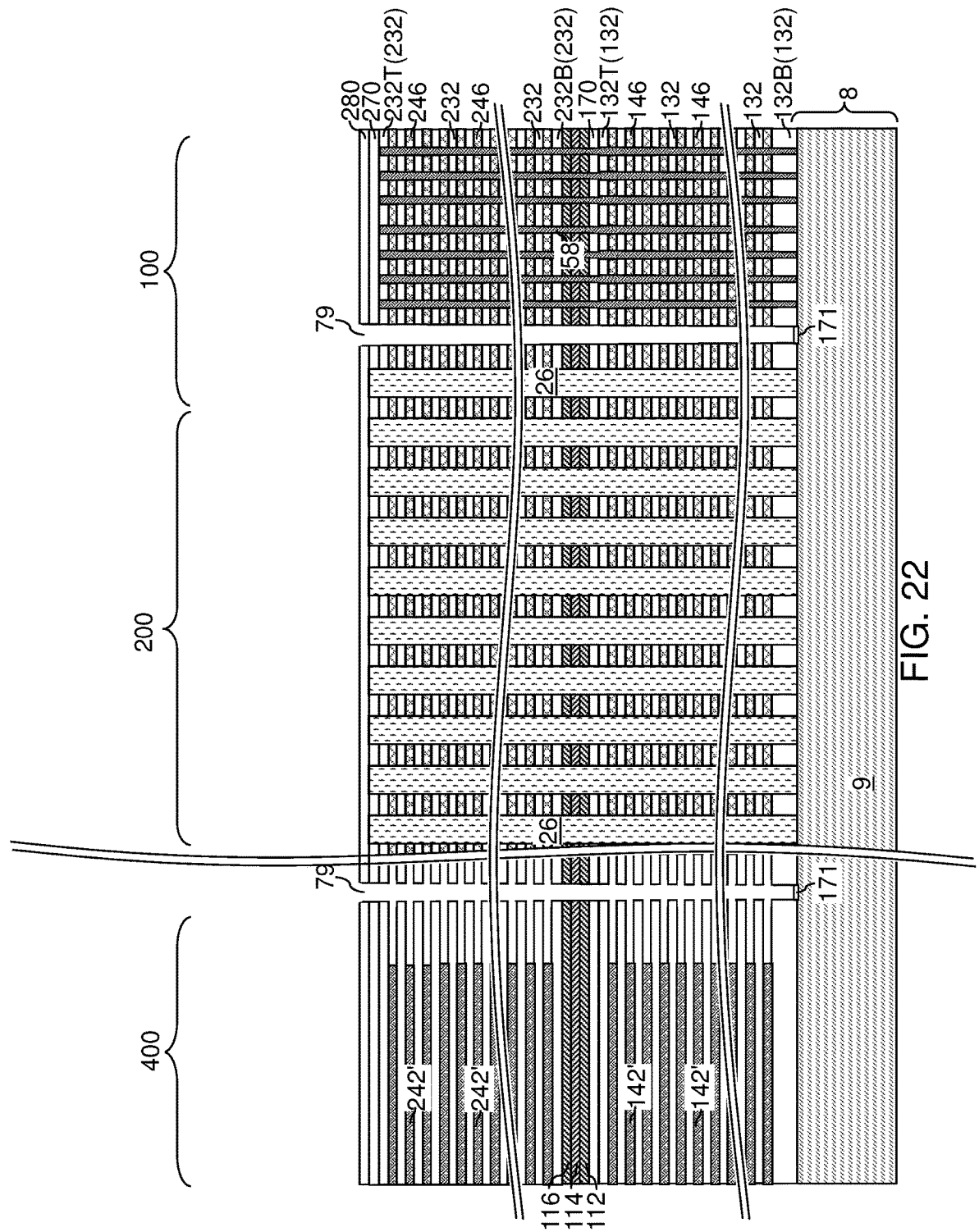
FIG. 22 is a vertical cross-sectional view of the first exemplary structure after formation of the electrically conductive layers according to the first embodiment of the present disclosure.

Referring to FIGS. 20C, 21B, and 22, at least one conductive material can be deposited in the plurality of backside recesses (143, 243), on the sidewalls of the backside trench 79, and over the contact-level dielectric layer 280. The at least one conductive material can include at least one metallic material, i.e., an electrically conductive material that includes at least one metallic element. In one embodiment, the at least one metallic material may comprise a metallic barrier material (such as TiN, TaN, WN, MoN, TiC, TaC. WC, or combinations thereof) and a metallic fill material (such as W, Ti, Ta, Mo, Co, Ru, Cu, etc.).

A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the contact-level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer 44 and a first electrically conductive layer 146, and each second sacrificial material layer 242 can be replaced with an optional portion of the backside blocking dielectric layer 44 and a second electrically conductive layer 246. A backside cavity is present in the portion of each backside trench 79 that is not filled with the continuous metallic material layer.

The deposited metallic material of the continuous metallic material layer can be etched back from the sidewalls of each backside trench 79 and from above the contact-level dielectric layers 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

In one embodiment, the at least one conductive material may comprise a combination of a metallic barrier material and a metallic fill material. In this case, each of the electrically conductive layers (146, 246) may comprise a respective combination of a metallic barrier liner 46A and a metallic fill material portion 46B. The metallic barrier liners 46A may comprise a material such as TiN, TaN, WN, MoN, TiC, TaC, WC, or combinations thereof. The metallic fill material portions 46B may comprise a material such as W, Ti, Ta, Mo, Co, Ru, Cu, alloys thereof, or combinations thereof. Each of the at least one metallic material can be deposited by a conformal deposition method, which can be, for example, chemical vapor deposition (CVD), atomic layer deposition (ALD), electroless plating, electroplating, or a combination thereof.

Each of the memory opening fill structures 58 (which contains a respective memory stack structures 55) comprises a vertical stack of memory elements located at each level of the electrically conductive layers (146, 246). A subset of the electrically conductive layers (146, 246) can comprise word lines and select gate electrodes for the memory elements, as will be described in more detail below.

Alternating stacks {(132, 146), (232, 246)} of insulating layers (132, 232) and electrically conductive layers (146, 246) are formed, which are laterally spaced apart from each other by the backside trenches 79 along the second horizontal direction (e.g., word line direction) hd2. The source layer (112, 114, 116) comprises: a lower source-level material layer 112 comprising a first doped semiconductor material; an upper source-level material layer 116 comprising a second doped semiconductor material; and a source contact layer 114 comprising a third doped semiconductor material and located between the upper source-level material layer 116 and the lower source-level material layer 112. In one embodiment, each of the vertical semiconductor channels 60 is in contact with the source contact layer 114.

Figure 23A:
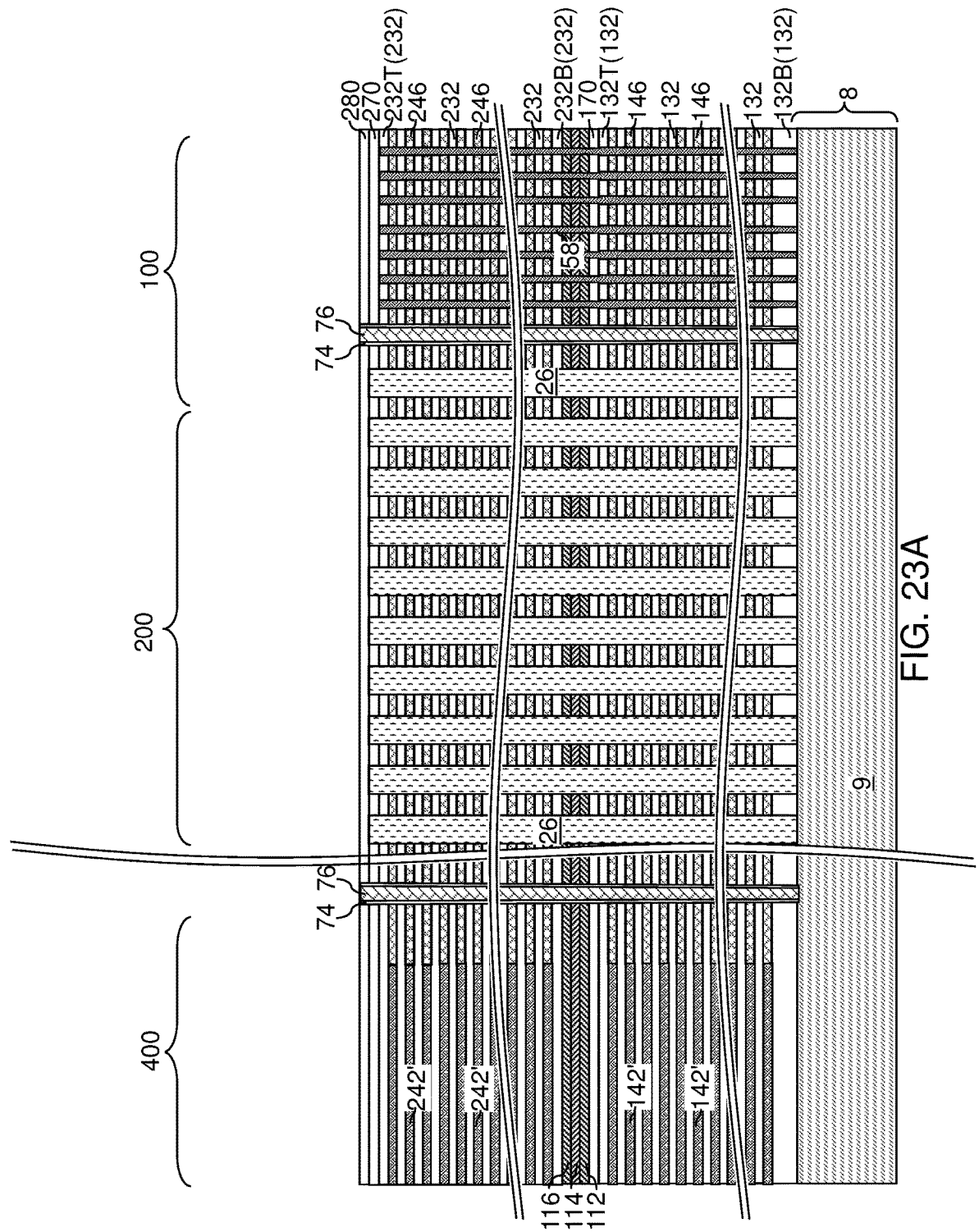
FIG. 23A is a vertical cross-sectional view of the first exemplary structure after formation of backside trench fill structures according to the first embodiment of the present disclosure.
Figure 23B:
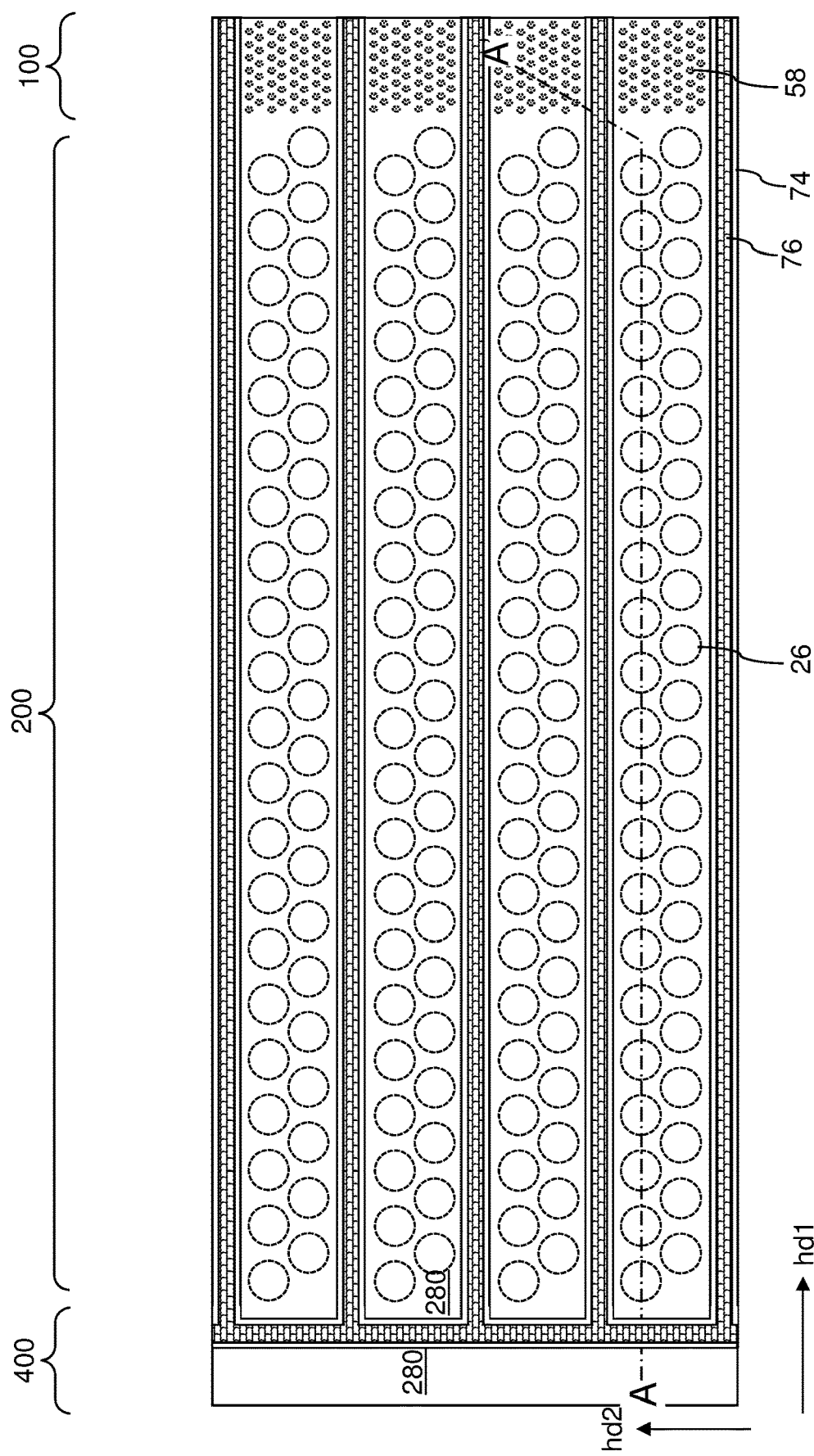
FIG. 23B is a top-down view of the first exemplary structure of FIG. 23A.

Referring to FIGS. 23A and 23B, an insulating spacer material layer such as a silicon oxide layer can be formally deposited in the backside trenches 79 and over the contact-level dielectric layers 280. An anisotropic etch process can be performed to remove horizontally-extending portions of the insulating spacer material layer from above the contact-level dielectric layers 280 and at the bottom of the backside trenches 79. Each remaining vertically-extending tubular portion of the insulating spacer material layer constitutes a backside insulating spacer 74.

At least one conductive material, such as at least metallic material, can be subsequently deposited in the cavities in the backside trenches 79. The at least one conductive material may comprise at least one metallic barrier material (e.g., a metallic nitride material such as TiN, TaN, and/or WN) and at least one metallic fill material (e.g., W. Cu, Co, Ru, Mo, etc.). Excess portions of the at least one metallic material can be removed from above the horizontal plane including the top surfaces of the contact-level dielectric layer 280 by a planarization process, which may employ a recess etch process and/or a chemical mechanical polishing process. Each remaining portion of the at least one metallic material constitutes a backside contact via structure 76. Each contiguous combination of a backside insulating spacer 74 and a backside contact via structure 76 constitutes a backside trench fill structure (74, 76). Each backside trench 79 within the first subset of the backside trenches 79 can be filled with a respective backside trench fill structure (74, 76).

FIGS. 24A-24D are sequential vertical cross-sectional views of the contact region 200 during replacement of the in-process layer contact assemblies 26 with layer contact assemblies 28 according to the first embodiment of the present disclosure.

Figure 24A:
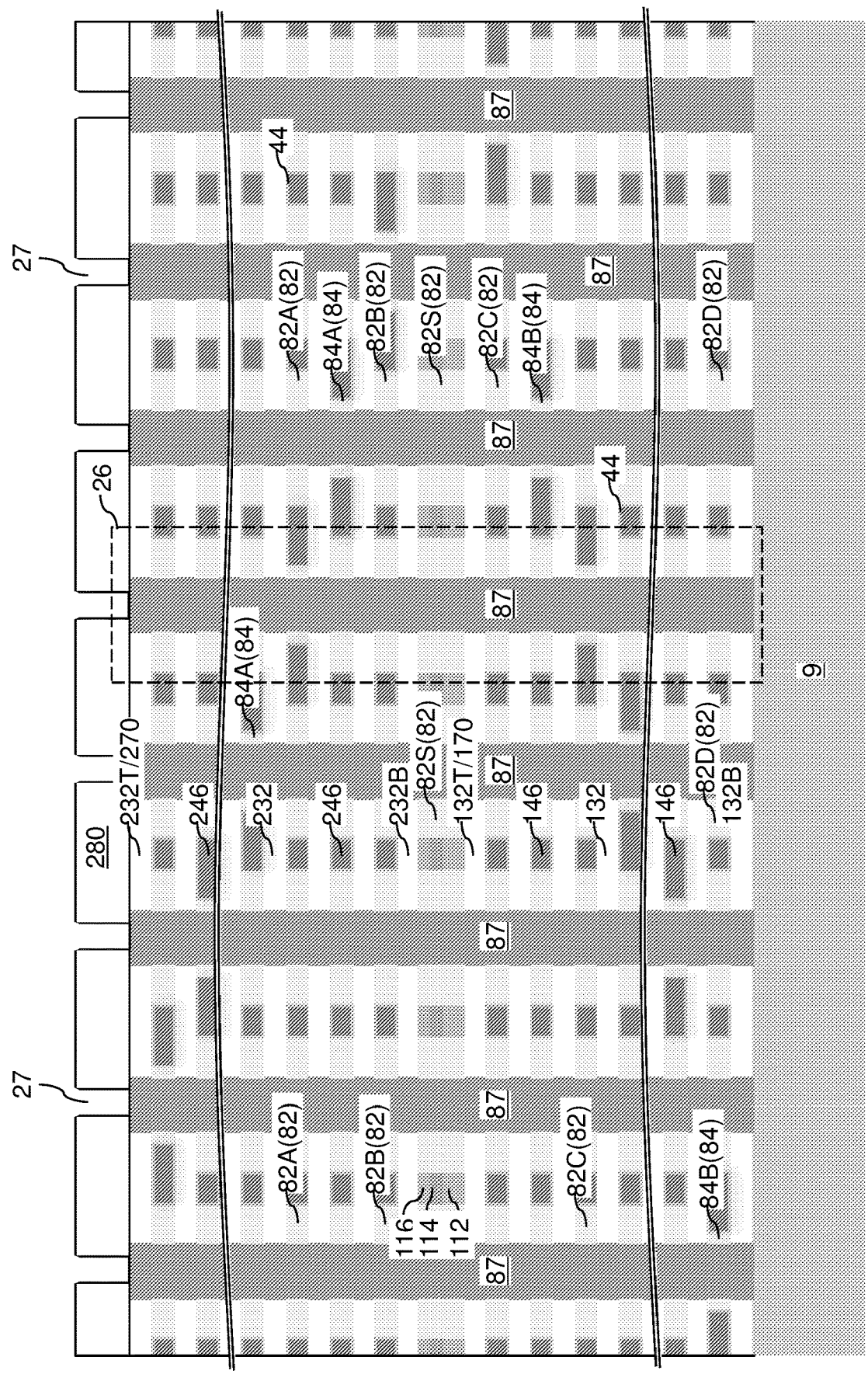
FIGS. 24A-24D are sequential vertical cross-sectional views of the contact region during replacement of the in-process layer contact assemblies with layer contact assemblies according to the first embodiment of the present disclosure.

Referring to FIG. 24A, a photoresist layer (not shown) can be applied over the contact-level dielectric layer 280, and can be lithographically patterned to form openings over the in-process layer contact assemblies 26. An anisotropic etch process may be performed to transfer the pattern of the openings in the photoresist layer through the contact-level dielectric layer 280. An array of openings 27 can be formed through the contact-level dielectric layer 280. A top surface of a sacrificial contact opening fill structure 87 can be physically exposed at the bottom of each opening 27 through the contact-level dielectric layer 280.

Figure 24B:
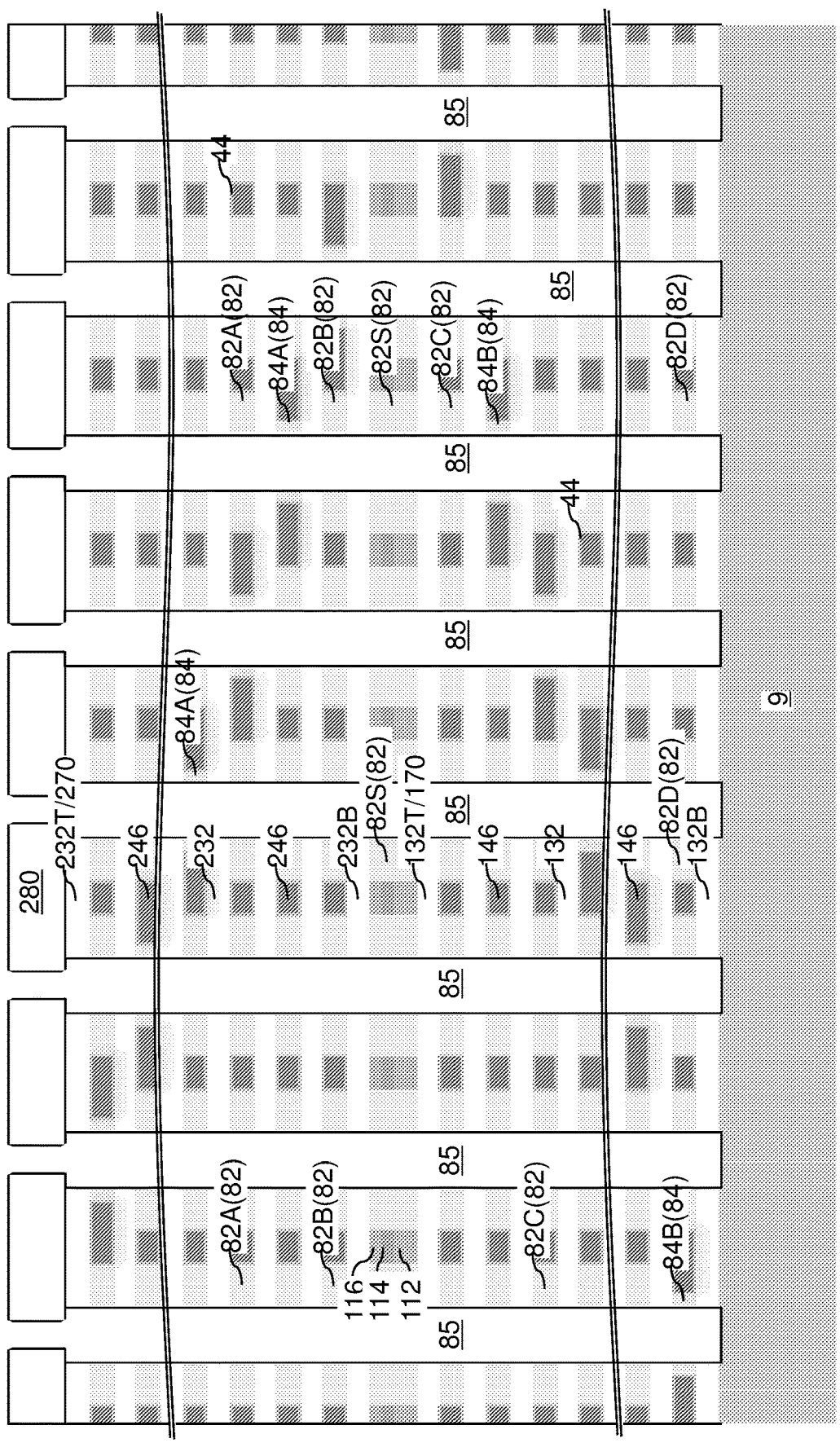

Referring to FIG. 24B, a selective etch process can be performed to remove the sacrificial contact opening fill structures 87 selective to the contact-level dielectric layer 280, the insulating layers (132, 232), the annular dielectric spacers 82, and the annular sacrificial spacers 84. In an illustrative example, if the sacrificial contact opening fill structures 87 comprise amorphous silicon, then a wet etch process employing hot trimethyl-2 hydroxyethyl ammonium hydroxide ("hot TMY") or tetramethyl ammonium hydroxide (TMAH) can be employed to remove the sacrificial contact opening fill structures 87. The contact openings 85 are reopened after the etch process.

Figure 24C:
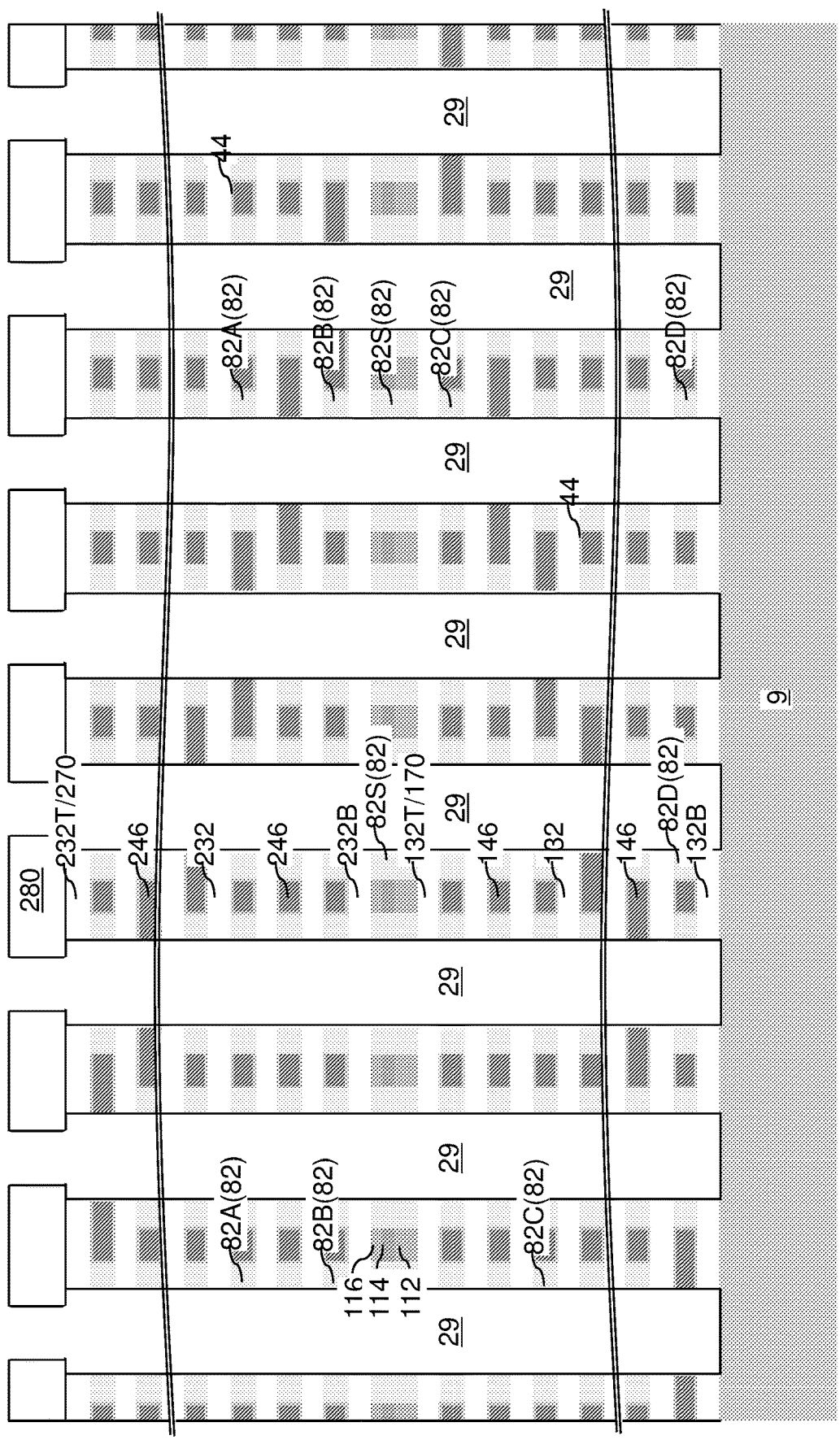

Referring to FIG. 24C, at least one isotropic etch process can be performed to remove the annular sacrificial spacers 84 and vertically-extending portions of the backside blocking dielectric layers 44 that are located adjacent to the annular sacrificial spacers 84. For example, if the annular sacrificial spacers 84 comprise silicon oxide and if the backside blocking dielectric layers 44 comprise, a first wet etch process employing dilute hydrofluoric acid and a second wet etch process employing hot phosphoric acid may be sequentially performed to remove the annular sacrificial spacers 84 and portions of the backside blocking dielectric layers 44 that are proximal to the annular sacrificial spacers 84. In one embodiment, inner portions of the annular dielectric spacers 82 can be collaterally removed around each contact opening 85 during removal of the annular sacrificial spacer 84 to form widened contact openings 29. In one embodiment, the insulating layers (132, 232), the contact-level dielectric layer 280, and the annular dielectric spacers 82 may be collaterally recessed during the at least one isotropic etch process that removes the annular sacrificial spacers 84 and portions of the backside blocking dielectric layers 44 that are proximal to the annular sacrificial spacers 84.

A cylindrical sidewall of an electrically conductive layer (146, 246) can be physically exposed around each volume from which a combination of an annular sacrificial spacer 84 and a cylindrical portion of a backside blocking dielectric layer 44 is removed. Each contact opening 29 can be laterally expanded by the at least one isotropic etch process. Each contact opening 29 can be laterally bounded by a respective generally-cylindrical sidewall, which may have a straight vertical cross-sectional profile or a laterally-undulating vertical cross-sectional profile depending on whether physically exposed cylindrical sidewalls of the insulating layers (132, 232) are vertically coincident with inner cylindrical sidewalls of the annular dielectric spacers 82. Generally, the inner cylindrical sidewalls of the annular dielectric spacers 82 may be located at, inside or outside a cylindrical vertical plane including physically exposed cylindrical sidewalls of the insulating layers (132, 232) around each contact opening 29. Generally, a cylindrical sidewall of one of the electrically conductive layers (146, 246) can be physically exposed at each level from which an annular sacrificial spacer 84 is removed. In one embodiment, each of the electrically conductive layers (146, 246) may be physically exposed within each group of cylindrical openings 29 located between a neighboring pair of backside trench fill structures (74, 76) located within a respective neighboring pair of backside trenches 79 that laterally extend along the first horizontal direction hd1.

Figure 24D:
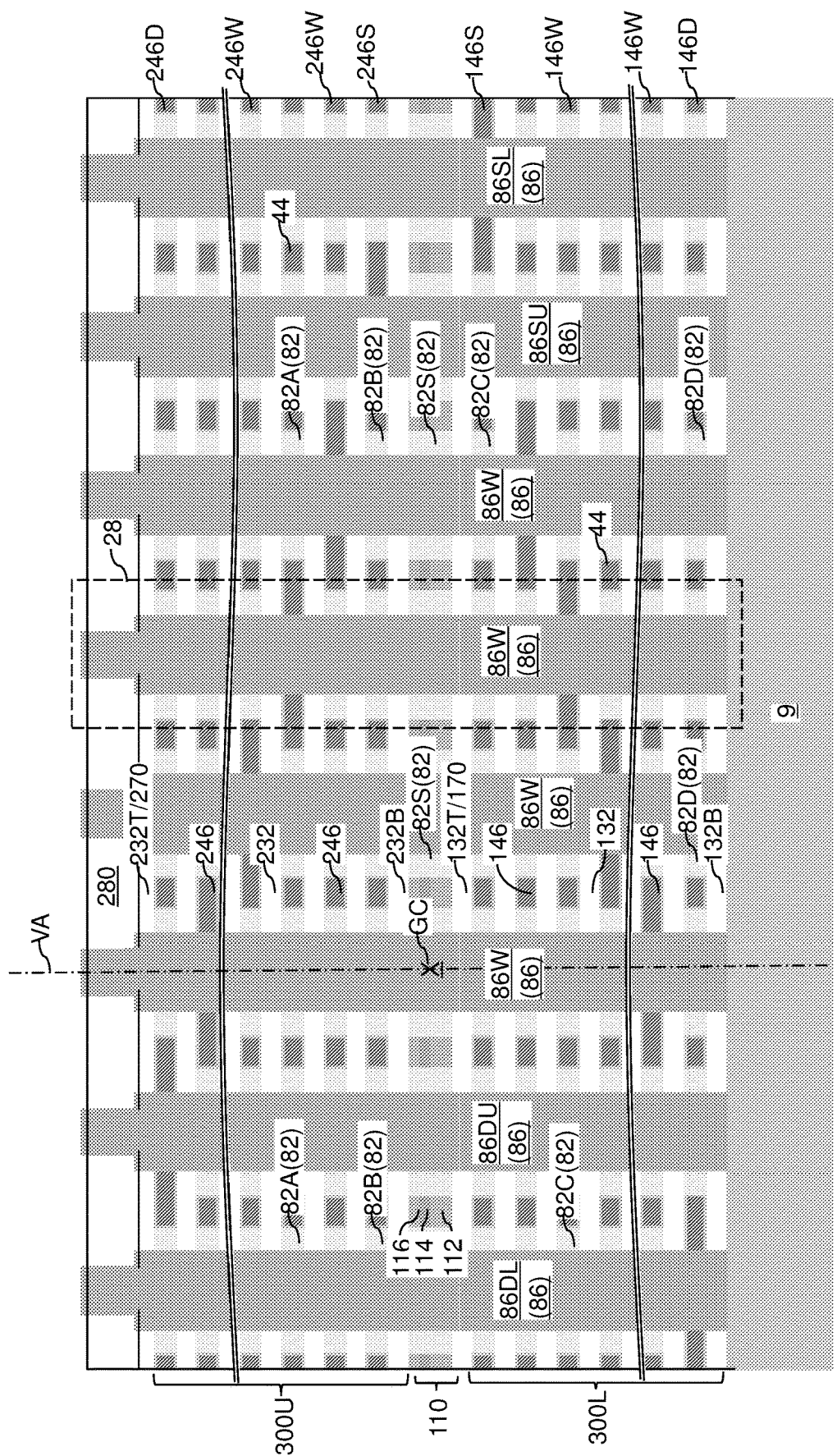

Referring to FIG. 24D, at least one conductive material can be deposited in the contact openings 29. The at least one conductive material may comprise a metallic barrier material and a metallic fill material. The metallic barrier material may comprise a metallic nitride material such as TiN, TaN, and/or WN and/or a metallic carbide material such as TiC. TaC, and/or WC. The metallic fill material may comprise W. Ti, Ta, Ru, Co, Mo, Cu, etc. The at least one conductive material may be deposited by chemical vapor deposition, physical vapor deposition, electroplating, electroless plating, or combinations thereof. Excess portions of the at least one conductive material can be removed from above the horizontal plane including the top surface of the contact-level dielectric layer 280 by performing a planarization process, which may employ a chemical mechanical polishing (CMP) process or a recess etch process. Each remaining portion of the at least one conductive material filling a respective contact opening 29 constitutes a contact via structure that contacts a cylindrical sidewall of a respective electrically conductive layer (146, 246). As such, each contact via structure is referred to as a contact via structure 86. Each contact via structure 86 vertically extends through each layer within the at least one alternating stack {(132, 146), (242, 246)} and contacts a sidewall of at least one of the electrically conductive layers (146, 246).

The at least one alternating stack {(132, 146), (242, 246)} includes a lower memory block 300L below the source layer (i.e., the source-level material layers 110) and a separate upper memory block 300U above the source layer. The source-level material layers 110 function as a common source layer form both the lower and upper memory blocks.

The lower memory block 300L includes at least one lower drain side select gate electrode 146D, which comprises at least one lower most first electrically conductive layer 146, and at least one lower source side select gate electrode 146S, which comprises at least one upper most first electrically conductive layer 146. All other first electrically conductive layers 146 located in the lower memory block 300L between at least one lower drain side select gate electrode 146D and the at least one lower source side select gate electrode 146S comprise first word lines 146W.

The upper memory block 300U includes at least one upper drain side select gate electrode 246D, which comprises at least one upper most second electrically conductive layer 246, and at least one upper source side select gate electrode 246S, which comprises at least one lower most second electrically conductive layer 246. All other second electrically conductive layers 246 located in the upper memory block 300U between at least one upper drain side select gate electrode 246D and the at least one upper source side select gate electrode 246S comprise second word lines 246W. The memory opening fill structure 58 extends from the lower memory block 300L to the upper memory block 300U through the source layer 110. Thus, the same continuous vertical semiconductor channel 60 contains a lower first portion in the lower memory block 300L, an upper second portion located in the upper memory block 300U and a middle third portion which extends through the source layer 110 and contacts the source contact layer 114 of the source layer 110.

In one embodiment, a set of word line contact via structures 86W of the contact via structures 86 contact a cylindrical sidewall of one first word line 146W and a cylindrical sidewall of one second word line 246W, and may be electrically isolated from all other electrically conductive layers (146, 246). In one embodiment, the remaining contact via structures 86 comprise select gate electrode contact via structures (86SL, 86DL, 86SU, 86DU) which contact a cylindrical sidewall of only one respective select gate electrode (146S, 146D, 246S or 246D), and may be electrically isolated from all other electrically conductive layers (146, 246). This way, each contact via structure 86 may contact either two word lines (one first word line 146W in the lower memory block 300L and one second word line 246W in the upper memory block 300U) or one select gate electrode (146S, 146D, 246S or 246D) in one memory block (300L or 300U). Thus, each contact via structure 86 is either a word line contact via structure or a select gate electrode contact via structure. Each pair of word lines (146W, 246W) in separate blocks may be contacted by the same contact via structure 86, which reduces number of word line contacts and word line selector transistors in the word line driver circuit to be formed separately, as will be described below.

This relaxes the word line contact routing complexity, simplifies the fabrication process and reduces the size of the device.

In one embodiment, each contact via structure 86 may comprise a metallic barrier layer (not expressly shown), and a metallic fill material portion (not expressly shown). In one embodiment, one, a plurality or each of the contact via structures 86 may comprise an encapsulated cavity (i.e., air gap, not expressly shown) that is free of any solid phase material therein. Alternatively, at least one etch back process may be employed in conjunction with multiple deposition processes to prevent formation of or to reduce the sizes of the encapsulated cavities. Each contiguous combination of a contact via structure 86 and a vertical stack of annular dielectric spacers 82 is herein referred to as a layer contact assembly 28.

In one embodiment, an entirety of an interface between one, a plurality and/or each of the contact via structures 86 and a respective one of the electrically conductive layers (146, 246) may be located within a respective cylindrical vertical plane. In one embodiment, the contact via structures 86 may comprises side-contact via structures which do not contact any horizontal surface of the electrically conductive layers (146, 246).

In one embodiment, a vertical stack of annular dielectric spacers 82 may laterally surround each contact via structure 86. Thus, each contact via structure 86 may be laterally surrounded by a respective vertical stack of annular dielectric spacers 82. The contact via structure 86 is in contact with an inner cylindrical sidewall of each annular dielectric spacer 82 within the vertical stack of annular dielectric spacers 82.

For each contact via structure 86, each electrically conductive layer (146, 246) within the at least one alternating stack {(132, 146), (232, 246)} except a respective select gate electrode or a respective pair of word lines (146W, 246W) can be laterally spaced from and can be electrically isolated from the contact via structure 86 by a respective one of the annular dielectric spacers 82. Each contact via structure 86 can vertically extend through each layer within the first-tier alternating stack (132, 146) and the second-tier alternating stack (232, 246), and can contact a sidewall of a respective select gate electrode (146S, 146D, 246S, 246D), or a pair of a first word line 146W in the lower memory block 300L and a second word line 246W in the upper memory block 300U.

In one embodiment, for each contact via structure 86, each of the annular dielectric spacers 82 comprises a respective outer cylindrical sidewall that is laterally offset outward from a respective inner cylindrical sidewall by a respective lateral offset distance that is independent of an azimuthal angle from a vertical axis VA passing through a geometrical center GC of the contact via structure 86. All lateral offset distances of the annular dielectric spacers 82 can be the same. A geometrical center of an element refers to the center of gravity of a hypothetical object occupying the same volume as the element and having a uniform density throughout. In one embodiment, for each contact via structure 86, each of the insulating layers (132, 232) within the at least one alternating stack comprises a respective cylindrical sidewall that contacts the contact via structure 86.

In one embodiment, backside blocking dielectric layers 44 can be located between each vertically neighboring pair of an insulating layer (132, 232) and an electrically conductive layer (146, 246) within the at least one alternating stack. In one embodiment, each contact via structure 86 can be in contact with two cylindrical surface segments of a backside blocking dielectric layers 44 of the backside blocking dielectric layers 44. Each of the two cylindrical surface segments may have a height that is the same as the thickness of the backside blocking dielectric layers 44.

In one embodiment, each of the electrically conductive layers (146, 246) comprises a respective combination of a metallic barrier liner and a metallic fill material portion. In one embodiment, each contact via structure 86 may be in contact with a metallic barrier liner of a respective one of the electrically conductive layers (146, 246), and is laterally spaced from a metallic fill material portion of the respective one of the electrically conductive layers.

Figure 25A:
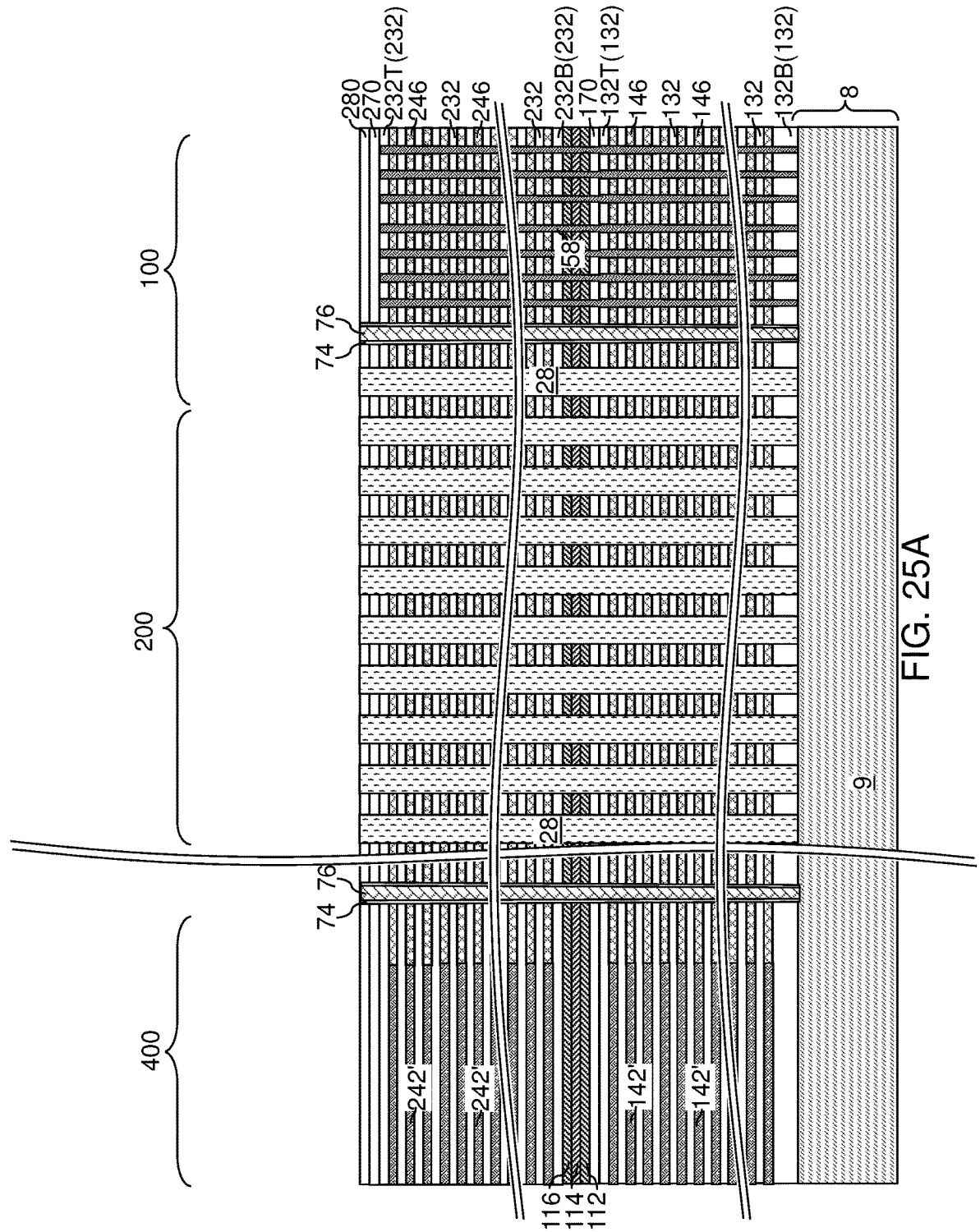
FIG. 25A is a vertical cross-sectional view of the first exemplary structure after formation of the contact via structures according to the first embodiment of the present disclosure.
Figure 25B:
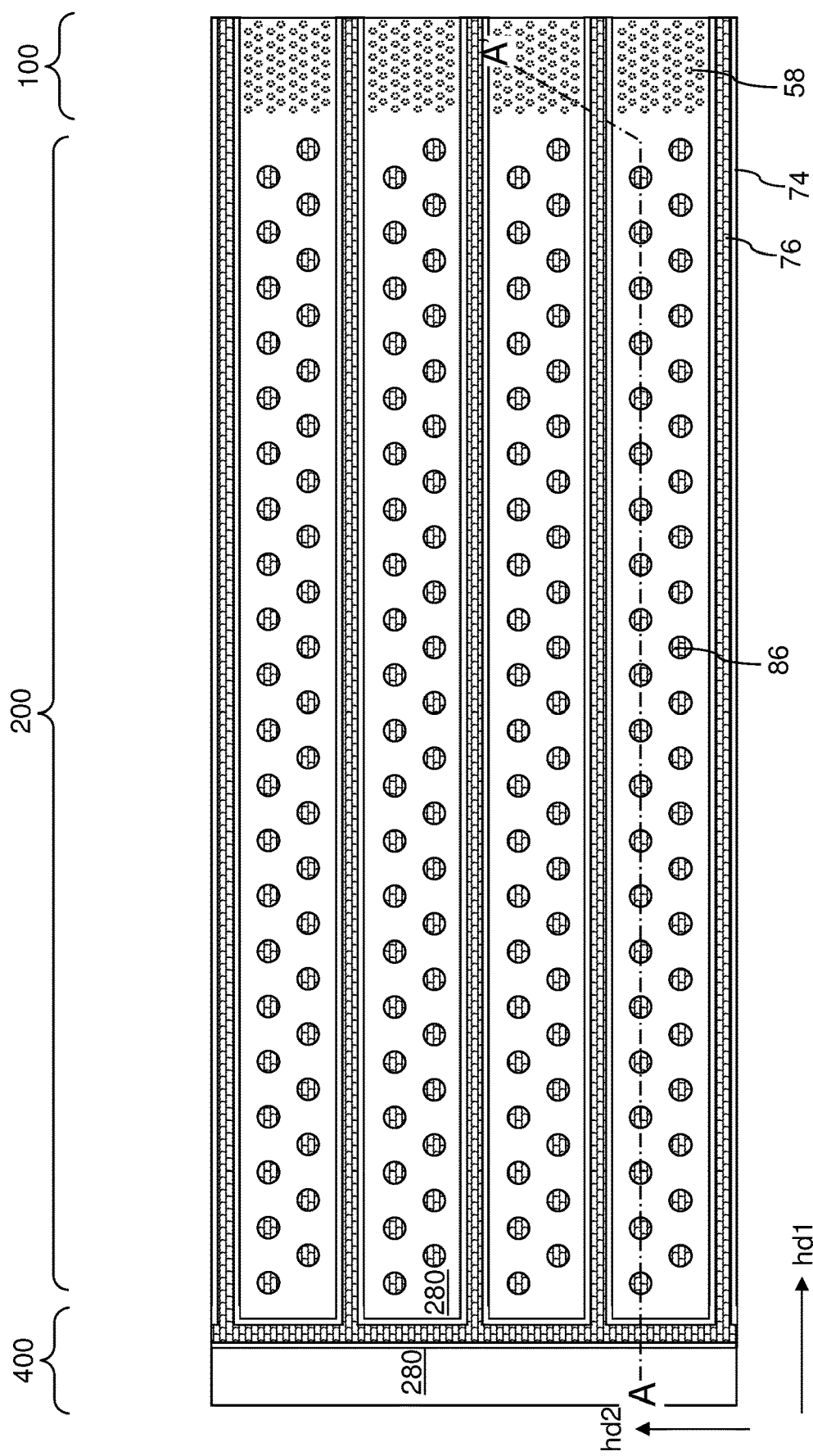
FIG. 25B is a top-down view of the first exemplary structure of FIG. 25A.

Referring to FIGS. 25A and 25B, the first exemplary structure is illustrated after formation of the contact via structures 86.

Figure 26:
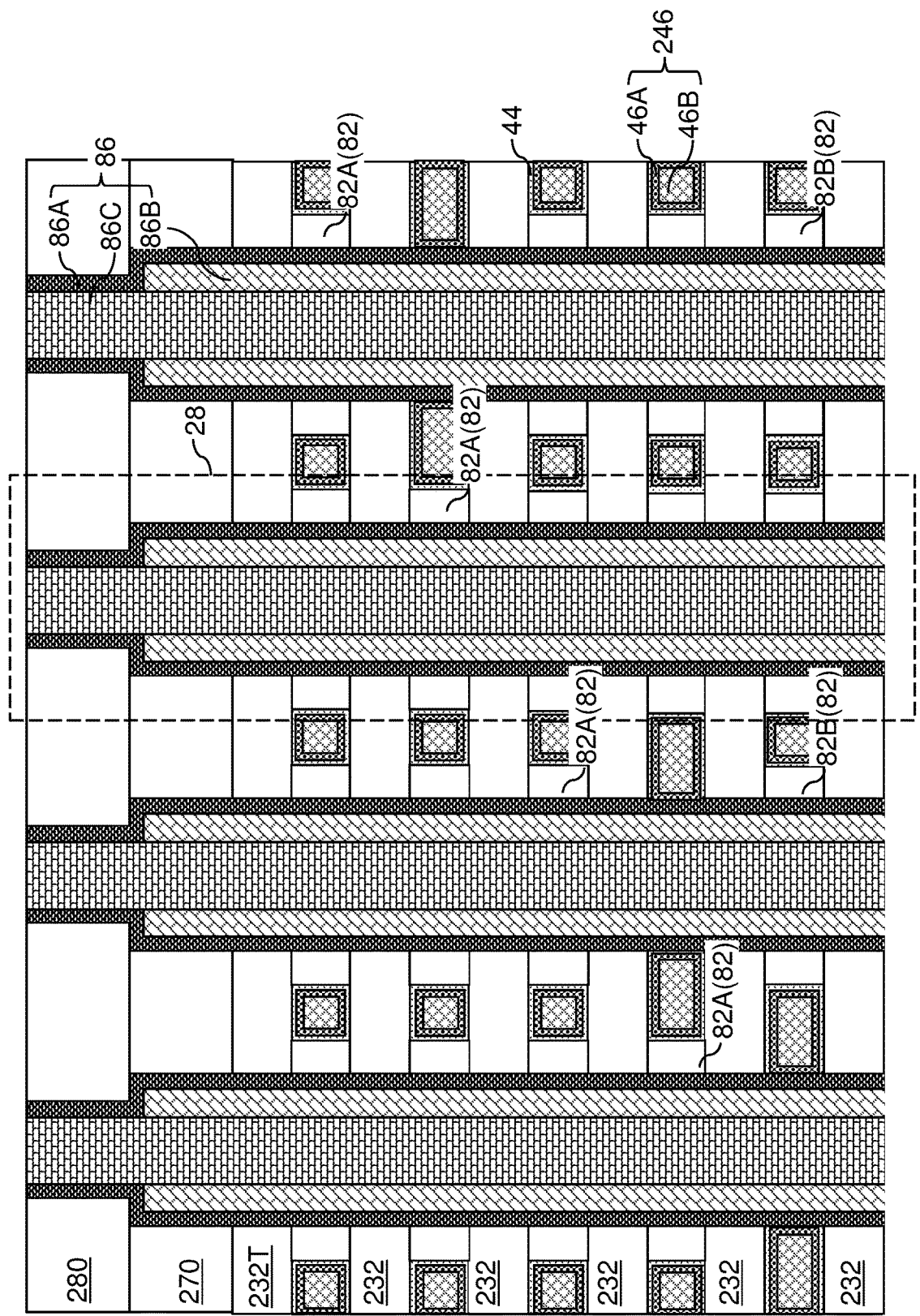
FIG. 26 is a vertical cross-sectional view of the contact region of a first configuration of the first exemplary structure after formation of the contact via structures according to the first embodiment of the present disclosure.

Referring to FIG. 26, the contact region 200 of a first configuration of the first exemplary structure is illustrated after formation of the contact via structures 86. Each contact via structure 86 may be formed without a void therein by forming a respective metallic barrier layer 86A through a first conformal deposition process, by forming a respective first metallic fill material portion 86B by conformally depositing and anisotropically etching a first metallic fill material, and by forming a second metallic fill material portion 86C by conformally depositing a second metallic fill material.

Figure 27:
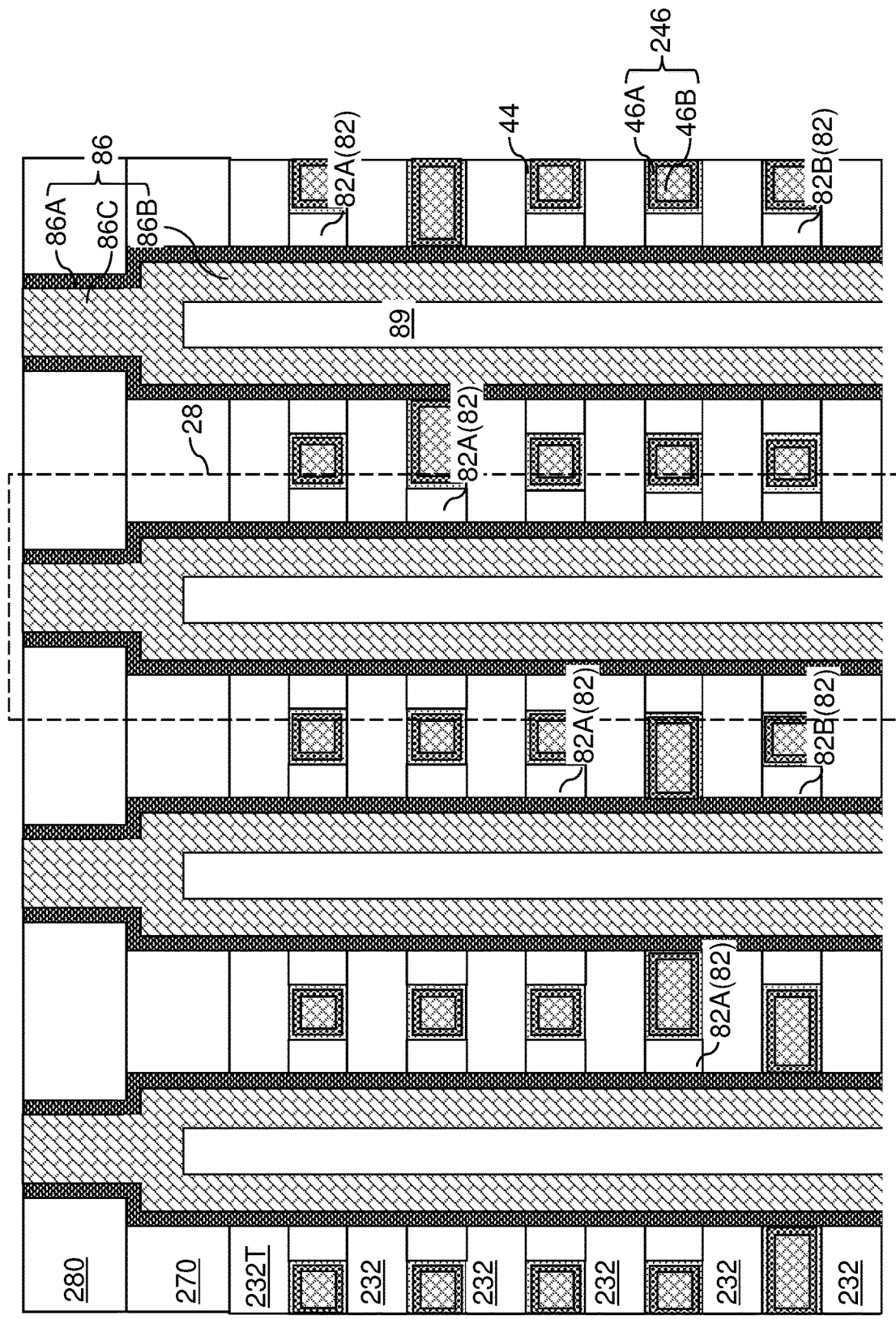
FIG. 27 is a vertical cross-sectional view of the contact region of a second configuration of the first exemplary structure after formation of the contact via structures according to the first embodiment of the present disclosure.

Referring to FIG. 27, the contact region 200 of a second configuration of the first exemplary structure is illustrated after formation of the contact via structures 86. Each contact via structure 86 may comprise a respective metallic barrier layer 86A, a respective metallic fill material portion 86B, and a respective encapsulated cavity (i.e., air gap) 89 that is free of any solid phase material and located inside the respective metallic fill material portion 86B.

Figure 28:
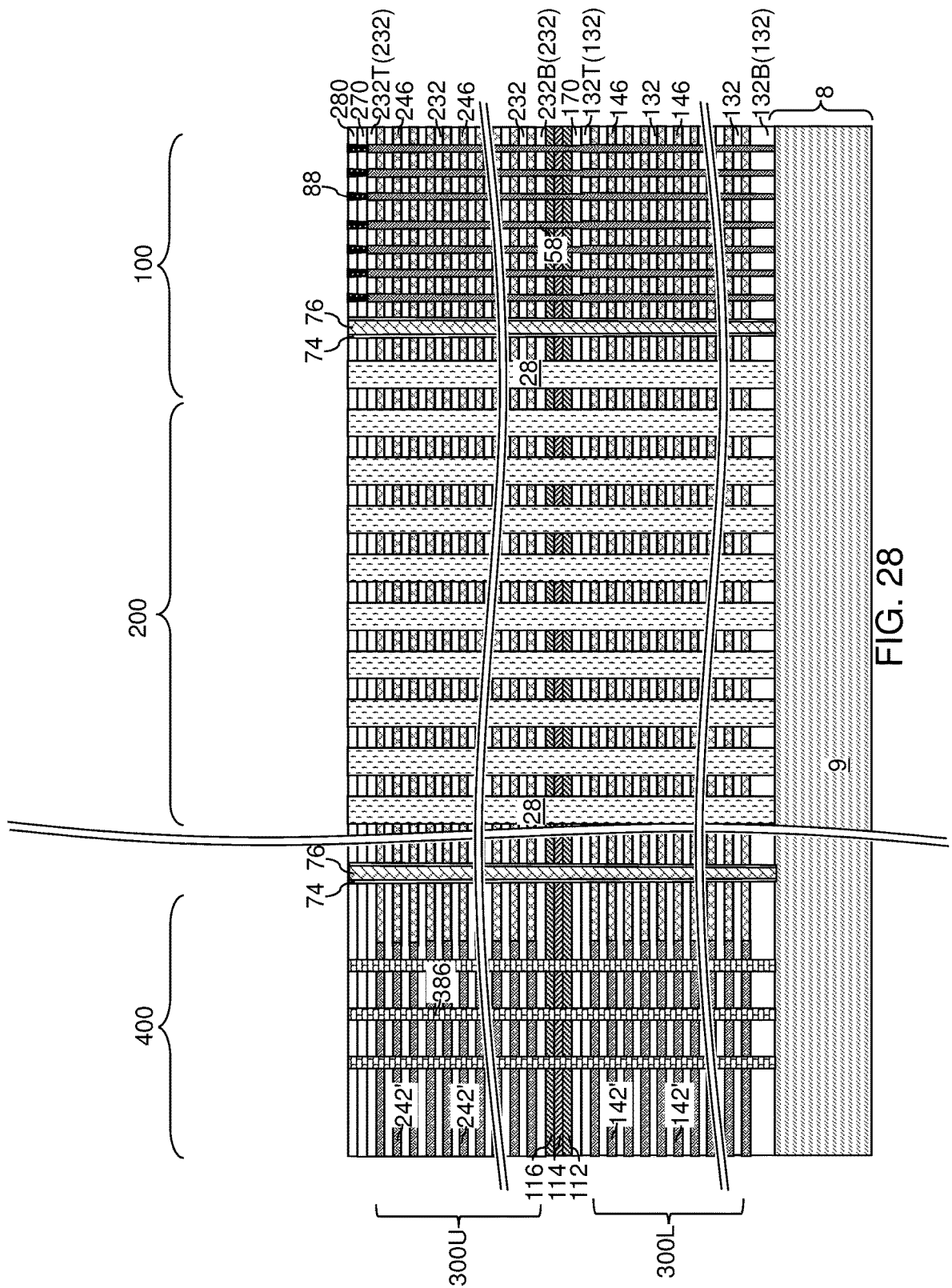
FIG. 28 is a vertical cross-sectional view of the first exemplary structure after formation of drain contact via structures according to the first embodiment of the present disclosure.

Referring to FIG. 28, additional conductive via structures (88, 386) can be formed. The additional conductive via structures (88, 386) may comprise, for example, top drain contact via structures 88 (which are also referred to second drain contact via structures 88) that are formed through the contact-level dielectric layer 280 directly on a top surface of a respective one of the top drain regions 63 in the upper memory block 300U, and connection via structures 386 that may be formed in the connection region 400 through as stack of dielectric material plates (142', 242') (which are remaining portions of the sacrificial material layers (142, 242)) and through each of the insulating layers (132, 232).

Figure 29:
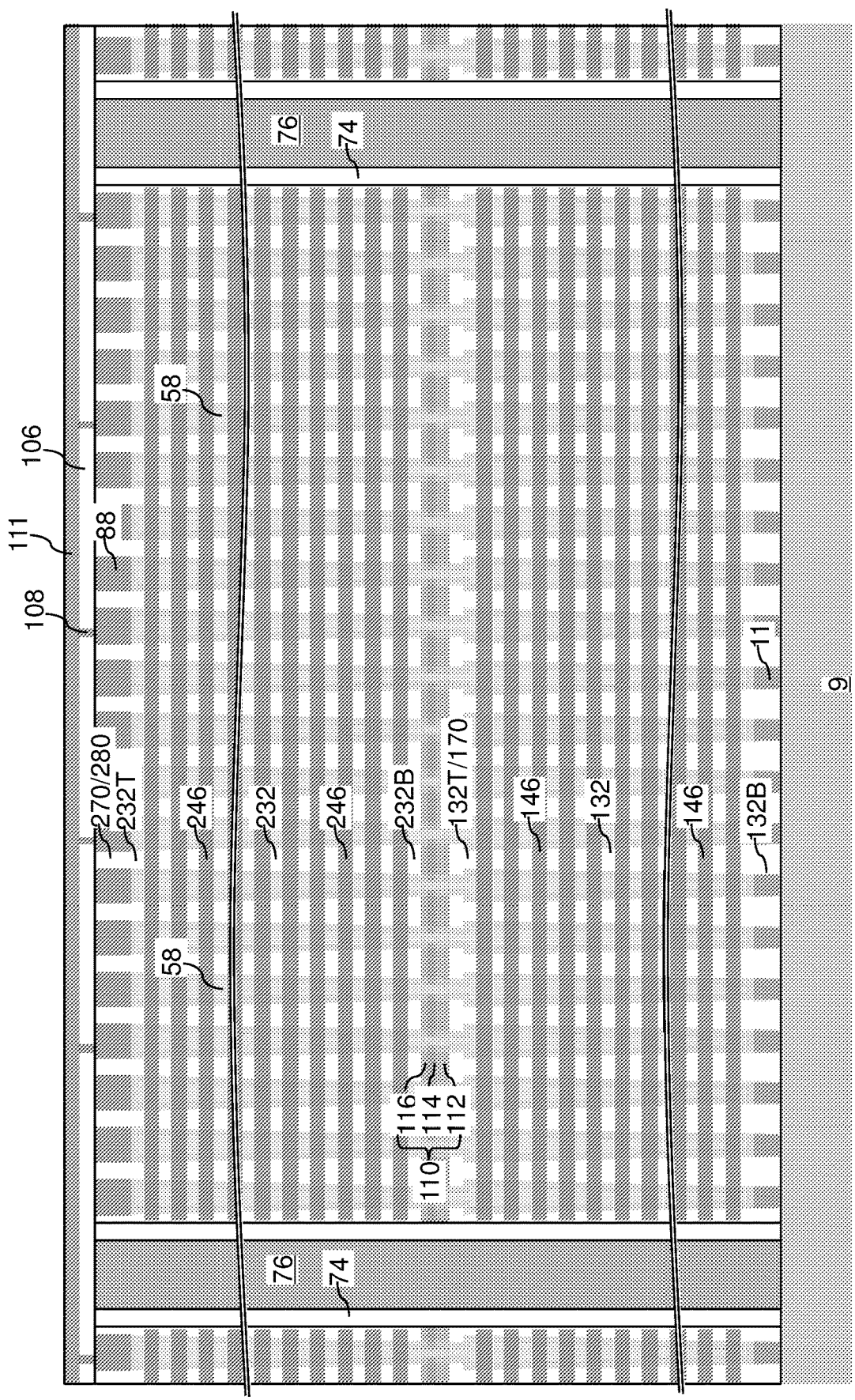
FIG. 29 is a vertical cross-sectional view of the first exemplary structure after formation of first connection via structures and first bit lines according to the first embodiment of the present disclosure.

Referring to FIG. 29, upper metal interconnect structures and upper dielectric material layers may be formed above the contact-level dielectric layer 280. For example, first bit-line-level dielectric material layers 106 may be formed over the contact-level dielectric layer 280, and first bit-line-connection via structures 108 in electrical contact with the top drain contact via structure 88. First bit lines 111 may be formed over the bit-line-level dielectric material layers 106. Each top drain region 63 may be electrically connected to a respective first bit line 111 through a respective top drain contact via structure 88 and a respective first bit-line-connection via structure 108.

Figure 30:
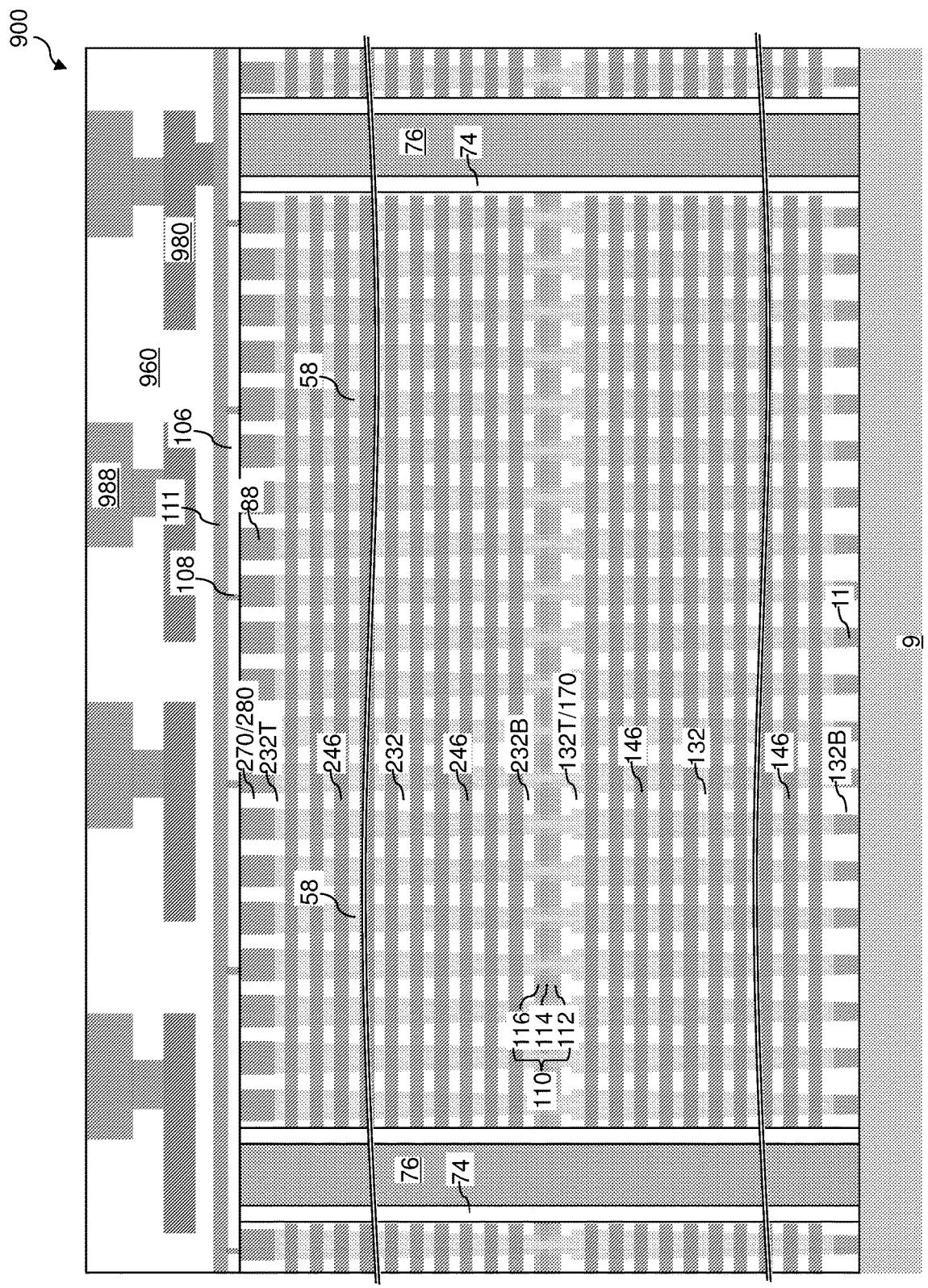
FIG. 30 is a vertical cross-sectional view of the first exemplary structure after formation of memory-side metal interconnect structures and memory-side bonding pads according to the first embodiment of the present disclosure.

Referring to FIG. 30, additional upper metal interconnect structures 980 and additional upper dielectric material layers 960 may be formed. Generally, the upper metal interconnect structures (108, 110, 980) can be configured to provide electrical connection to and between the various electrical nodes of the three-dimensional memory device including the alternating stacks {(132, 146), (232, 246)} and the memory opening fill structures 58. Memory-side bonding pads 988 can be formed in the topmost level of the upper dielectric material layers 960. Generally, the upper metal interconnect structures 980 can be embedded within the upper dielectric material layers 960, and can be formed over the second-tier alternating stack (232, 246). The memory-side bonding pads 988 can be formed on or within a topmost dielectric layer of the upper dielectric material layers 960. A memory die 900 is formed, which comprises all elements between the backside surface of the substrate material layer 9 and the topmost surfaces of the memory-side bonding pads 988.

Figure 31:
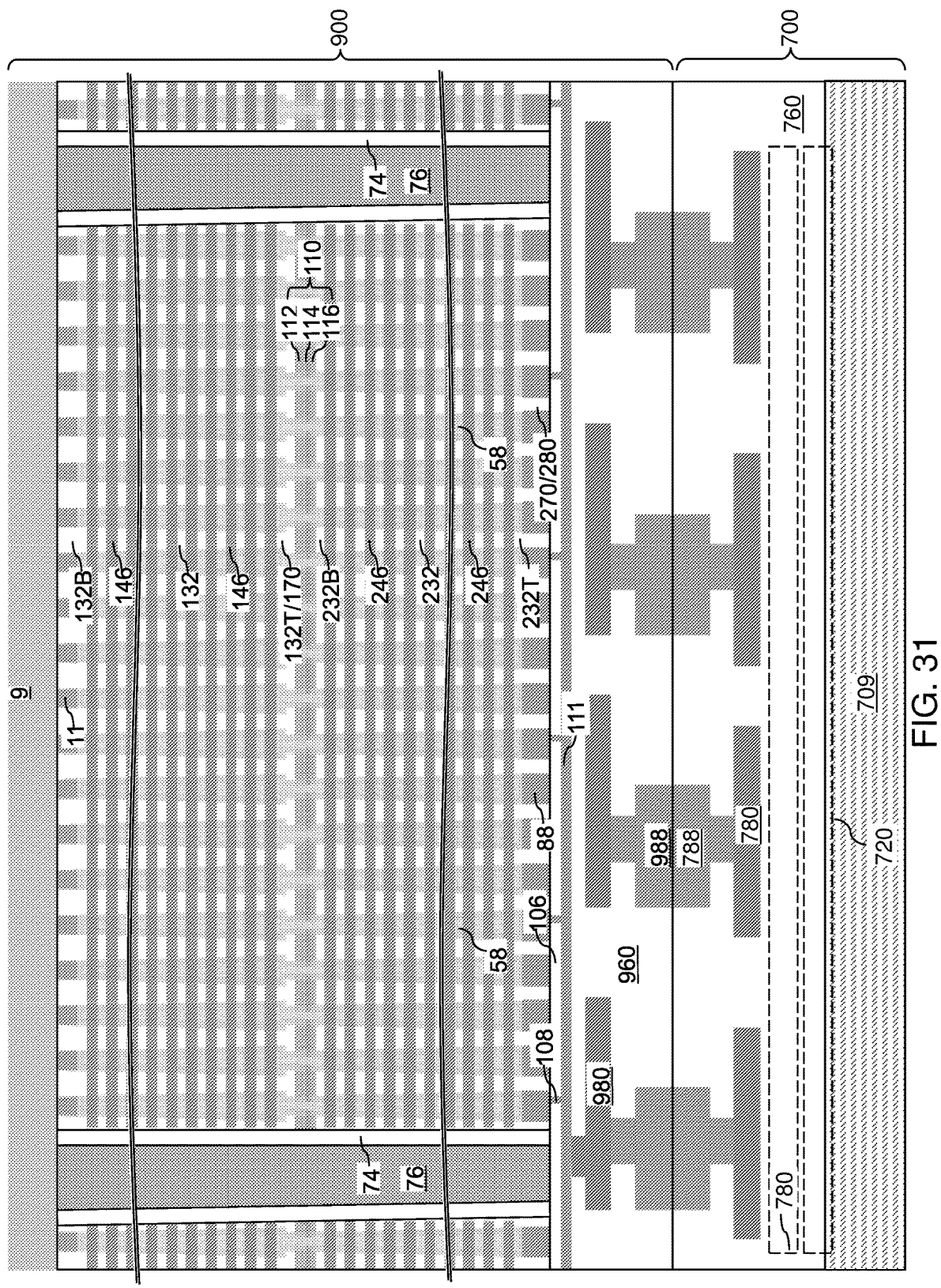
FIG. 31 is a vertical cross-sectional view of the first exemplary structure after bonding a logic die to a memory die according to the first embodiment of the present disclosure.

Referring to FIG. 31, a logic die 700 can be provided. The logic die 700 comprises a logic-side substrate 709 (which may be a semiconductor substrate, such as a silicon wafer), logic-side semiconductor devices 720 which function as a peripheral circuitry for controlling operation of the three-dimensional memory device within the memory die 900, logic-side metal interconnect structures 780 embedded within logic-side dielectric material layers 760, and logic-side bonding pads 788 configured to mate with the memory-die bonding pads 988. Generally, the logic-side semiconductor devices 720 comprise a control circuitry configured to control operation of the vertical stack of first memory elements (i.e., cells) of the lower memory block 300L and the vertical stack of second memory elements (i.e., cells) of the upper memory block 300U within each memory opening fill structure 58 in the memory die 900.

The logic-side semiconductor devices 720 may be electrically connected to the logic-side bonding pads 788 through the logic-side metal interconnect structures 780. The logic die 700 can be attached to the memory die 900, for example, by bonding the memory-side bonding pads 988 with the logic-side bonding pads 788. For example, the memory-side bonding pads 988 can be bonded with the logic-side bonding pads 788 by metal-to-metal bonding, such as copper-to-copper bonding. In some embodiments, hybrid bonding may be employed, in which contacting surfaces of the upper dielectric material layers 960 and the logic-side dielectric material layers 760 are bonded through dielectric-to-dielectric bonding (such as oxide-to-oxide bonding).

Figure 32A:
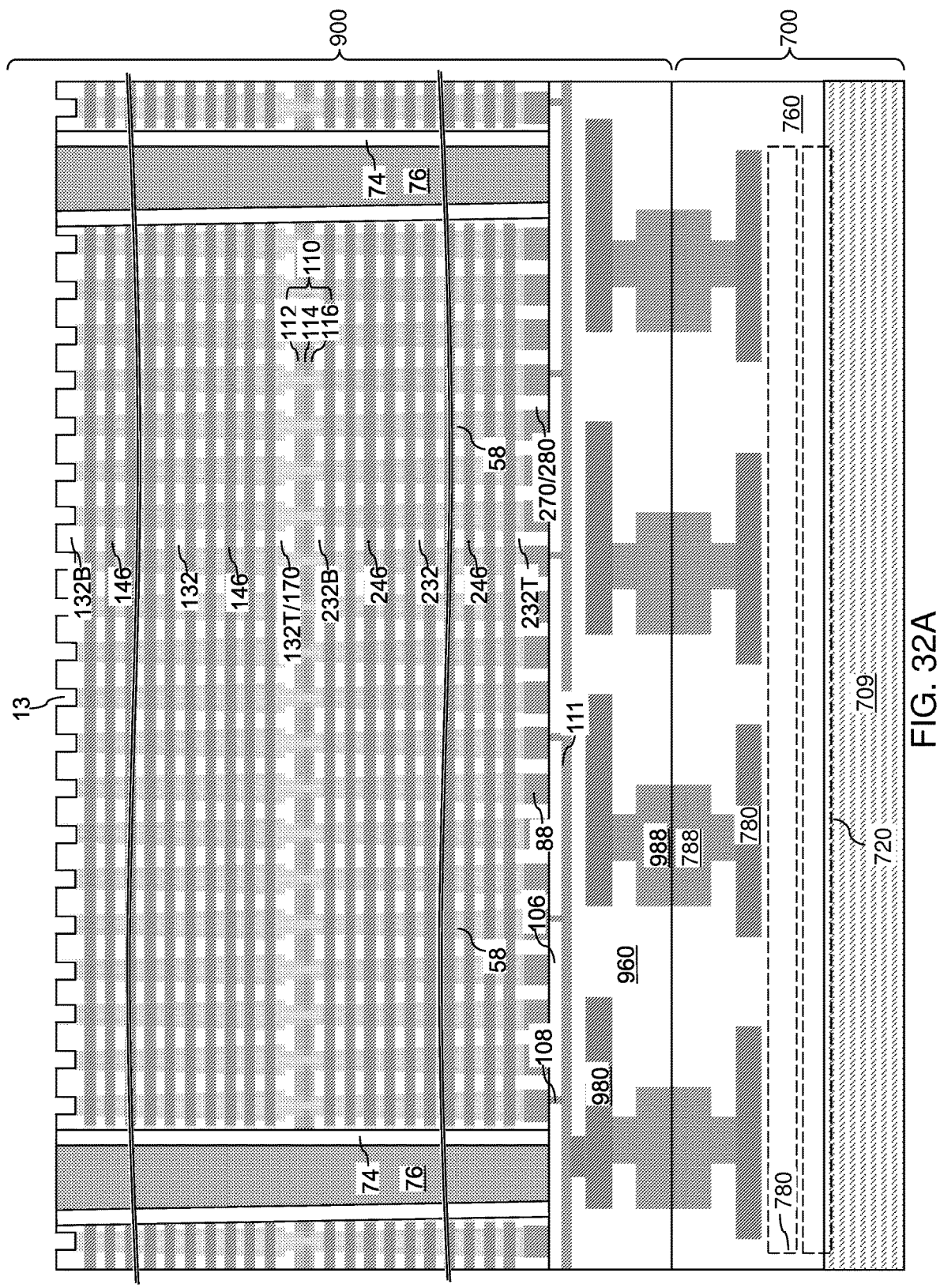
FIG. 32A is a vertical cross-sectional view of the first exemplary structure after removal of a carrier substrate and sacrificial via structures according to the first embodiment of the present disclosure.
Figure 32B:
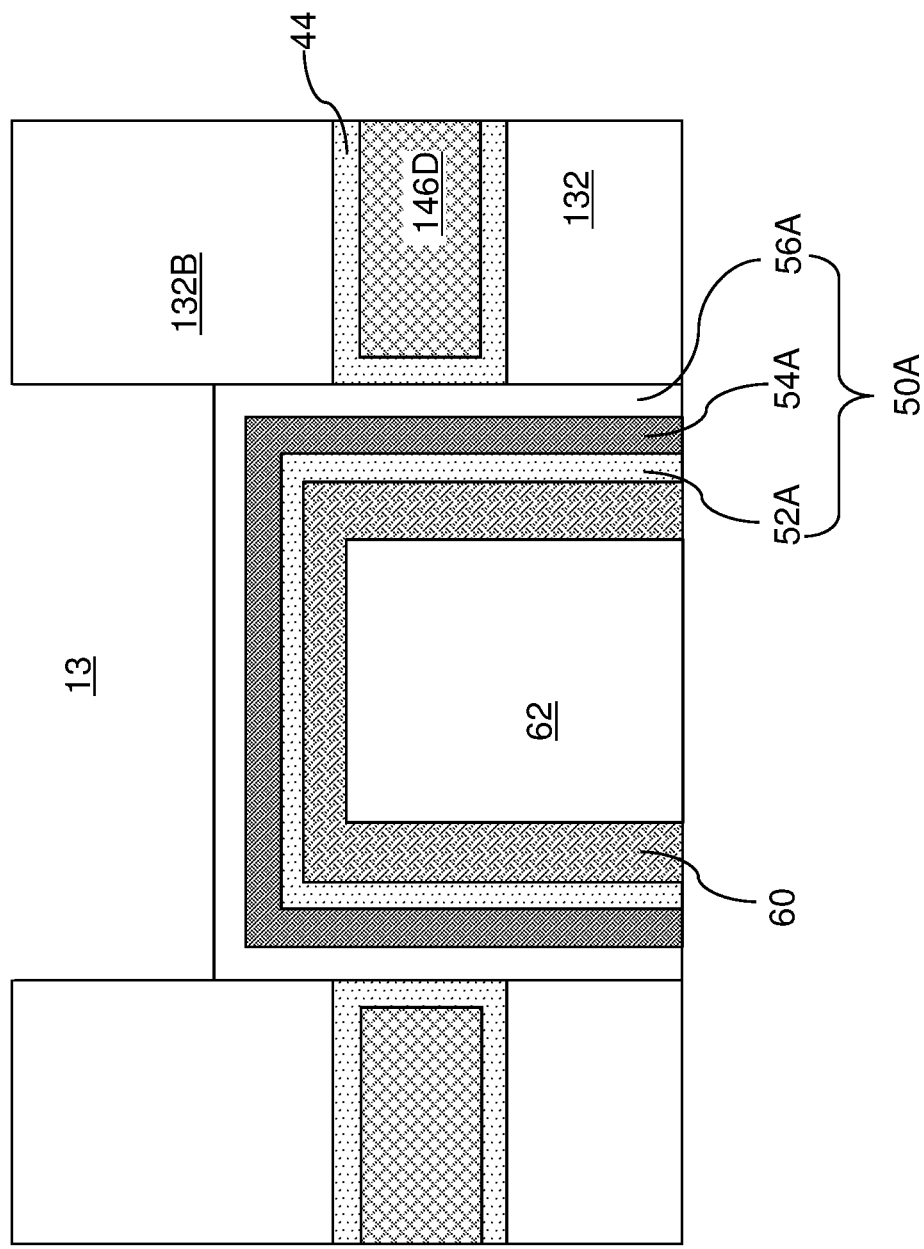
FIG. 32B is a magnified view of a region around an end portion of a memory opening fill structure in the first exemplary structure of FIG. 32A

Referring to FIGS. 32A and 32B, the substrate 8 (which can be a carrier substrate) including the substrate material layer 9 can be removed, for example, by grinding, polishing, an anisotropic etch process, and/or an isotropic etch process. Alternatively, the substrate 8 may be removed by cleaving. Horizontal bottom surfaces of the sacrificial via structures 11 that do not contact the first memory films 50A can be physically exposed upon removal of the substrate 8. Further, bottom surfaces of the contact via structures 86 can be physically exposed upon removal of the substrate 8. The first exemplary structure may be inverted, i.e., flipped, as needed.

Subsequently, a selective etch process can be performed to remove the sacrificial via structures 11 selective to the materials of the bottommost first insulating layer 132B, the contact via structures 86, and the first memory films 50A. In an illustrative example, if the sacrificial via structures 11 comprise silicon, then a wet etch process employing hot trimethyl-2 hydroxyethyl ammonium hydroxide ("hot TMY") or tetramethyl ammonium hydroxide (TMAH) may be performed to remove the sacrificial via structures 11. Cavities can be formed in the volumes from which the sacrificial via structures 11 removed. The cavities are herein referred to as bottom drain cavities 13.

Figure 33A:
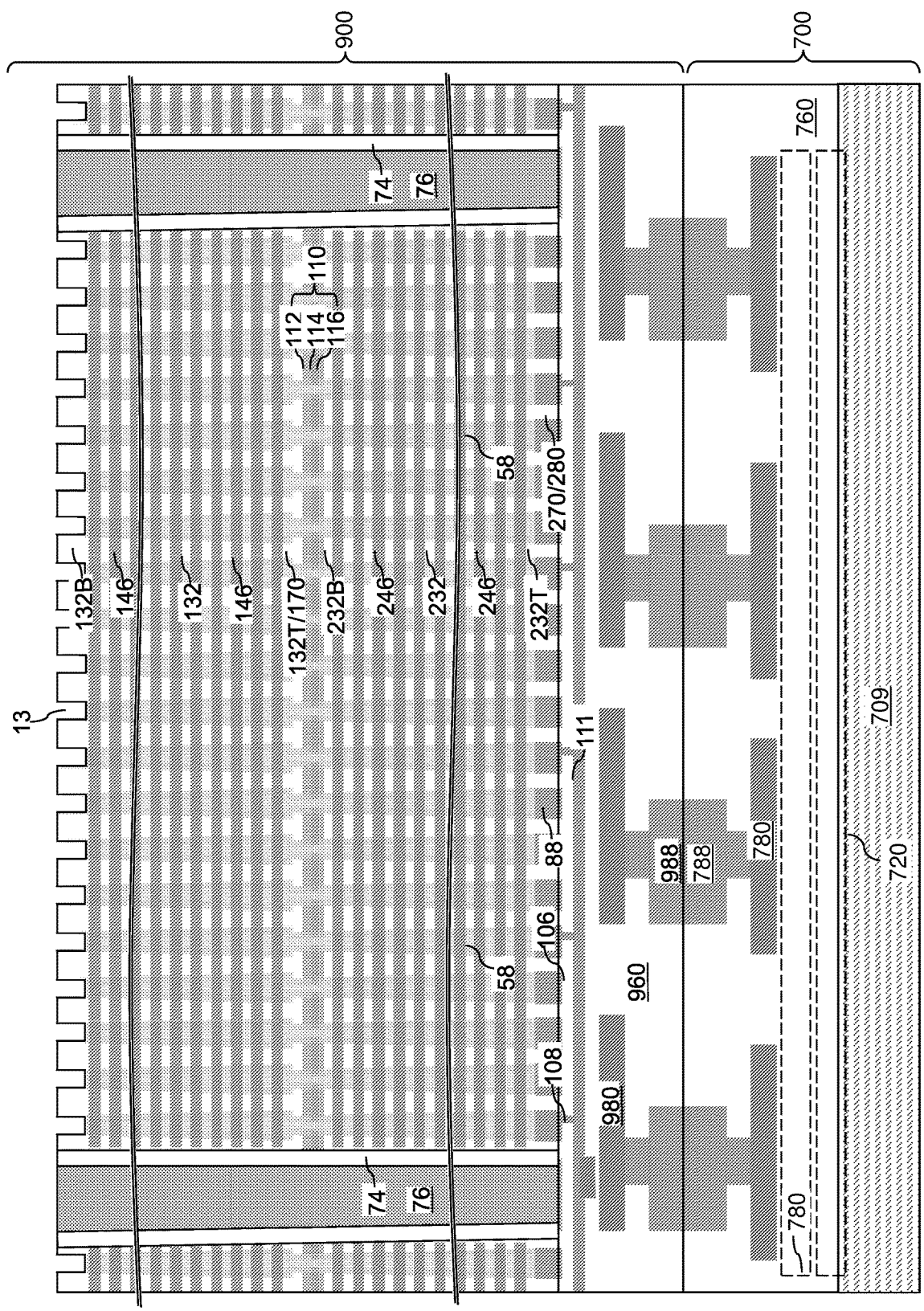
FIG. 33A is a vertical cross-sectional view of the first exemplary structure after removal of end portions of memory films according to the first embodiment of the present disclosure.
Figure 33B:
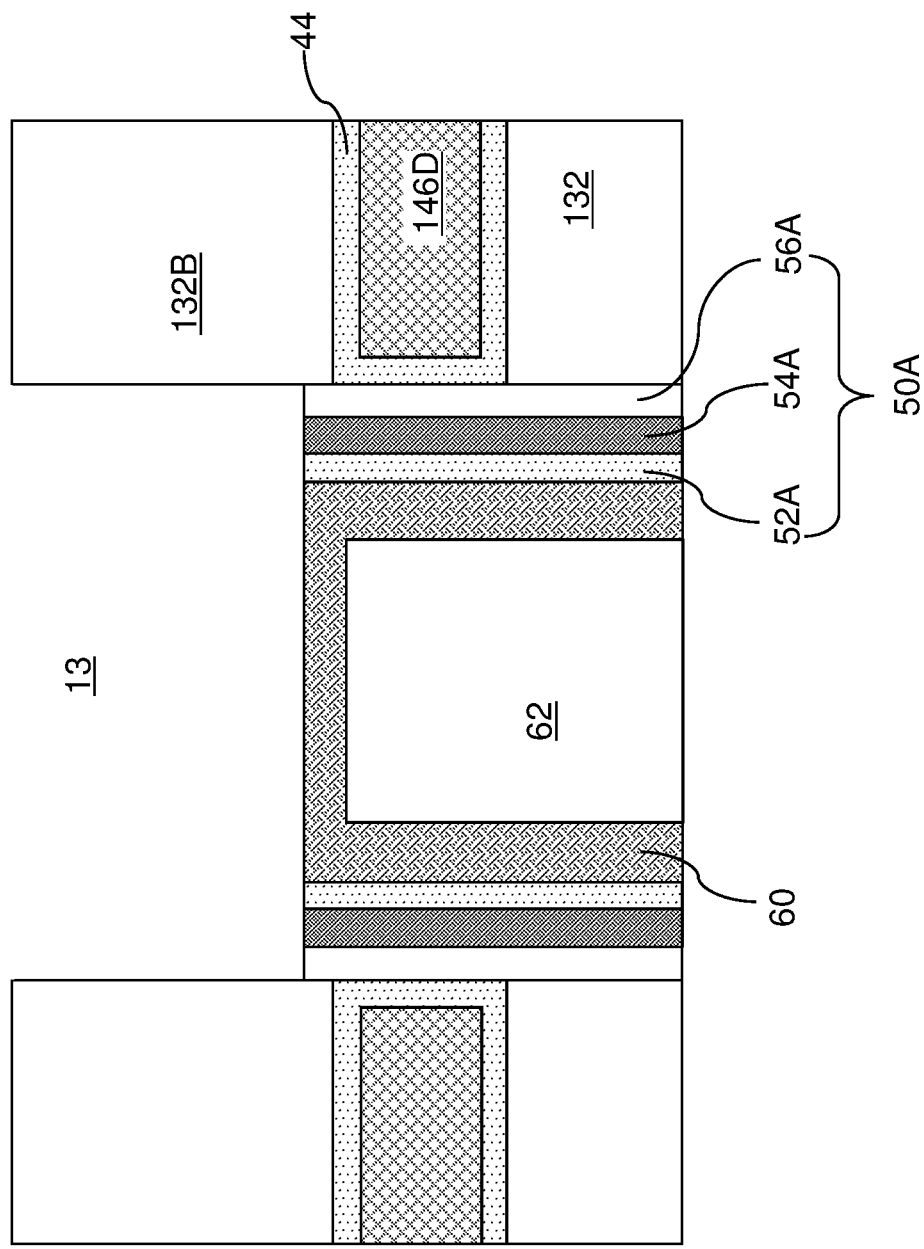
FIG. 33B is a magnified view of a region around an end portion of a memory opening fill structure in the first exemplary structure of FIG. 33A.

Referring to FIGS. 33A and 33B, a sequence of etch processes can be performed to remove horizontally-extending portions of the first memory films 50A that are more distal from the layer 110 than the most distal portions of the vertical semiconductor channels 60 located within the first-tier alternating stack (132, 146). For example, portions of the first dielectric liners 56A, the first memory material layers 54A, and the first blocking dielectric layers 52A that are proximal to the bottom drain cavities 13 can be sequentially removed by wet etch processes. End portions of the first memory films 50A can be removed. A bottommost surface of each vertical semiconductor channel 60 (when viewed with the second-tier alternating stack (232, 246) above the first-tier alternating stack (132, 146)) can be physically exposed.

Figure 34:
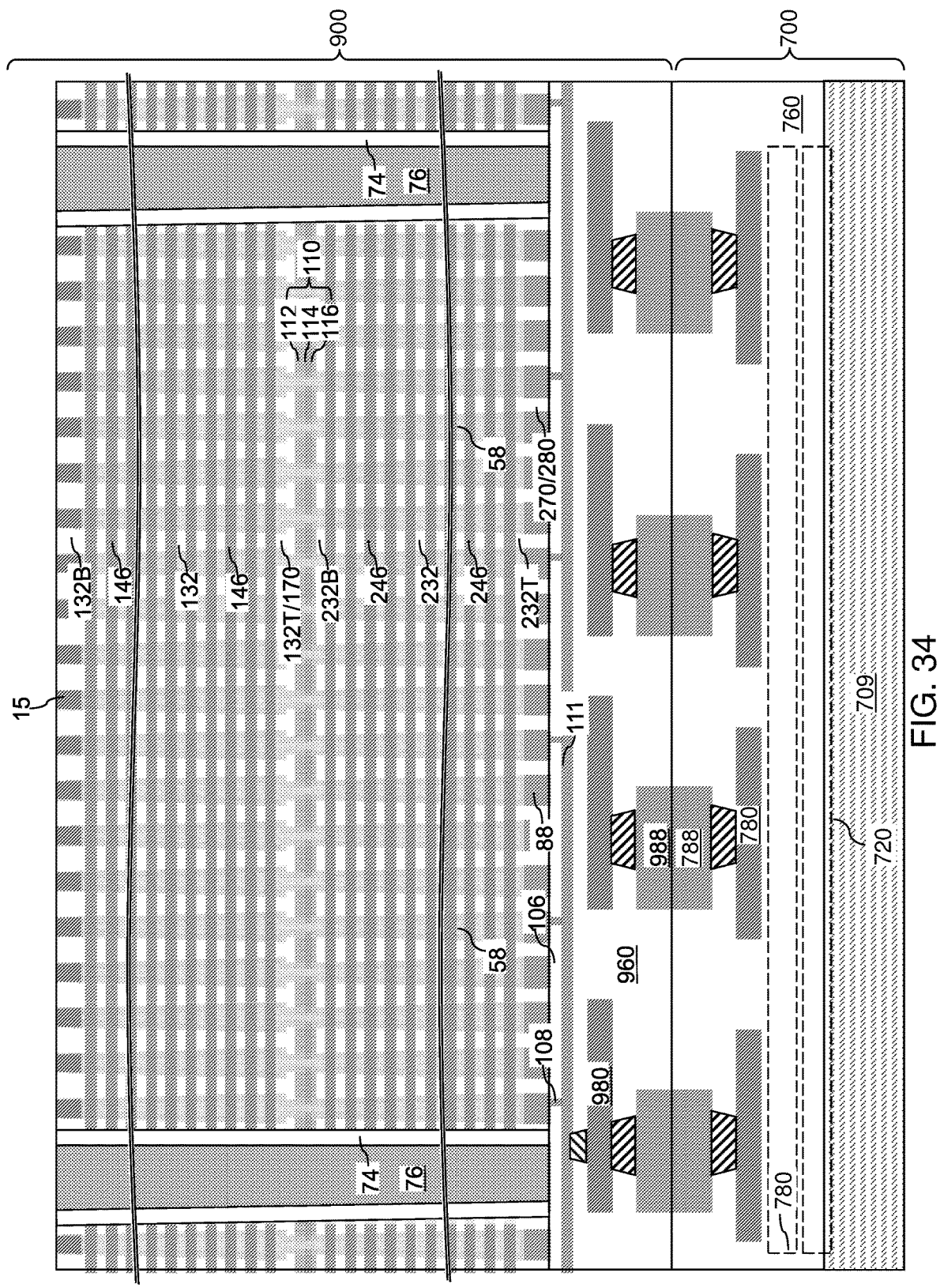
FIG. 34 is a vertical ross-sectional view of the first exemplary structure after formation of bottom drain regions according to the first embodiment of the present disclosure.

Referring to FIG. 34, a doped semiconductor material having a doping of the second conductivity type can be deposited in the bottom drain cavities 13. Excess portions of the doped semiconductor material can be removed from outside the bottom drain cavities 13 by a planarization process, which may employ a chemical mechanical polishing (CMP) process or a recess etch process. Each remaining portion of the doped semiconductor material filling a respective bottom drain cavity 13 constitutes a bottom drain region 15. A bottom drain region 15 can be formed on the bottommost surface of each vertical semiconductor channel 60. In one embodiment, the bottom drain regions 15 may have the same material composition as the top drain regions 63. Generally, a bottom drain region 15 can be formed on the bottommost surface of each vertical semiconductor channel 60 after formation of the source contact layer 114 and after removal of a carrier substrate.

In one embodiment, each bottom drain region 15 can be formed below a level of a bottommost first electrically conductive layer 146 of the first electrically conductive layers 146. Each bottom drain region 15 contacts a bottom end portion of a respective vertical semiconductor channel 60. In one embodiment, each bottom drain region 15 may be in direct contact with an annular bottommost surface of a respective first memory film 50A. In one embodiment, each bottom drain region 15 contacts a bottommost horizontally-extending surface of a respective vertical semiconductor channel 60.

Figure 35:
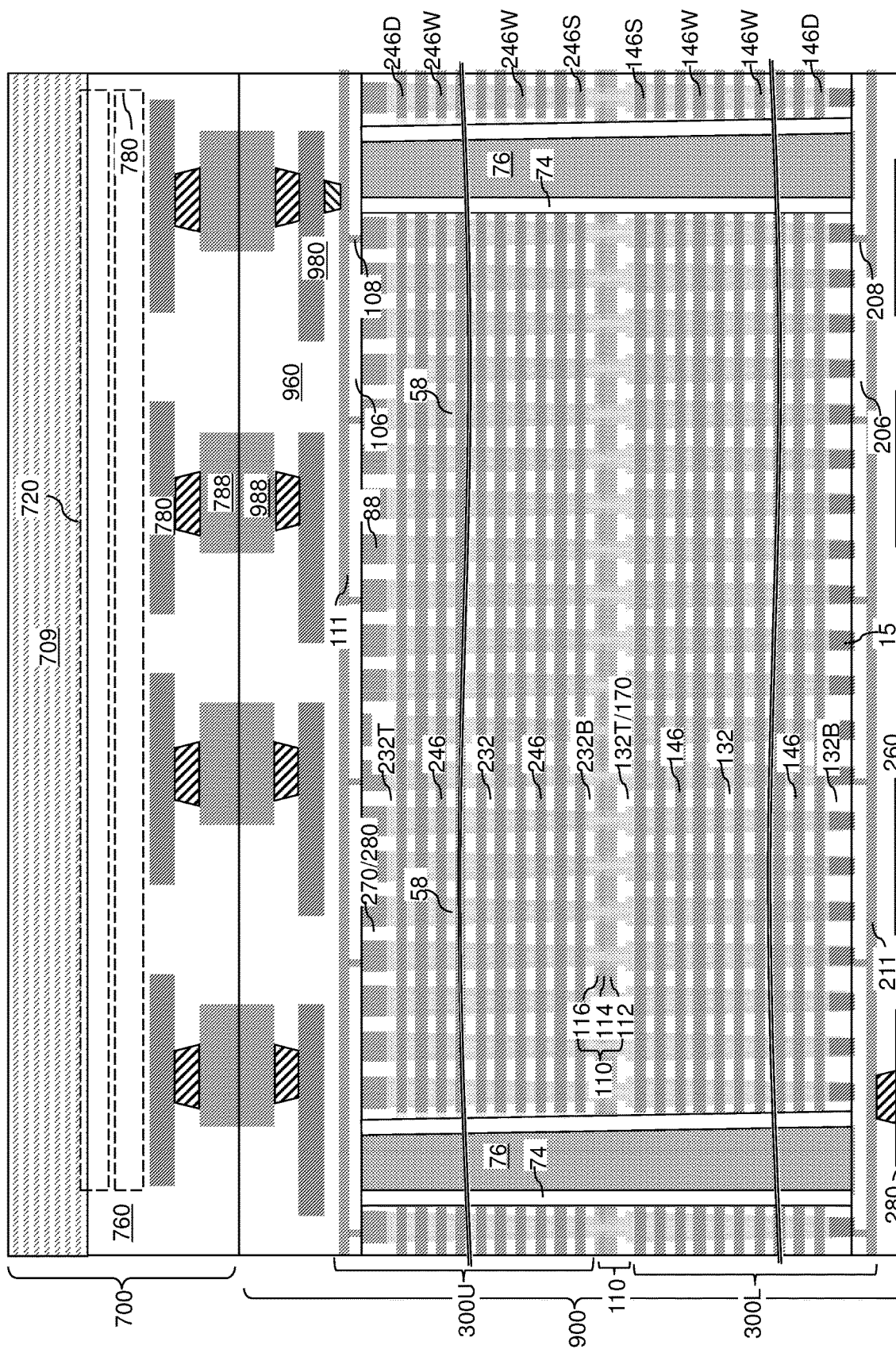
FIG. 35 is a vertical cross-sectional view of the first exemplary structure after formation of bottom drain connection via structures and second bit lines according to the first embodiment of the present disclosure.

Referring to FIG. 35, second bit-line-level dielectric material layers 206 may be formed over the bottommost first insulating layer 132B, and second bit-line-connection via structures 208 are formed in vias through the second bit-line-level dielectric material layers 206. Second bit lines 211 are formed over the second bit-line-level dielectric material layers 206 and in contact with the second bit-line-connection via structures 208. Each bottom drain region 15 may be electrically connected to a respective second bit line 211 through a respective second bit-line-connection via structure 208. Additional lower metal interconnect structures 280 and additional lower dielectric material layers 260 may be formed over the second bit-line-level dielectric material layers 206.

Generally, a subset of the lower metal interconnect structures 280 is electrically connected to the bottom drain region 15. In one embodiment, the memory-side bonding pads 988 may be electrically connected to the upper metal interconnect structures 980, and may be electrically connected to the lower metal interconnect structures 280 through the connection via structures 386. A subset of the upper metal interconnect structures 980 is electrically connected to the top drain regions 63, and a subset of the lower metal interconnect structures 280 is electrically connected to the bottom drain regions 15.

Referring to FIGS. 24D and 35, the memory device may operate as follows. To program a selected memory cell in a selected upper memory block 300U, a programming voltage is applied to the second word line 246W of the selected memory cell, while a pass voltage is applied to the remaining second word lines 246W of the unselected memory cells.

If a word line contact via structures 86W are electrically connected to a pair of a first word line 146W and a second word line 246W, then a programming voltage is applied to the second word line 246W and its corresponding paired first word line 146W through the selected word line contact via structure 86W, while a pass voltage is applied to the remaining unselected first and second word lines (146W, 246W) via the remaining word line contact via structures 86W. A select gate voltage is applied to the upper drain side select gate electrode 246D of the selected memory block, 0V is applied to the lower and upper source side select gate electrodes (146S, 246S), an average of the program and pass voltage is applied to the lower drain side select gate electrode 246D and the bit line 211 of the unselected memory block 300L, and an inhibit voltage or 0V is applied to the bit line of the selected memory block 300U. A low voltage (e.g., 1-2V) is applied to the common source line 110.

To erase the selected memory cell in a selected upper memory block 300U, an erase voltage is applied to the bit line 111 of the selected memory block 300U and to the common source line 110, while the bit line of the unselected memory block 300L is left to float. An intermediate voltage is applied to the drain side and source side select gate electrodes (246D, 246S) of the selected memory block 300U, while 0V is applied to the drain side and source side select gate electrodes (146D, 146S) of the unselected memory block 300L. A very low voltage (e.g., 0.5 to 1V) is applied to all of the word lines (146W, 246W) of the memory device.

In a second embodiment, the layer contact assemblies 28 may be formed employing an alternative sequence of processing steps. In this embodiment, the part of the lower portions contact via assemblies are formed in the first tier before forming the second tier.

FIGS. 36A-36H are sequential vertical cross-sectional views of a contact region 200 in a second exemplary structure during formation of in-process first-tier layer contact assemblies 126 according to the second embodiment of the present disclosure.

Figure 36A:
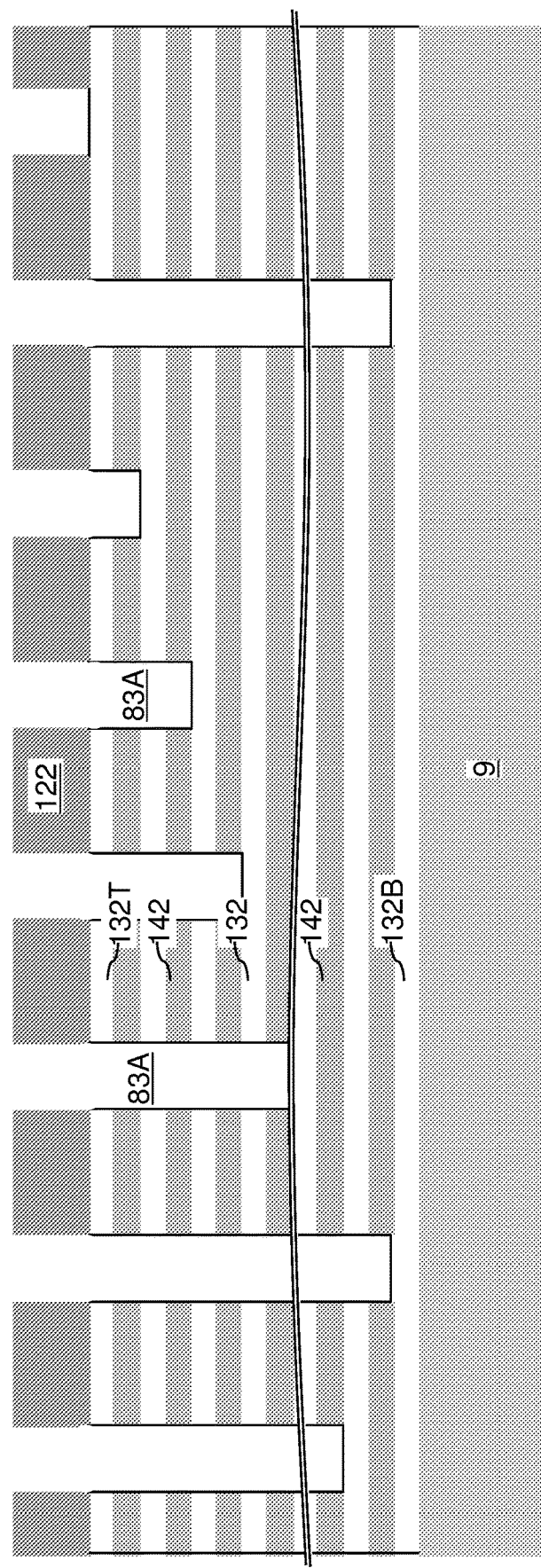
FIGS. 36A-36H are sequential vertical cross-sectional views of a contact region in a second exemplary structure during formation of in-process first-tier layer contact assemblies according to a second embodiment of the present disclosure.

Referring to FIG. 36A, the second exemplary structure may be derived from the first exemplary structure illustrated in FIG. 2 by forming a first patterned hard mask layer 122. The first patterned hard mask layer 122 may have the same pattern, the same material, and the same thickness range, as the patterned hard mask layer 22 illustrated in FIGS. 11A and 11B. The processing steps described with reference to FIG. 12I may be performed to form first-tier in-process contact openings 83A.

Figure 36B:
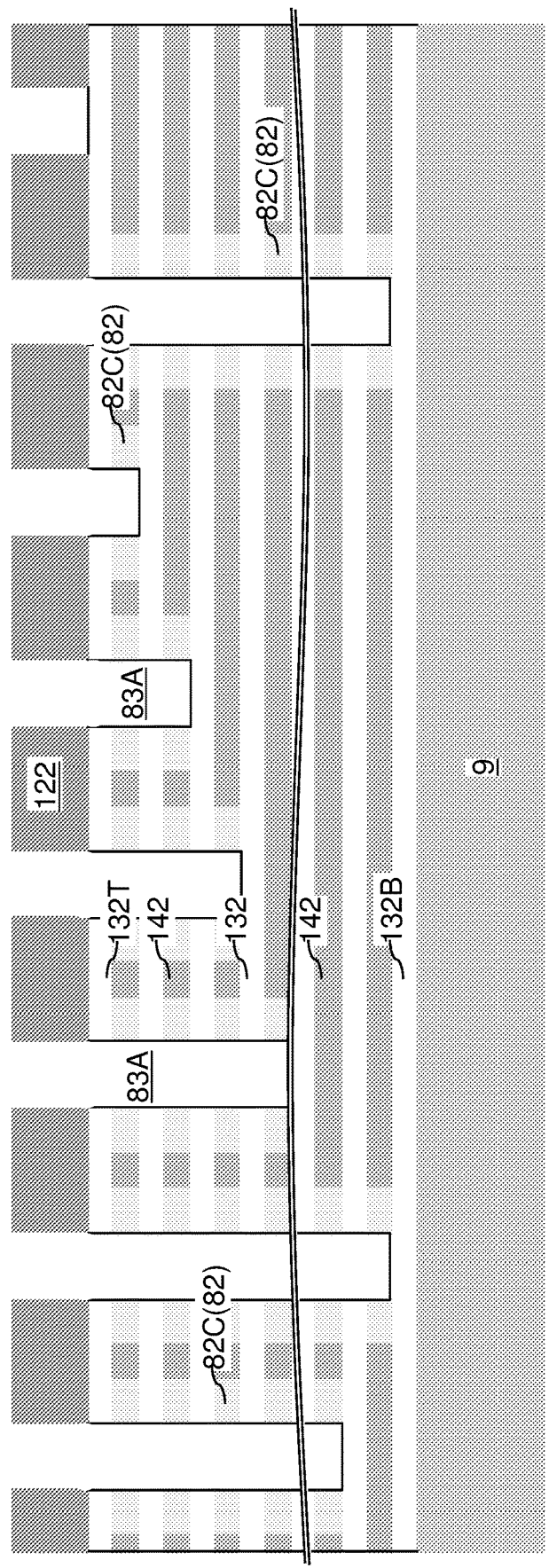

Referring to FIG. 36B, the processing steps described with reference to FIGS. 12J and 12K can be performed to form first-tier upper annular dielectric spacers 82C, which are also referred to as third annular dielectric spacers 82C.

Figure 36C:
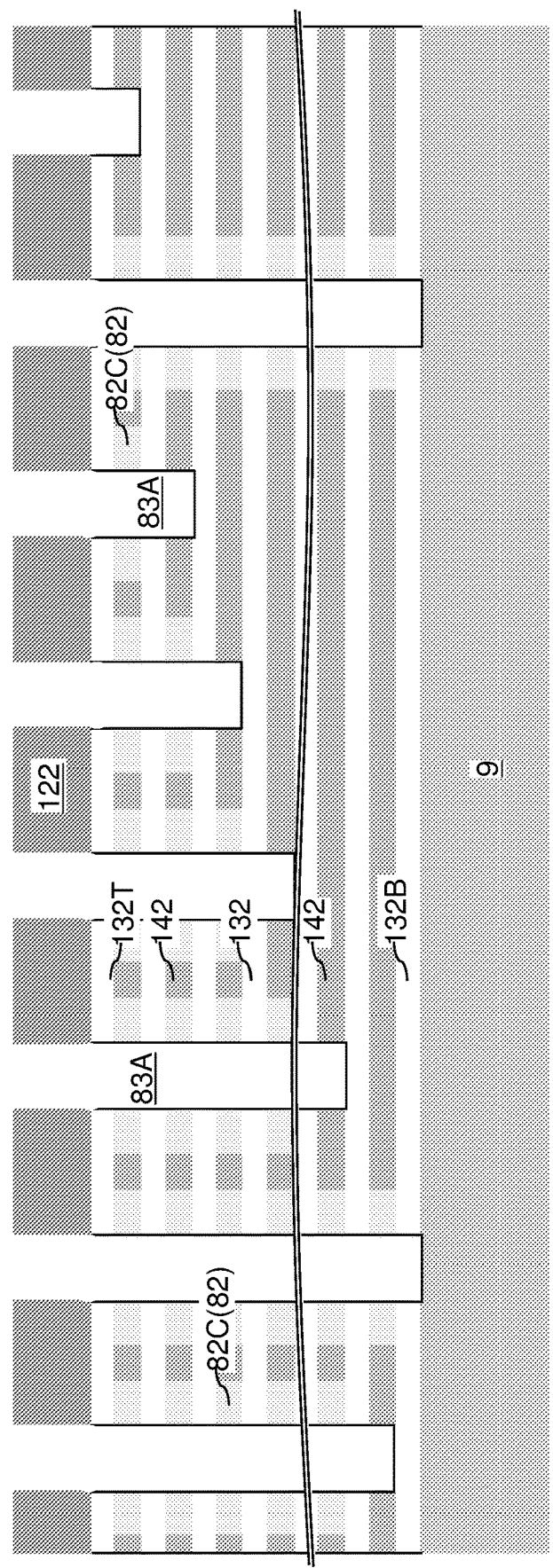
Figure 36D:
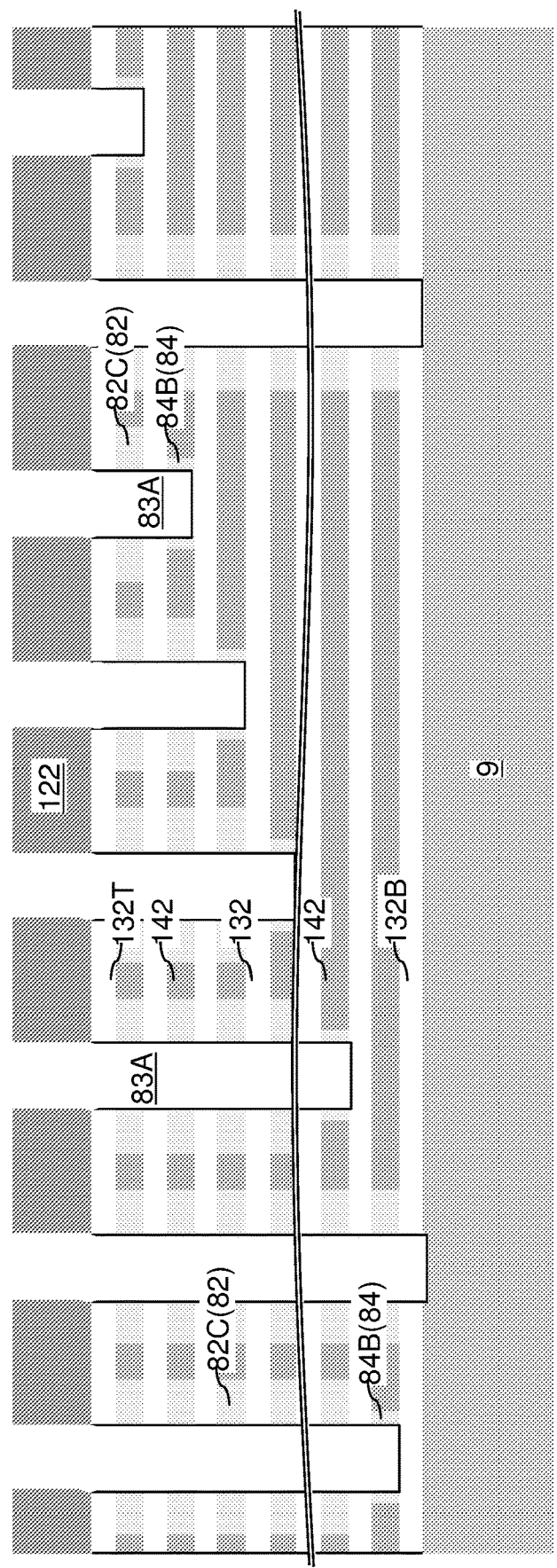

Referring to FIG. 36C, the processing steps described with reference to FIG. 12L can be performed to vertically extend the first-tier in-process contact openings 83A. Referring to FIG. 36D, the processing steps described with reference to FIG. 12M can be performed to form lower annular sacrificial spacers 84B.

Figure 36E:
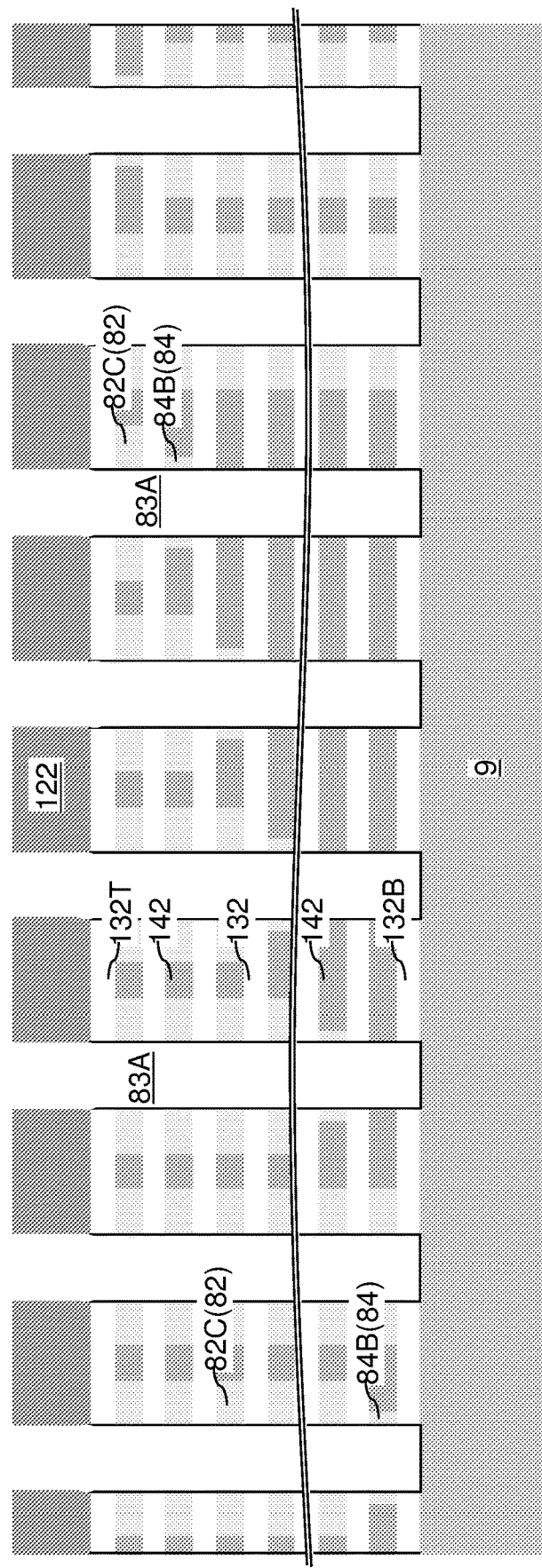

Referring to FIG. 36E, the processing steps described with reference to FIG. 12N can be performed to vertically extend the first-tier in-process contact openings 83A to the top surface of the substrate material layer 9.

Figure 36F:
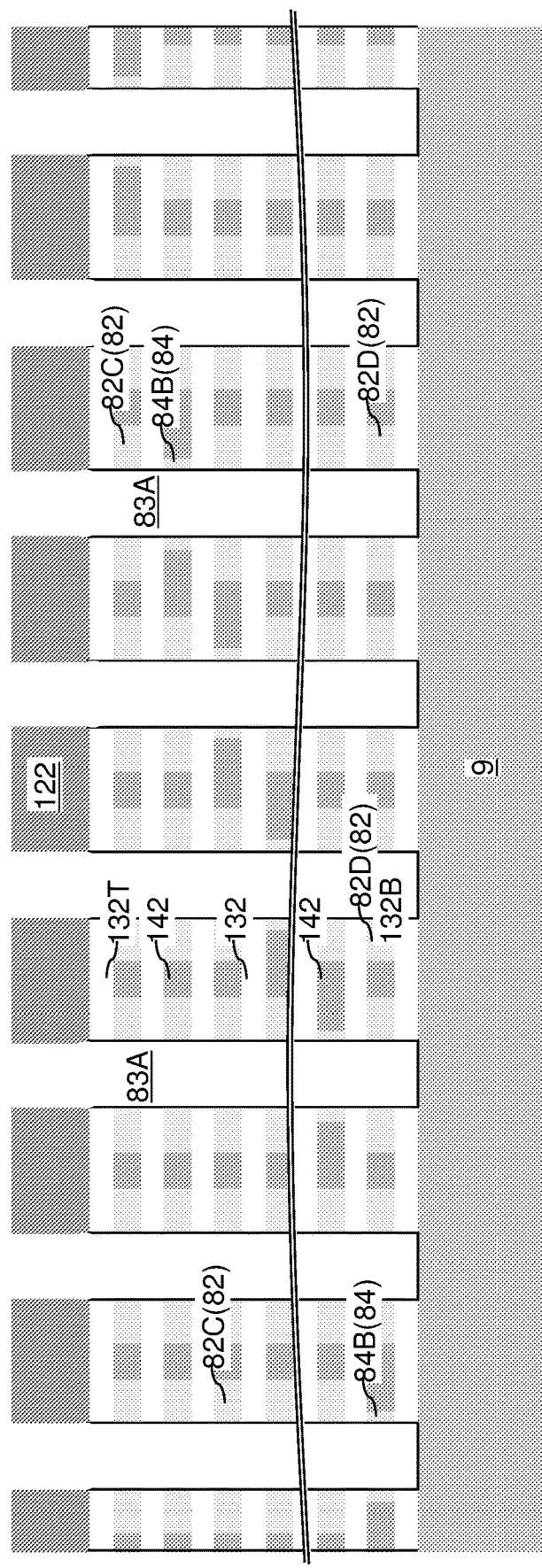

Referring to FIG. 36F, the processing steps described with reference to FIG. 12O can be performed to form first-tier lower annular dielectric spacers 82D, which are also referred to as fourth annular dielectric spacers 82D.

Figure 36G:
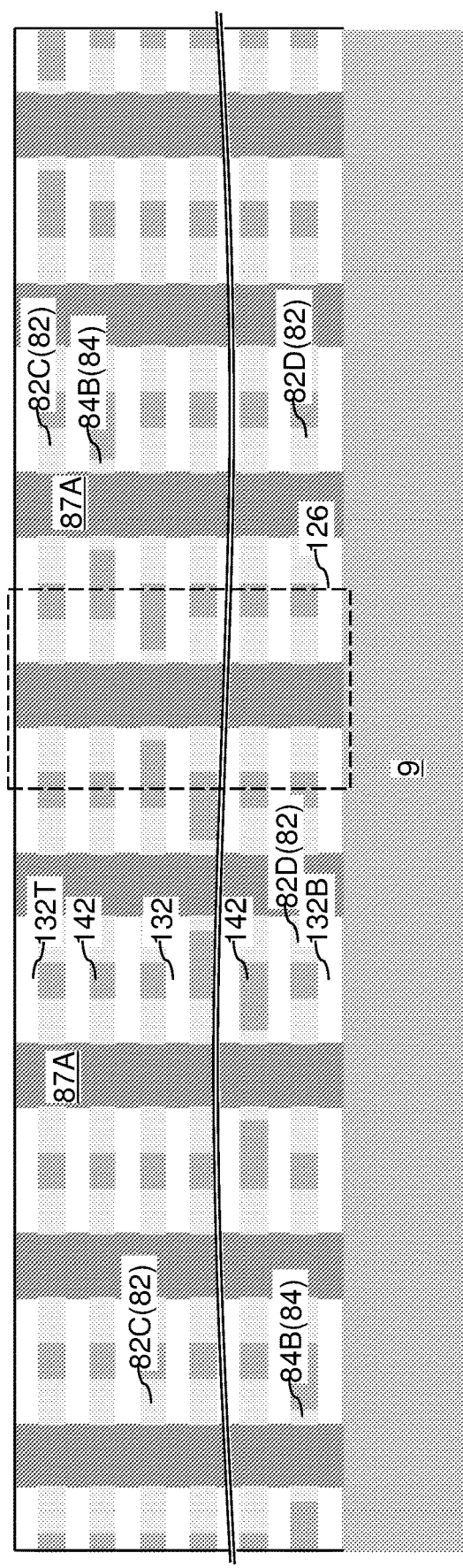

Referring to FIG. 36G, the first patterned hard mask layer 122 can be removed, and a sacrificial fill material can be deposited in the first-tier in-process contact openings 83A to form first-tier sacrificial contact via structures 87A. Each contiguous combination of a first-tier sacrificial contact via structures 87A, a vertical stack of third and/or fourth annular dielectric spacers (82C and/or 82D), and an optional lower annular sacrificial spacer 84B constitutes an in-process first-tier layer contact assembly 126.

Figure 36H:
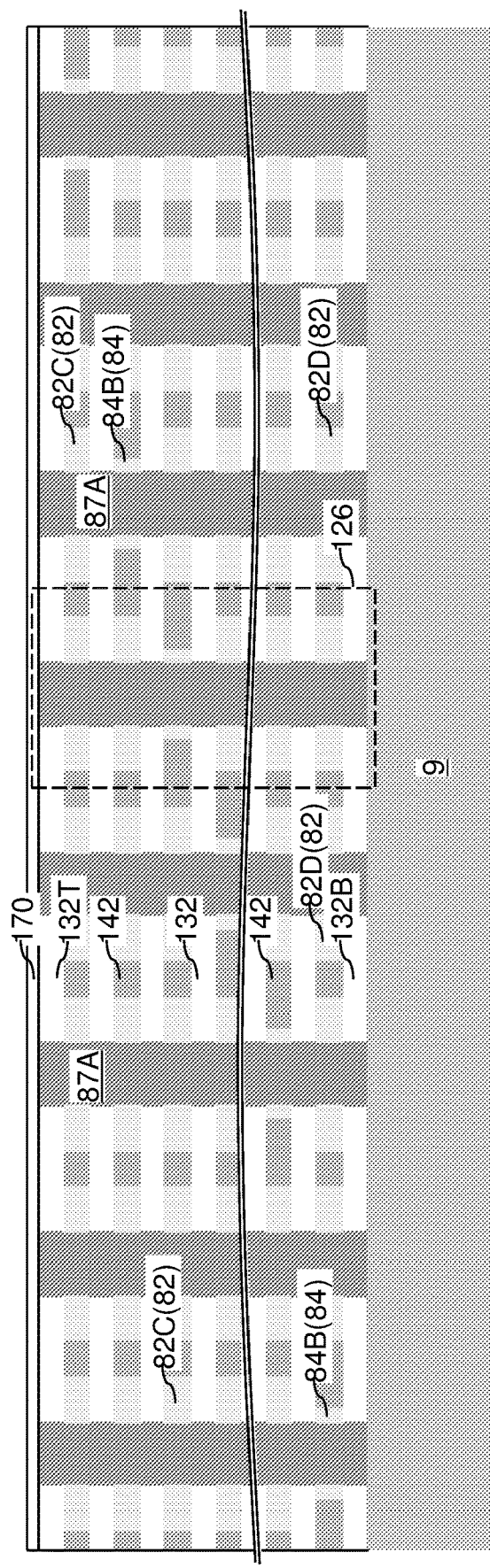

Referring to FIG. 36H, the processing steps described with reference to FIGS. 4A and 4B can be performed.

Subsequently, the processing steps described with reference to FIGS. 5-10 can be performed to form the upper tier.

FIGS. 37A-37I are sequential vertical cross-sectional views of the contact region 200 in the second exemplary structure during formation of in-process layer contact assemblies 26 according to the second embodiment of the present disclosure.

Figure 37A:
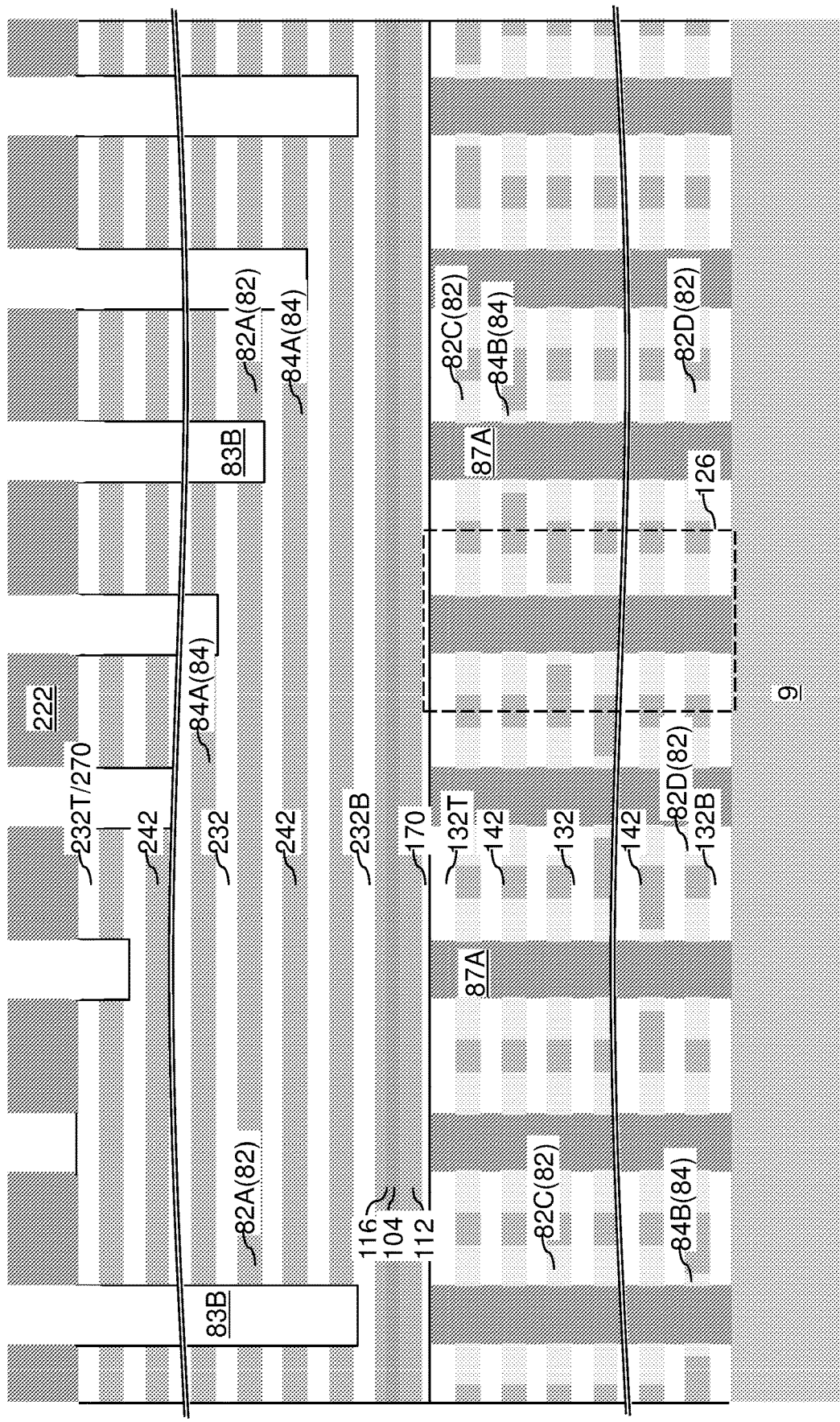
FIGS. 37A-37I are sequential vertical cross-sectional views of the contact region in the second exemplary structure during formation of in-process layer contact assemblies according to the second embodiment of the present disclosure.

Referring to FIG. 37A, a second patterned hard mask layer 222 can be formed over the topmost second insulating layer 232T. The second patterned hard mask layer 222 may have the same pattern, the same material, and the same thickness range, as the patterned hard mask layer 22 illustrated in FIGS. 11A and 11B. Subsequently, the processing steps described with reference to FIG. 12A can be performed to form second-tier in-process contact openings 83A, which can have the same geometry as the in-process contact openings 83 illustrated in FIG. 12A. Each second-tier in-process contact opening 83A can be formed directly above, i.e., above and having an areal overlap with, a respective one of the first-tier sacrificial contact via structures 87A.

Figure 37B:
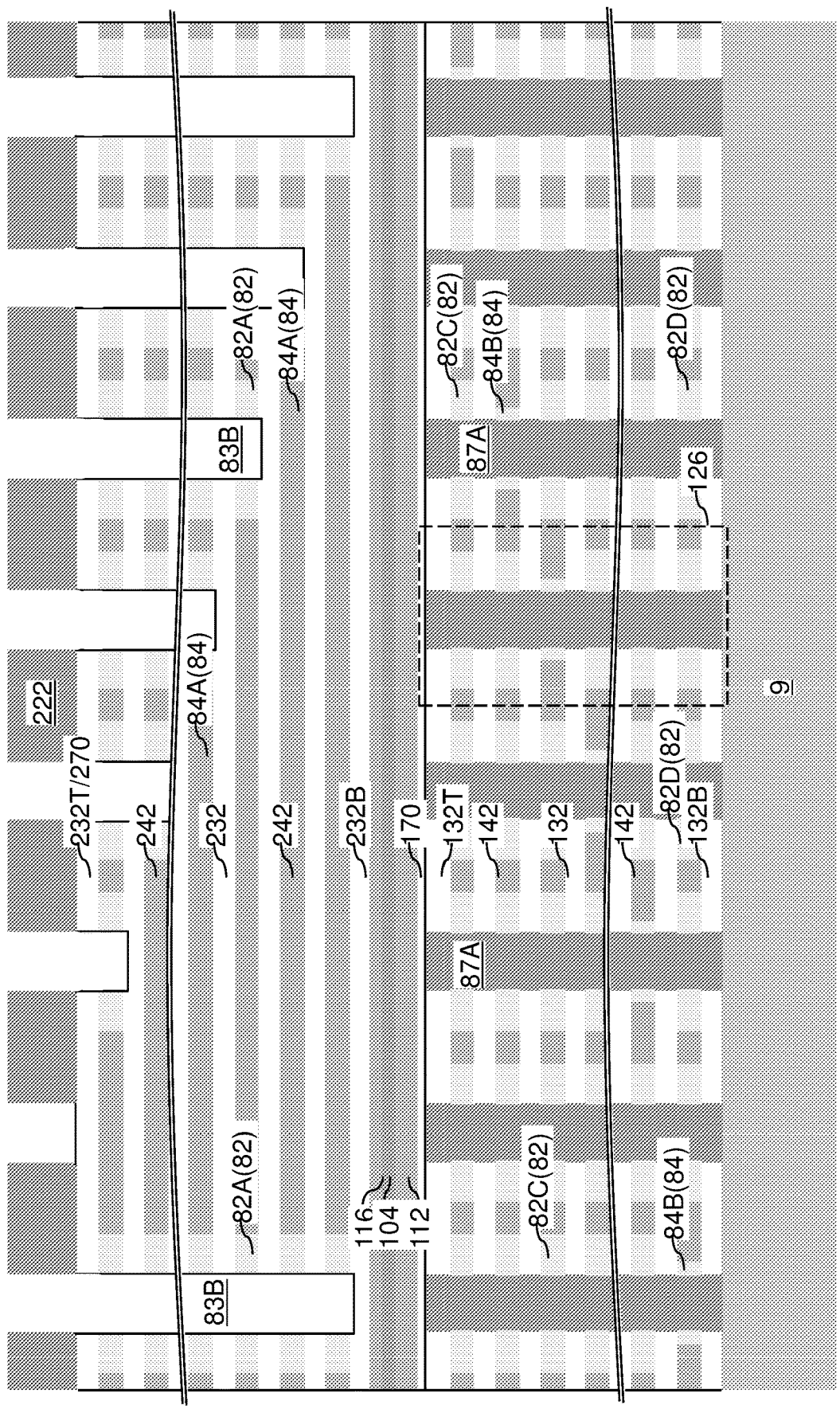

Referring to FIG. 37B, the processing steps described with reference to FIGS. 12B and 12C can be performed to form second-tier upper annular dielectric spacers 82A, which are also referred to as first annular dielectric spacers 82A.

Figure 37C:
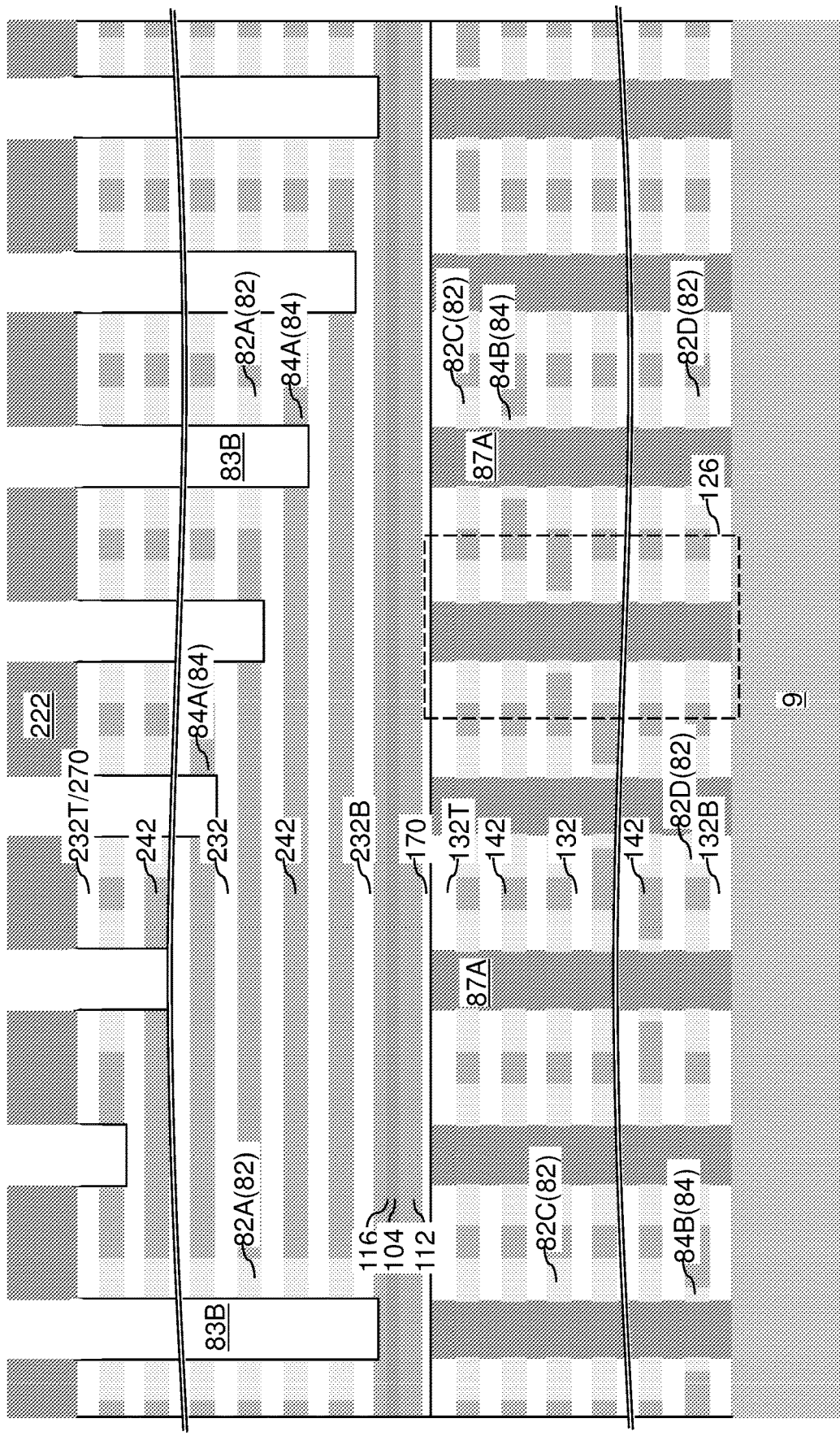

Referring to FIG. 37C, the processing steps described with reference to FIG. 12D can be performed to vertically extend the second-tier in-process contact openings 83B.

Figure 37D:
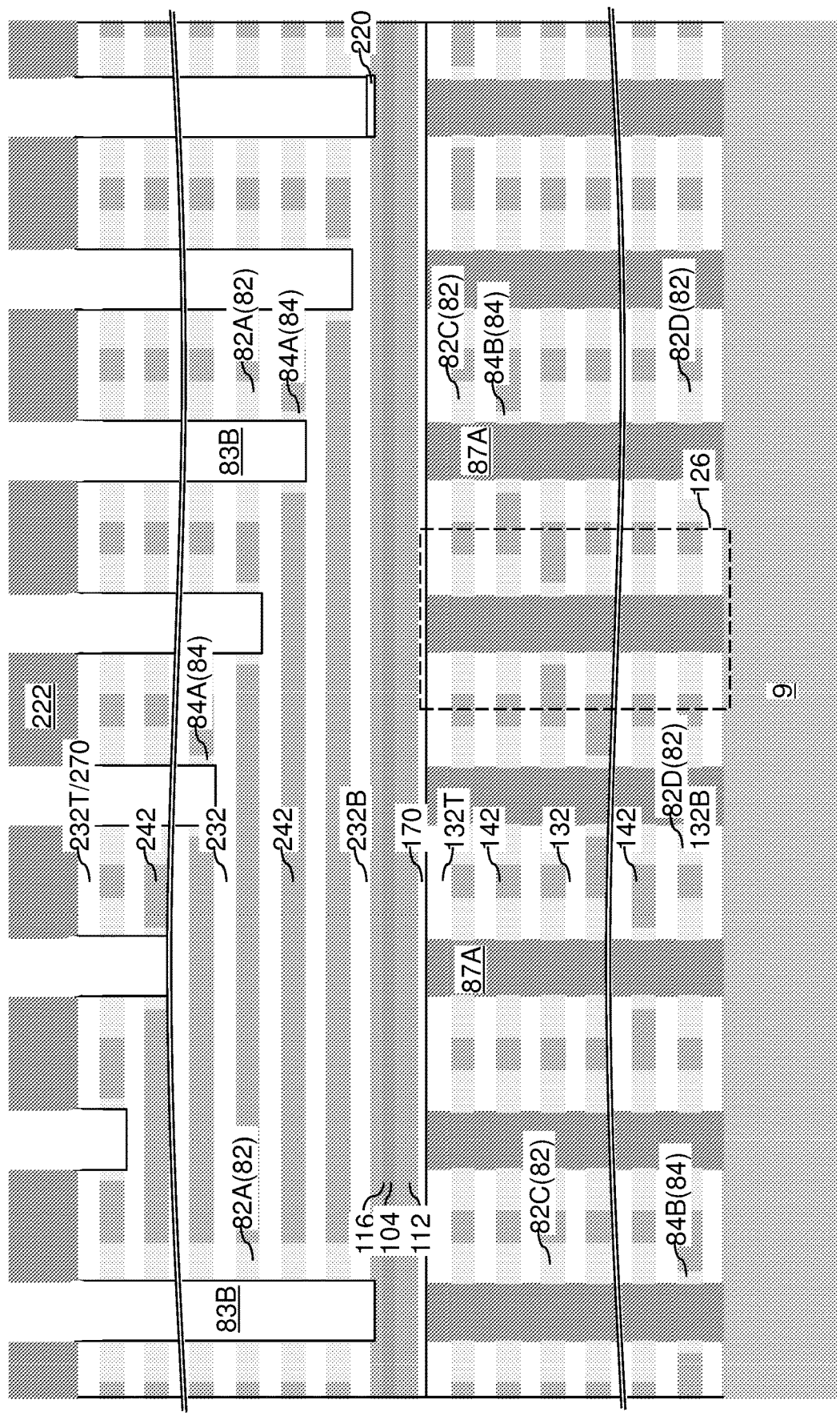

Referring to FIG. 37D, the processing steps described with reference to FIG. 12E can be performed to form upper annular sacrificial spacers 84A.

Figure 37E:
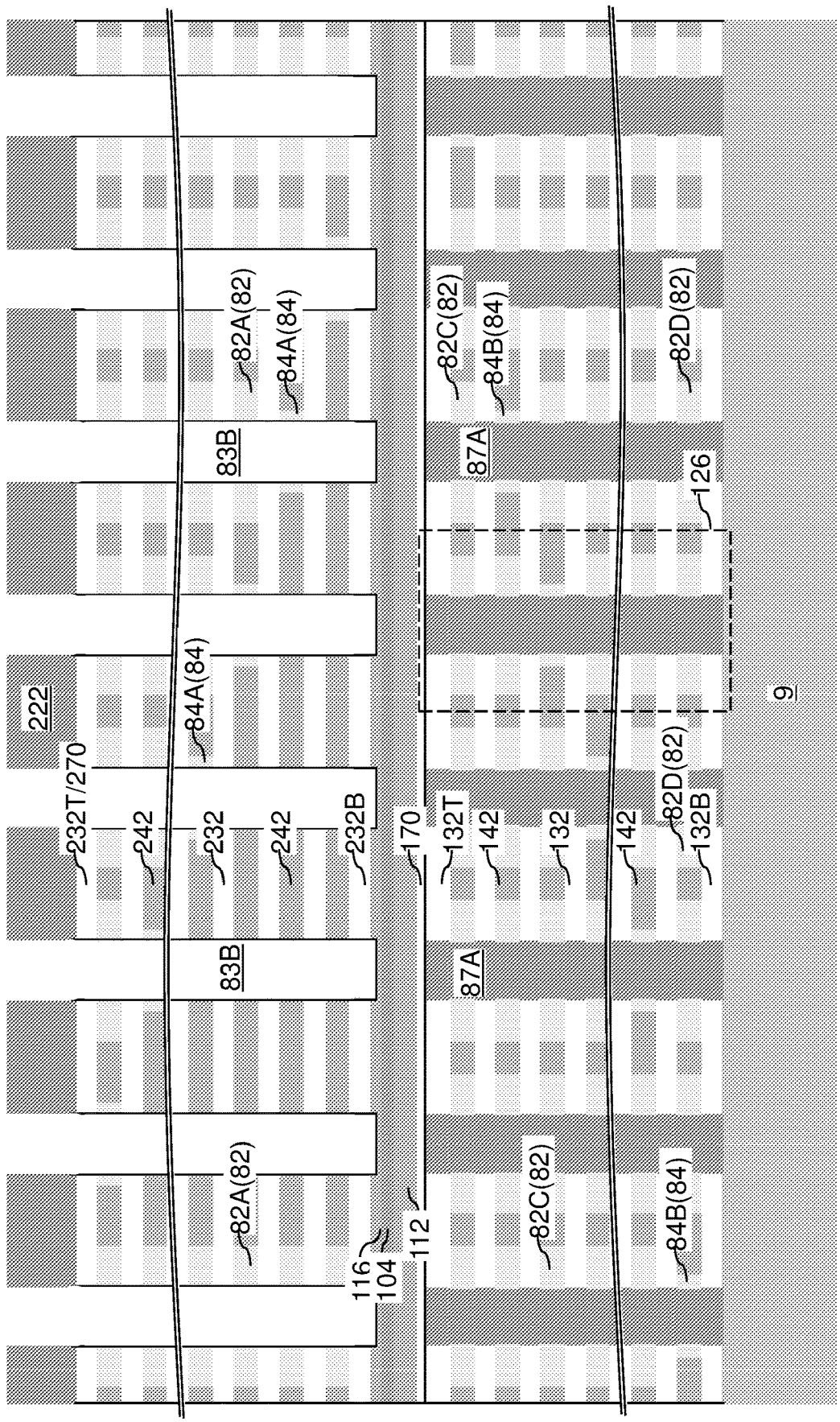
Figure 37F:
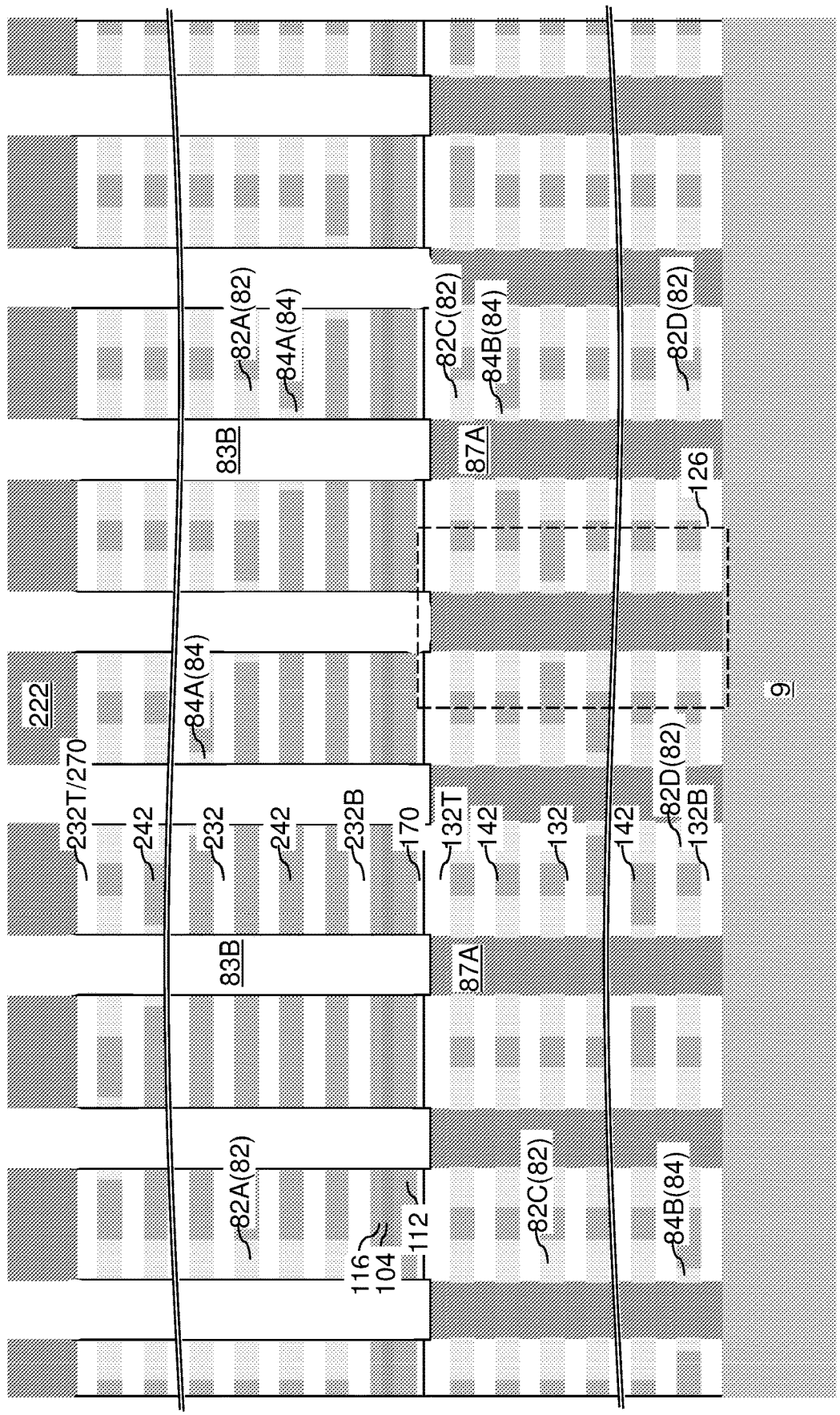

Referring to FIG. 37E, the processing steps described with reference to FIG. 12F can be performed to vertically extend the second-tier in-process contact openings 83B to the top surface of the upper source-level semiconductor material layer 116.

Referring to FIG. 36F, the processing steps described with reference to FIG. 12H can be performed to etch through the in-process source-level material layers 110'.

Figure 37G:
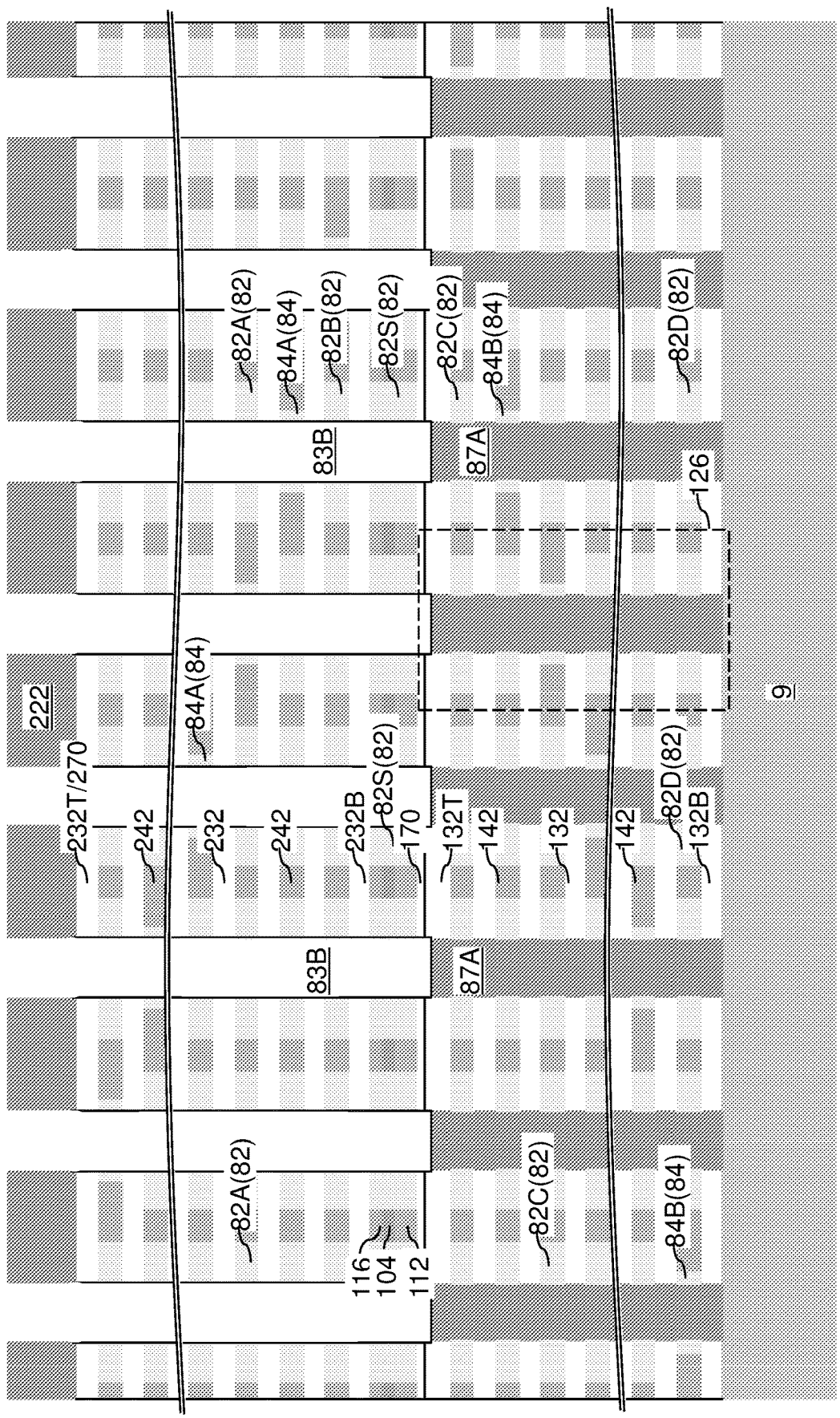

Referring to FIG. 37G, the processing steps described with reference to FIG. 12G can be performed to form second-tier lower annular dielectric spacers 82B, which are also referred to as second annular dielectric spacers 82B.

Figure 37H:
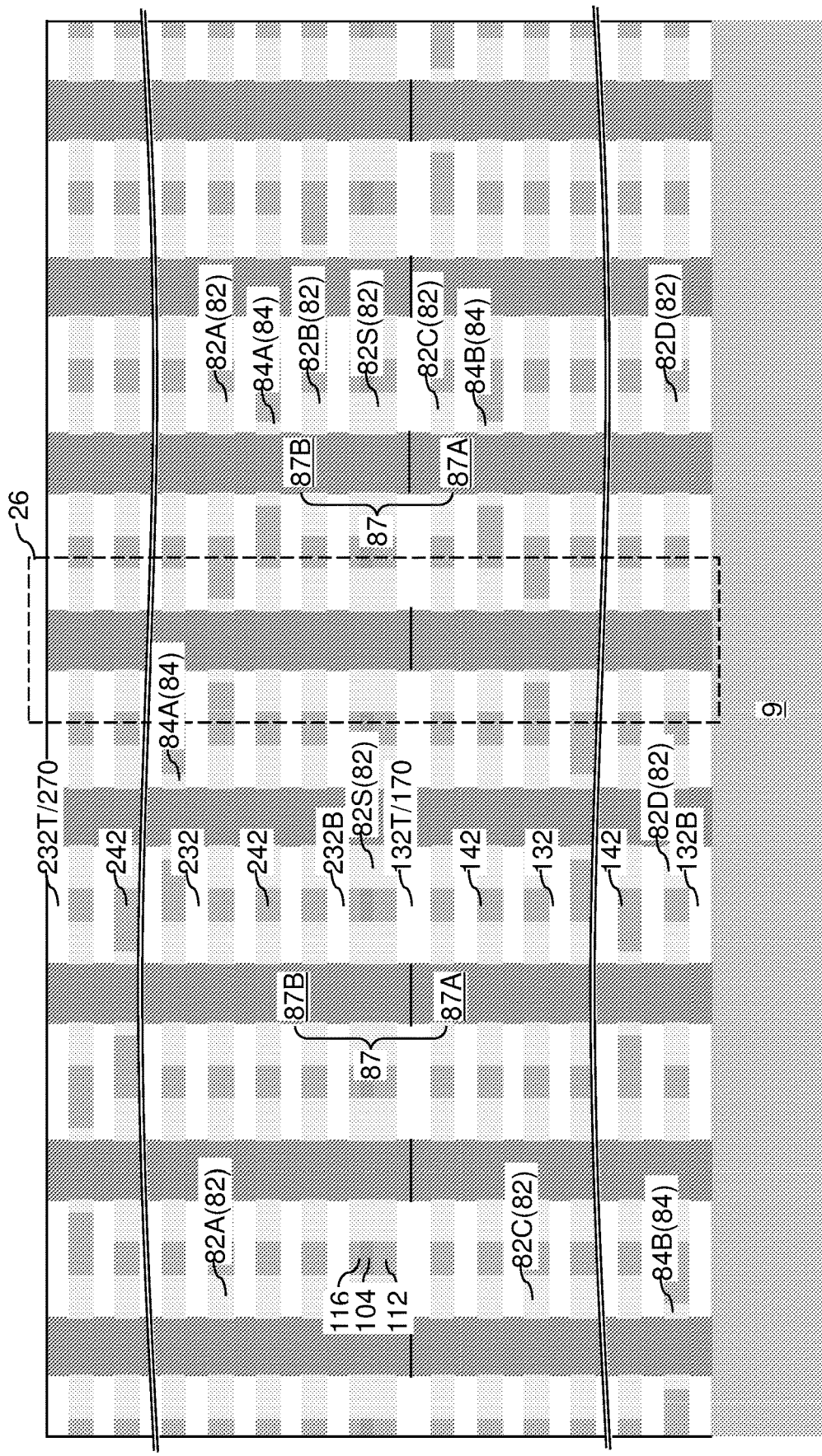

Referring to FIG. 37H, the second patterned hard mask layer 222 can be removed, and a sacrificial fill material can be deposited in the second-tier in-process contact openings 83B to form first-tier sacrificial contact via structures 87B. Each contiguous combination of a first-tier sacrificial contact via structures 87A, a second-tier sacrificial contact via structure 87B, a vertical stack of third and/or fourth annular dielectric spacers (82C and/or 82D), a vertical stack of first and/or second annular dielectric spacers (82A and/or 82B), and at least one annular sacrificial spacer 84 constitutes an in-process layer contact assembly 26.

Figure 37I:
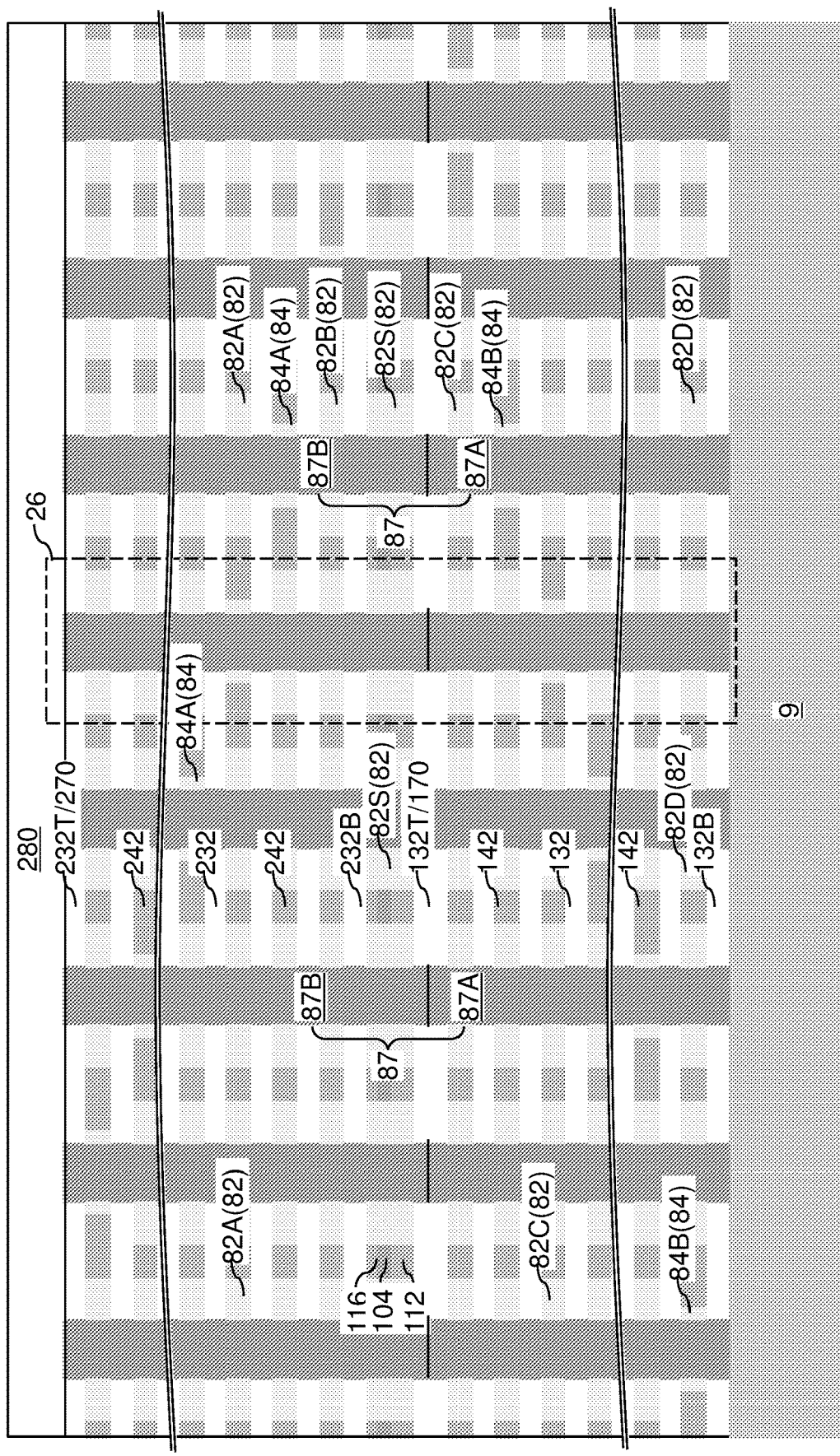

Referring to FIG. 37I, the processing steps described with reference to FIGS. 12Q, 13A, and 13B can be performed to form a contact-level dielectric layer 280.

Subsequently, the processing steps described with reference to FIGS. 14A-35 can be performed.

Referring to all drawings and according to various embodiments of the present disclosure, a memory device comprises: a first-tier alternating stack (132, 146) of first insulating layers 132 and first electrically conductive layers 146; a source layer 110 overlying the first-tier alternating stack (132, 146); a second-tier alternating stack (232, 246) of second insulating layers 232 and second electrically conductive layers 246 overlying the source layer 110; a memory opening 49 vertically extending through the first-tier alternating stack (132, 146), the source layer 110, and the second-tier alternating stack (232, 246); and a memory opening fill structure 58 located in the memory opening 49. The memory opening fill structure 58 comprises a vertical stack of first memory elements (e.g., portions of the memory material layer 54A) located at levels of the first electrically conductive layers 146, a vertical stack of second memory elements located (e.g., portions of the memory material layer 54B) at levels of the second electrically conductive layers 246, and a vertical semiconductor channel 60 vertically extending through each of the first electrically conductive layers 146, the source layer 110, and the second electrically conductive layers 246 and having a sidewall in contact with the source layer 110.

In one embodiment, the memory opening fill structure 58 further comprises: a top drain region 63 located above a level of a topmost second electrically conductive layer 246 of the second electrically conductive layers 246 and contacting a top end portion of the vertical semiconductor channel 60; and a bottom drain region 15 located below a level of a bottommost first electrically conductive layer 146 of the first electrically conductive layers 146 and contacting a bottom end portion of the vertical semiconductor channel 60.

In one embodiment, the vertical semiconductor channel 60 has a doping of a first conductivity type; and the top drain region 63 and the bottom drain region 15 have a doping of a second conductivity type that is an opposite of the first conductivity type.

In one embodiment, the top drain region 63 contacts a cylindrical surface segment of an inner sidewall of the vertical semiconductor channel 60; and the bottom drain region 15 contacts a bottommost horizontally-extending surface of the vertical semiconductor channel 60.

In one embodiment, the vertical stack of first memory elements comprises portions of a first memory film 50A that vertically extend through each layer within the first-tier alternating stack (132, 146); and the vertical stack of second memory elements comprises portions of a second memory film 50B that vertically extends through each layer within the second-tier alternating stack (232, 246).

In one embodiment, the first memory film 50A comprises a first annular tapered concave surface segment that contacts a source contact layer 114 portion of the source layer 110; and the second memory film 50B comprises a second annular tapered concave surface segment that contacts the source contact layer 114.

In one embodiment, the source layer 110 further comprises a lower source-level semiconductor layer 112 overlying the first-tier alternating stack (132, 146) and contacting a bottom surface of the source contact layer 114; and an upper source-level semiconductor layer 116 underlying the second-tier alternating stack (232, 246) and contacting a top surface of the source contact layer 114.

In one embodiment, the lower source-level semiconductor layer 112 contacts a cylindrical surface segment of an upper portion of an outer sidewall of the first memory film 50A; and the lower source-level semiconductor layer 112 comprises a cylindrical surface segment of a lower portion of an outer sidewall of the second memory film 50B.

In one embodiment, the top drain region 63 is laterally spaced from the second memory film 50B by a top end portion of the vertical semiconductor channel 60; and the bottom drain region 15 is in direct contact with an annular bottommost surface of the first memory film 50A.

In one embodiment, a vertical spacing between the first memory film 50A and the second memory film 50B is greater than a thickness of the source contact layer 114.

In one embodiment, the memory device comprises: upper metal interconnect structures 980 overlying the second-tier alternating stack (232, 246) and embedded within upper dielectric material layers 960, wherein a subset of the upper metal interconnect structures 980 is electrically connected to the top drain region 63; and lower metal interconnect structures 280 underlying the first-tier alternating stack (132, 146) and embedded within lower dielectric material layers 260, wherein a subset of the lower metal interconnect structures 280 is electrically connected to the bottom drain region 15.

In one embodiment, the memory device further comprises: memory-side bonding pads 988 electrically connected to the upper metal interconnect structures 980 and the lower metal interconnect structures 280 and embedded within the upper dielectric material layers 960; and a logic die 700 comprising logic-side semiconductor devices 720 and logic-side bonding pads 788 electrically connected to the logic-side semiconductor devices 720 through logic-side metal interconnect structures 780, wherein the logic-side bonding pads 788 are bonded to the memory-side bonding pads 988.

In one embodiment, the logic-side semiconductor devices 720 comprise a control circuitry configured to control operation of the vertical stack of first memory elements and the vertical stack of second memory elements.

In one embodiment, the memory device further comprises: additional memory openings vertically extending through the first-tier alternating stack (132, 146), the source contact layer 114, and the second-tier alternating stack (232, 246); and additional memory opening fill structure 58 located in the additional memory opening and comprising a respective vertical stack of additional first memory elements located at the levels of the first electrically conductive layers 146, a respective vertical stack of additional second memory elements located at the levels of the second electrically conductive layers 246, and a respective vertical semiconductor channel 60 vertically extending through each of the first electrically conductive layers 146 and the second electrically conductive layers 246 and having a respective cylindrical surface segment in contact with the source contact layer 114, wherein the memory opening fill structure 58 and the additional memory opening fill structures 58 are arranged as a two-dimensional periodic array having a first periodicity along a first horizontal direction and having a second periodicity along a second horizontal direction.

In one embodiment, the memory device further comprises a contact via structure 86 vertically extending through each layer within the first-tier alternating stack (132, 146) and the second-tier alternating stack (232, 246) and contacting a sidewall of at least one of the first or second electrically conductive layers (146, 246).

In one embodiment illustrated in FIGS. 24D and 35, the first-tier alternating stack (132, 146), the vertical stack of first memory elements and a first (e.g., lower) portion of the vertical semiconductor channel 60 are located in a first (e.g., lower) memory block 300L. The second-tier alternating stack (232, 246), the vertical stack of second memory elements and a second (e.g., upper) portion of the vertical semiconductor channel 60 are located in a second (e.g., upper) memory block 300U which is different from the first memory block 300L. The source layer 110 is a common source layer for the first memory block 300L and the second memory block 300U.

In one embodiment, a bottom drain region 15 contacts a bottom of the first portion of the vertical semiconductor channel 60, a top drain region 63 contacts a top of the second portion of the vertical semiconductor channel 60, a first bit line 211 is located in the first memory block 300L below the first-tier alternating stack (132, 146) and electrically connected to the bottom drain region 15, and a second bit line 111 is located in the second memory block 300U above the second-tier alternating stack (232, 246) and electrically connected to the top drain region 63.

In one embodiment, the first electrically conductive layers 146 comprise at least one first drain side select gate electrode 146D, which comprises at least one lower most first electrically conductive layer, at least one first source side select gate electrode 146S which comprises at least one upper most first electrically conductive layer, and first word lines 146W located between the at least one first drain side select gate electrode 146D and the at least one first source side select gate electrode 146S. The second electrically conductive layers 246 comprise at least one second drain side select gate electrode 246D, which comprises at least one upper most second electrically conductive layer, and at least one second source side select gate electrode 246S, which comprises at least one lower most second electrically conductive layer, and second word lines 246W located between at least one second drain side select gate electrode 246D and the at least one second source side select gate electrode 246S.

In one embodiment shown in FIG. 24D, word line contact via structures 86W contact one of the first word lines 146W and one of the second word lines 246W, and are electrically isolated from all other ones of the first and second electrically conductive layers (146, 246). A first drain side select gate electrode contact structure 86DL contacts the first drain side select gate electrode 146D, and is electrically isolated from all other ones of the first and second electrically conductive layers. A first source side select gate electrode contact structure 86SL contacts the first source side select gate electrode 146S, and is electrically isolated from all other ones of the first and second electrically conductive layers. A second drain side select gate electrode contact structure 86DU contacts the second drain side select gate electrode 246D, and is electrically isolated from all other ones of the first and second electrically conductive layers. A second source side select gate electrode contact structure 86SU contacts the source side select gate electrode 246S, and is electrically isolated from all other ones of the first and second electrically conductive layers.

The various embodiments of the present disclosure may be employed to separate the memory blocks in the vertical direction. The source layer 110 is positioned between the lower memory block 300L and the upper memory block 300U, and functions as a common source line for both memory blocks (300L, 300U). However, lower memory block 300L and the upper memory block 300U are operated (e.g., programmed) independently due to independent control of the bit lines (111, 211) and select gate electrodes for each memory block. The decrease in memory block side reduces block efficiency degradation and improves the case of garbage collection.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
   a first-tier alternating stack of first insulating layers and first electrically conductive layers;
   a source layer overlying the first-tier alternating stack;
   a second-tier alternating stack of second insulating layers and second electrically conductive layers overlying the source layer;
   a memory opening vertically extending through the first-tier alternating stack, the source layer, and the second-tier alternating stack; and
   a memory opening fill structure located in the memory opening and comprising a vertical stack of first memory elements located at levels of the first electrically conductive layers, a vertical stack of second memory elements located at levels of the second electrically conductive layers, and a vertical semiconductor channel vertically extending through each of the first electrically conductive layers, the source layer, and the second electrically conductive layers, and having a sidewall in contact with the source layer.

2. The memory device of claim 1, wherein the memory opening fill structure further comprises:
   a top drain region located above a level of a topmost second electrically conductive layer of the second electrically conductive layers and contacting a top end portion of the vertical semiconductor channel; and
   a bottom drain region located below a level of a bottommost first electrically conductive layer of the first electrically conductive layers and contacting a bottom end portion of the vertical semiconductor channel.

3. The memory device of claim 2, wherein:
   the vertical semiconductor channel has a doping of a first conductivity type;
   the top drain region and the bottom drain region have a doping of a second conductivity type that is an opposite of the first conductivity type;
   the top drain region contacts a cylindrical surface segment of an inner sidewall of the vertical semiconductor channel; and the bottom drain region contacts a bottommost horizontally-extending surface of the vertical semiconductor channel.

4. The memory device of claim 2, wherein:
the vertical stack of first memory elements comprises portions of a first memory film that vertically extend through each layer within the first-tier alternating stack; and
the vertical stack of second memory elements comprises portions of a second memory film that vertically extends through each layer within the second-tier alternating stack.

5. The memory device of claim 4, wherein:
the first memory film comprises a first annular tapered concave surface segment that contacts a source contact layer portion of the source layer; and
the second memory film comprises a second annular tapered concave surface segment that contacts the source contact layer.

6. The memory device of claim 5, wherein:
the source layer further comprises a lower source-level semiconductor layer overlying the first-tier alternating stack and contacting a bottom surface of the source contact layer, and an upper source-level semiconductor layer underlying the second-tier alternating stack and contacting a top surface of the source contact layer,
the lower source-level semiconductor layer contacts a cylindrical surface segment of an upper portion of an outer sidewall of the first memory film; and
the lower source-level semiconductor layer comprises a cylindrical surface segment of a lower portion of an outer sidewall of the second memory film.

7. The memory device of claim 5, wherein:
the top drain region is laterally spaced from the second memory film by a top end portion of the vertical semiconductor channel; and
the bottom drain region is in direct contact with an annular bottommost surface of the first memory film.

8. The memory device of claim 5, wherein a vertical spacing between the first memory film and the second memory film is greater than a thickness of the source contact layer.

9. The memory device of claim 2, further comprising:
upper metal interconnect structures overlying the second-tier alternating stack and embedded within upper dielectric material layers, wherein a subset of the upper metal interconnect structures is electrically connected to the top drain region;
lower metal interconnect structures underlying the first-tier alternating stack and embedded within lower dielectric material layers, wherein a subset of the lower metal interconnect structures is electrically connected to the bottom drain region;
memory-side bonding pads electrically connected to the upper metal interconnect structures and the lower metal interconnect structures and embedded within the upper dielectric material layers; and
a logic die comprising logic-side semiconductor devices and logic-side bonding pads electrically connected to the logic-side semiconductor devices through logic-side metal interconnect structures, wherein the logic-side bonding pads are bonded to the memory-side bonding pads.

10. The memory device of claim 1, further comprising a contact via structure vertically extending through each layer within the first-tier alternating stack and the second-tier alternating stack and contacting a sidewall of at least one of the first or second electrically conductive layers.

11. The memory device of claim 1, wherein:
the first-tier alternating stack, the vertical stack of first memory elements and a first portion of the vertical semiconductor channel are located in a first memory block;
the second-tier alternating stack, the vertical stack of second memory elements and a second portion of the vertical semiconductor channel are located in a second memory block which is different from the first memory block; and
the source layer is a common source layer for the first memory block and the second memory block.

12. The memory device of claim 11, further comprising:
a bottom drain region contacting a bottom of the first portion of the vertical semiconductor channel;
a top drain region contacting a top of the second portion of the vertical semiconductor channel;
a first bit line located in the first memory block below the first-tier alternating stack and electrically connected to the bottom drain region; and
a second bit line located in the second memory block above the second-tier alternating stack and electrically connected to the top drain region.

13. The memory device of claim 12, wherein:
the first electrically conductive layers comprise at least one first drain side select gate electrode, which comprises at least one lower most first electrically conductive layer, at least one first source side select gate electrode which comprises at least one upper most first electrically conductive layer, and first word lines located between the at least one first drain side select gate electrode and the at least one first source side select gate electrode; and
the second electrically conductive layers comprise at least one second drain side select gate electrode, which comprises at least one upper most second electrically conductive layer, and at least one second source side select gate electrode, which comprises at least one lower most second electrically conductive layer, and second word lines located between at least one second drain side select gate electrode and the at least one second source side select gate electrode.

14. The memory device of claim 13, further comprising:
word line contact via structures which contact one of the first word lines and one of the second word lines, and electrically isolated from all other ones of the first and second electrically conductive layers;
a first drain side select gate electrode contact structure which contacts the first drain side select gate electrode, and electrically isolated from all other ones of the first and second electrically conductive layers;
a first source side select gate electrode contact structure which contacts the first source side select gate electrode, and electrically isolated from all other ones of the first and second electrically conductive layers;
a second drain side select gate electrode contact structure which contacts the second drain side select gate electrode, and electrically isolated from all other ones of the first and second electrically conductive layers; and
a second source side select gate electrode contact structure which contacts the source side select gate electrode, and electrically isolated from all other ones of the first and second electrically conductive layers.

15. A method of forming a memory device, comprising:

forming a first-tier alternating stack of first insulating layers and first spacer material layers over a substrate, wherein the first spacer material layers are formed as or are subsequently replaced with first electrically conductive layers;

forming a sacrificial source-level material layer over the first-tier alternating stack;

forming a second-tier alternating stack of second insulating layers and second spacer material layers over the sacrificial source-level material layer, wherein the second spacer material layers are formed as or are subsequently replaced with second electrically conductive layers;

forming a memory opening through the second-tier alternating stack, the sacrificial source-level material layer, and the first-tier alternating stack;

forming a memory opening fill structure in the memory opening, wherein the memory opening fill structure comprises a vertical semiconductor channel vertically extending through the first-tier alternating stack, the sacrificial source-level material layer, and the second-tier alternating stack, and further comprises a vertical stack of memory elements located at levels of the first spacer material layers and the second spacer material layers;

forming a source cavity by removing the sacrificial source-level material layer; and forming a source contact layer directly on a cylindrical surface segment of an outer sidewall of the vertical semiconductor channel within the source cavity.

16. The method of claim 15, wherein:
the memory opening fill structure comprises a continuous memory film that is formed on a sidewall of the memory opening, wherein the vertical semiconductor channel is formed on an inner sidewall of the continuous memory film;

the method further comprises removing a tubular portion of the continuous memory film that is exposed to the source cavity between the first-tier alternating stack and the second-tier alternating stack; and the cylindrical surface segment of the outer sidewall of the vertical semiconductor channel is exposed upon removal of the tubular portion of the continuous memory film.

17. The method of claim 16, wherein remaining portions of the continuous memory film after removal of the tubular portion of the continuous memory film comprise:
a first memory film that underlies the cylindrical surface segment of the outer sidewall of the vertical semiconductor channel and laterally surrounded by the first-tier alternating stack; and a second memory film that overlies the cylindrical surface segment of the outer sidewall of the vertical semiconductor channel and laterally surrounded by the second-tier alternating stack.

18. The method of claim 15, wherein:
the first spacer materials layer and the second spacer material layers comprise a first sacrificial material;

the sacrificial source-level material layer comprises a second sacrificial material that is different from the first sacrificial material;

the method further comprises a first isotropic etch process that removes the second sacrificial material selective to the first sacrificial material and a material of the first insulating layers and the second insulating layers; and the first spacer material layers and the second spacer material layers are replaced with the first electrically conductive layers and the second electrically conductive layers, respectively, after formation of the source contact layer.

19. The method of claim 15, wherein:
the memory opening fill structure further comprises a top drain region contacting a top end portion of the vertical semiconductor channel; and the method further comprises physically exposing a bottommost surface of the vertical semiconductor channel after formation of the source contact layer, and forming a bottom drain region on the bottommost surface of the vertical semiconductor channel.

20. The method of claim 19, wherein the substrate comprises a carrier substrate, and the method further comprises:
forming upper metal interconnect structures embedded within upper dielectric material layers over the second-tier alternating stack;

forming memory-side bonding pads on or within a topmost dielectric layer among the upper dielectric material layers;

bonding the memory-side bonding pads with logic-side bonding pads on a logic die that comprises logic-side semiconductor devices that are electrically connected to the logic-side bonding pads through logic-side metal interconnect structures embedded within logic-side dielectric material layers;

removing the carrier substrate, wherein the bottom drain region is formed after removal of the carrier substrate; and forming lower metal interconnect structures, wherein a subset of the lower metal interconnect structures is electrically connected to the bottom drain region.

* * * * *